US008823112B2

(12) United States Patent
Shinohara

(10) Patent No.: US 8,823,112 B2
(45) Date of Patent: Sep. 2, 2014

(54) SEMICONDUCTOR DEVICE HAVING MIXEDLY MOUNTED COMPONENTS WITH COMMON FILM LAYERS AND METHOD OF MANUFACTURING THE SAME

(75) Inventor: Masaaki Shinohara, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 46 days.

(21) Appl. No.: 13/495,794

(22) Filed: Jun. 13, 2012

(65) Prior Publication Data

US 2012/0319209 A1  Dec. 20, 2012

(30) Foreign Application Priority Data

Jun. 16, 2011  (JP) ................................. 2011-134514

(51) Int. Cl.
*H01L 27/06* (2006.01)
*H01L 49/02* (2006.01)

(52) U.S. Cl.
CPC ............ *H01L 27/0629* (2013.01); *H01L 28/24* (2013.01)
USPC .................... 257/379; 257/380; 257/E21.409; 257/E27.017; 438/238

(58) Field of Classification Search
CPC ...................... H01L 21/82345; H01L 27/0629
USPC .................. 257/379, 380, E21.409, E27.017; 438/106, 238
See application file for complete search history.

(56) References Cited

U.S. PATENT DOCUMENTS

| 6,696,719 | B2 | 2/2004 | Yamamoto | |
|---|---|---|---|---|
| 7,977,754 | B2* | 7/2011 | Chuang et al. | 257/379 |
| 8,093,118 | B2* | 1/2012 | Tseng et al. | 438/190 |
| 2009/0236669 | A1* | 9/2009 | Chen et al. | 257/380 |
| 2010/0320544 | A1* | 12/2010 | Tseng et al. | 257/380 |
| 2010/0328022 | A1* | 12/2010 | Fan et al. | 338/309 |
| 2011/0057268 | A1* | 3/2011 | Makita | 257/380 |
| 2011/0266637 | A1* | 11/2011 | Lee et al. | 257/410 |
| 2012/0146156 | A1* | 6/2012 | Shirahama et al. | 257/379 |

FOREIGN PATENT DOCUMENTS

JP  2001-168299 A  6/2001

* cited by examiner

*Primary Examiner* — Allan R Wilson
(74) *Attorney, Agent, or Firm* — Womble Carlyle

(57) ABSTRACT

A metal gate electrode and a poly-silicon resistance element are mixedly mounted in the same semiconductor substrate. The metal gate electrode is formed on a first gate insulating film and includes a first gate metal film and a first gate silicon film. The poly-silicon resistance element includes a silicon film pattern formed on a laminated pattern which includes a first laminate insulating film, a first laminate metal film, and a second laminate insulating film. The first laminate insulating film and the first gate insulating film are formed from a common insulating film; the first laminate metal film and the first gate metal film are formed from a common metal film, and the silicon firm pattern and the first gate silicon film are formed from a common silicon film. In a planar view, a footprint of the silicon film pattern is included within the second laminate insulating film.

17 Claims, 46 Drawing Sheets

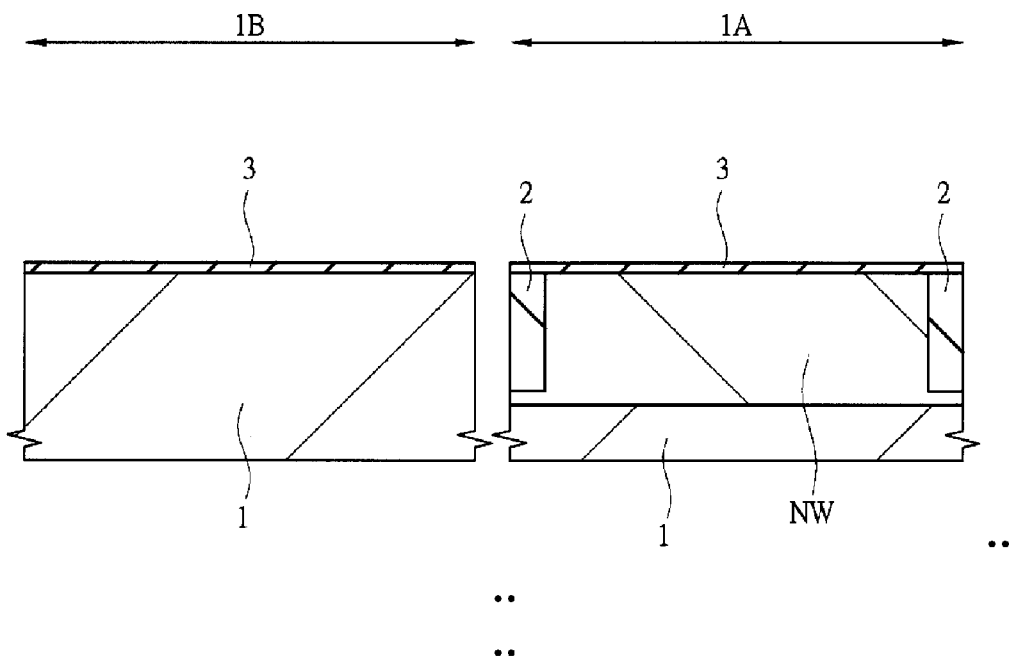
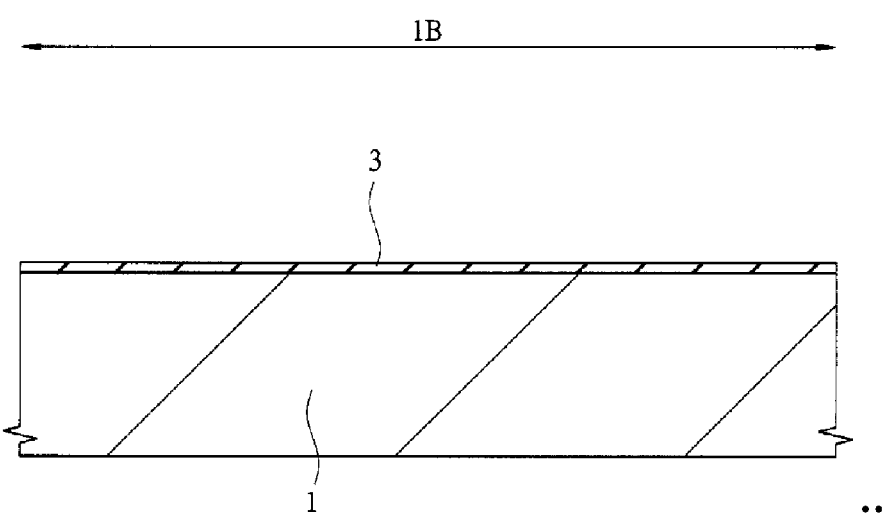

SEMICONDUCTOR DEVICE HAVING MIXEDLY MOUNTED COMPONENTS WITH COMMON FILM LAYERS AND METHOD OF MANUFACTURING THE SAME

CROSS-REFERENCE TO RELATED APPLICATION

The disclosure of Japanese Patent Application No. 2011-134514 filed on Jun. 16, 2011 including the specification, drawings and abstract is incorporated herein by reference in its entirety.

BACKGROUND

The present invention relates to a semiconductor device and a manufacturing method thereof, and particularly relates to a technique effective when applied to a semiconductor device including a MISFET and a resistance element and to a manufacturing method thereof.

A MISFET (Metal Insulator Semiconductor Field Effect Transistor) can be formed by forming a gate insulating film over a semiconductor substrate, forming a gate electrode over the gate insulating film, and forming a source-drain region by ion implantation or the like. As the gate electrode, a poly-silicon film is used typically.

Recently, however, the gate insulating film has been made thinner along with miniaturization of the MISFET element, and it becomes difficult to neglect a depletion effect of the gate electrode when the poly-silicon film is used as the gate electrode. Accordingly, there has been developed a technique of suppressing the depletion phenomenon in the gate electrode by using a metal gate electrode as the gate electrode.

Further, although the gate insulating film has been made thinner along with the miniaturization of the MISFET element, when a thinner silicon oxide film is used as the gate insulating film, so called tunnel current, that is, electrons flowing in a channel of the MISFET tunnel through a barrier wall formed by a silicon oxide film to flow to the gate electrode, is generated. Accordingly, there has been developed a technique of reducing the leak current by using a material having a dielectric constant higher than the silicon oxide film (high dielectric constant material) as the gate insulating film and increasing a physical film thickness while keeping the same capacitance.

Japanese Patent Laid-Open No. 2001-168299 (Patent document 1) describes a technique providing a semiconductor device structure for enabling a cell capacitor to be fabricated having a MIM or MIS structure which employs a low resistivity conductive material such as Ru for an upper electrode and a resistance element utilizing a high resistance conductive material such as poly-silicon, substantially without process extension.

SUMMARY

The study of the inventors has clarified the following.

If the whole gate electrode is formed by a metal film when the metal gate electrode is applied to the gate electrode, the thickness of the metal film becomes large and there may arise a problem that the metal film is easily peeled off and a problem that substrate damage is caused by over-etching when the metal film is patterned (gate-processed). Accordingly, it is preferable to form the metal gate electrode by a laminated film of a first gate metal film over the first gate insulating film and a first gate silicon film over the first gate metal film. In this case, it is possible to reduce the thickness of the metal film compared to a case of forming the metal gate electrode only by the metal film, and thereby it is possible to improve the problem that the metal film is easily peeled off and the problem that the substrate damage is caused by the over-etching when the metal film is patterned. Further, it is possible to follow existing poly-silicon electrode processing method and process and thereby it is possible to obtain an advantage in fine pattern processing capability, manufacturing cost, and yield.

Further, by performing mixed forming of the MISFET and another element, for example, a resistance element on the semiconductor substrate, various kinds of circuits can be formed on the semiconductor substrate. An example of the resistance element formed on the semiconductor substrate is a poly-silicon resistance element. The poly-silicon resistance element can be formed by a patterned poly-silicon film formed over the semiconductor substrate.

When the poly-silicon gate electrode is used as the gate electrode, the poly-silicon resistance element can be formed by the use of a poly-silicon film in the same layer as this poly-silicon electrode.

Meanwhile, when the metal gate electrode formed by a laminated film of the first gate metal film over the first gate insulating film and the first gate poly-silicon film over the metal film is used as the gate electrode, it can be considered to form the resistance element by the use of a poly-silicon film in the same layer as the poly-silicon film of the metal gate electrode. However, when the resistance element is formed by the laminated film of the low resistivity metal film and the high resistivity poly-silicon film, the resistance value of the resistance element is defined by the low resistance metal film and it is difficult to form the resistance element appropriately. Accordingly, it is desired to use a poly-silicon film in the same layer as the poly-silicon film of the metal gate electrode and also to form the poly-silicon resistance element having a resistance value which can be defined mainly by this poly-silicon film.

Further, when it is tried to use a poly-silicon film in the same layer as the poly-silicon film of the metal gate electrode and also to form the poly-silicon resistance element having a resistance value which can be defined mainly by this poly-silicon film, there arises a problem that the freedom of design is lowered or a size of the semiconductor device is caused to increase. Accordingly, it is desired to improve the freedom of design of the semiconductor device and to realize a smaller size of the semiconductor device for performing the mixed mounting of the metal gate electrode and the poly-silicon resistance element on the same semiconductor substrate.

The present invention has been made in view of the above circumstances and provides a technique which forms the metal gate electrode and the resistance element on the same semiconductor substrate.

Further, another object of the present invention is to provide a technique which can improve the freedom of design of a semiconductor device.

Further, still another object of the present invention is to provide a technique which can realize a smaller size of a semiconductor device.

The other purposes and the new feature of the present invention will become clear from the description of the present specification and the accompanying drawings.

The following explains briefly the outline of a typical invention among the inventions disclosed in the present application.

A semiconductor device according to a representative embodiment is a semiconductor device including a MISFET and a resistance element, in which a gate electrode for the MISFET is formed on a first gate insulating film and also a silicon film pattern for the resistance element is formed on a laminated film, over a major surface of a semiconductor substrate. The gate electrode includes a first gate metal film over the first gate insulating film and a first silicon film formed over the first gate metal film. The laminated film includes a first laminate insulating film in the same layer as the first gate insulating film, a first laminate metal film which is formed over the first laminate insulating film and also in the same layer as the first gate metal film of the gate electrode, and a second laminate insulating film formed over the first laminate metal film. Then, the silicon film pattern is formed by a first laminate silicon film in the same layer as the first gate silicon film of the gate electrode.

Here, in a planar view, a footprint of the silicon film pattern is more preferably included within the second laminate insulating film described above.

Further, a method of manufacturing a semiconductor device according to a representative embodiment is a method of manufacturing a semiconductor device including a MISFET and a resistance element. First, a common first insulating film for a gate insulating film is formed over a major surface of a semiconductor substrate, a common first metal film for a metal gate electrode is formed over the first insulating film, a second insulating film is formed over the first metal film, and an insulating film pattern (referred to hereinafter as a "second laminate insulating film") is formed by patterning this second insulating film. After that, a common first silicon film for both of the metal gate electrode and the resistance element is formed over the first metal film so as to cover the second laminate insulating film, a resist pattern having a first resist pattern portion and a second resist pattern portion is formed over this first silicon film, and the first silicon film and the first metal film are etched by the use of this resist pattern as an etching mask. Thereby, the metal gate electrode is formed by the first gate metal film and the first gate silicon film remaining under the first resist pattern portion, and a silicon film pattern for the resistance element is formed by the first laminate silicon film remaining under the second resist pattern. In a planar view, the second laminate insulating film overlaps at least a part of this silicon film pattern.

Here, in the planar view, a footprint of the silicon film pattern is more preferably included within the second laminate insulating film.

The following explains briefly the outline of a typical invention among the inventions disclosed in the present application.

According to a representative embodiment, it is possible to form a metal gate electrode and a resistance element on the same silicon substrate while suppressing increase in the number of manufacturing steps.

Further, it is possible to improve the freedom (flexibility) of design of a semiconductor device.

Further, it is possible to realize a smaller size of a semiconductor device.

BRIEF DESCRIPTION OF THE DRAWINGS

FIG. 9 is a relevant portion cross-sectional view in the manufacturing step of a semiconductor device succeeding the step of FIG. 7;

FIG. 10 is a relevant portion cross-sectional view in the same manufacturing step of a semiconductor device as the step of FIG. 9;

DETAILED DESCRIPTION

Figure 1:
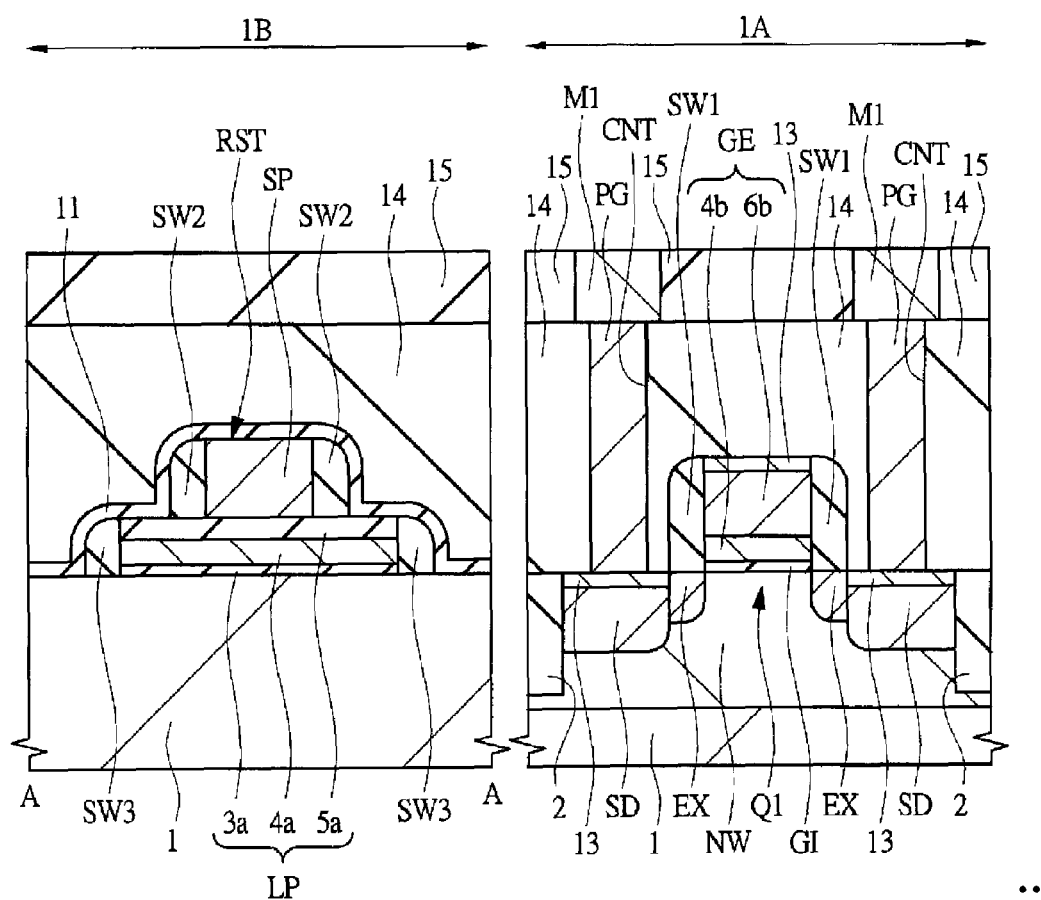
FIG. 1 is a relevant portion cross-sectional view of a semiconductor device which is an embodiment of the present invention and shows the cross-section along the line 1-1 in FIG. 3.

The following embodiment will be explained, divided into plural sections or embodiments, if necessary for convenience. Except for the case where it shows clearly in particular, they are not mutually unrelated and one has relationships such as a modification, details, and supplementary explanation of some or entire of another. In the following embodiment, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the following embodiment, it is needless to say that an element (including an element step etc.) is not necessarily indispensable, except for the case where it is clearly specified in particular and where it is considered to be clearly indispensable from a theoretical point of view, etc. Similarly, in the following embodiment, when referring to shape, position relationship, etc. of an element etc., what resembles or is similar to the shape substantially shall be included, except for the case where it is clearly specified in particular and where it is considered to be clearly not right from a theoretical point of view. This statement also applies to the numeric value and range described above.

Hereinafter, embodiment of the present invention will be explained in detail according to the drawings. Note that, in all the drawings for explaining the embodiment, the same reference symbol is attached to a member having the same function and repeated explanation thereof will be omitted. Further, in the following embodiment, explanation of the same or a similar portion will not be repeated in principle except when it is required in particular.

Further, in the drawings used in the embodiment, sometimes hatching is omitted even from a cross-sectional view for making the drawing easy to view. Further sometimes hatching is attached even to a plan view for making the drawing easy to view.

Embodiment 1

Figure 2:
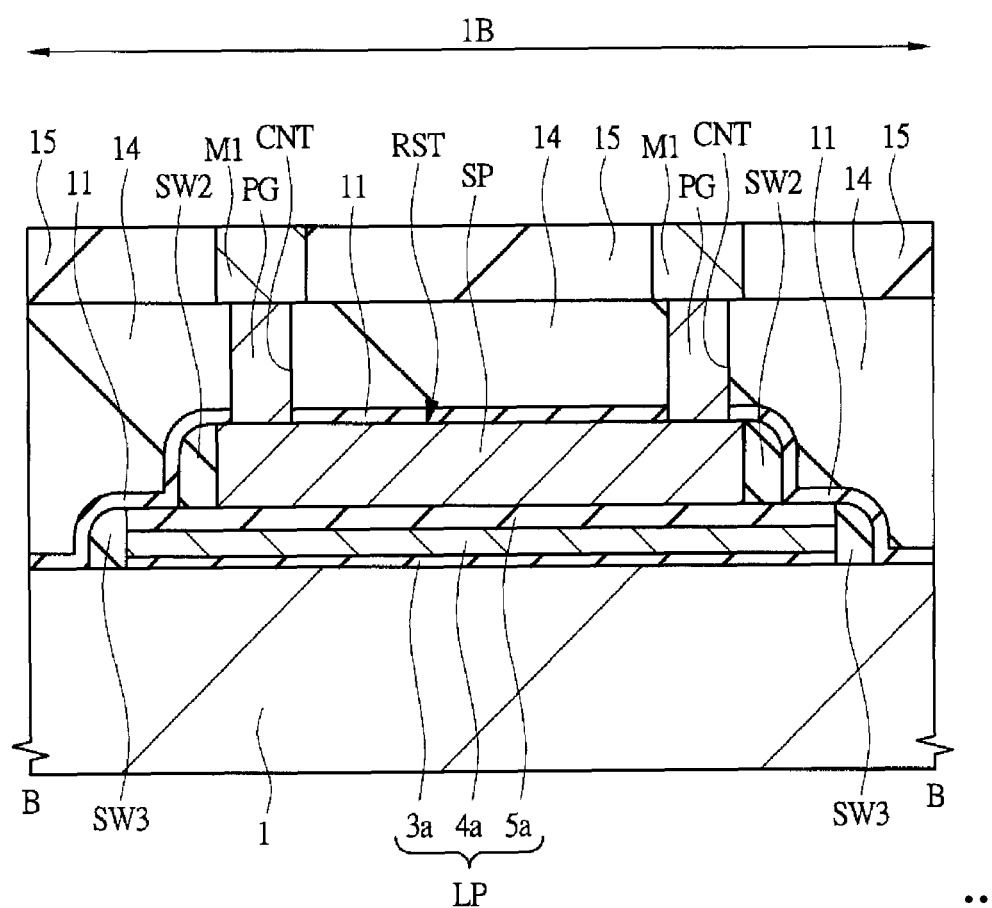
FIG. 2 is a relevant portion cross-sectional view of a semiconductor device which is an embodiment of the present invention and shows the cross-section along the line 2-2 of FIG. 3.
Figure 3:
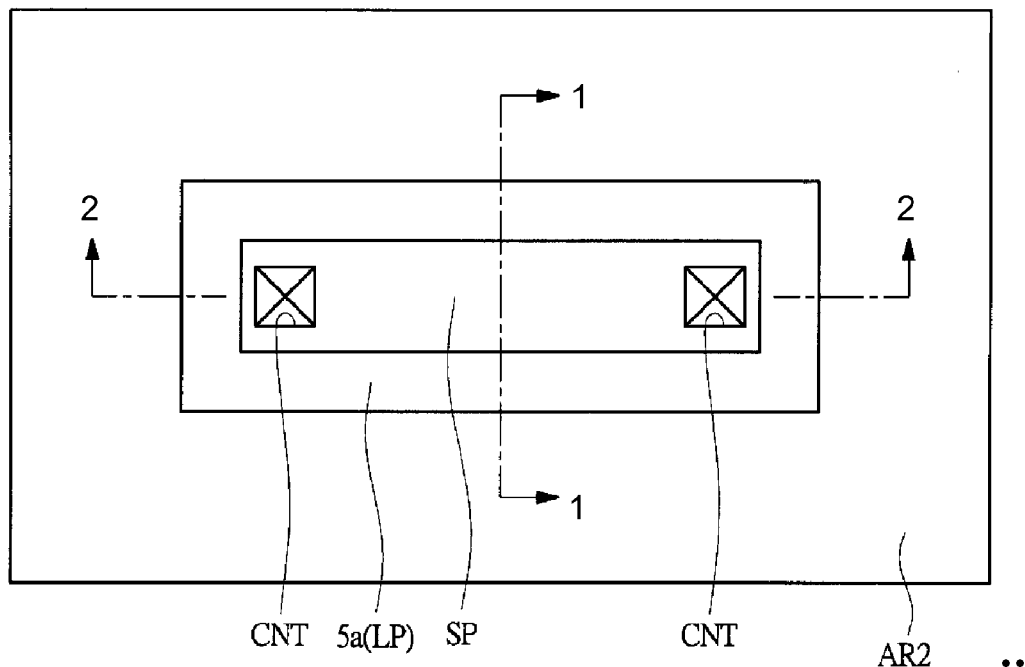
FIG. 3 is a relevant portion plan view of a semiconductor device of FIGS. 1 and 2.
Figure 4:
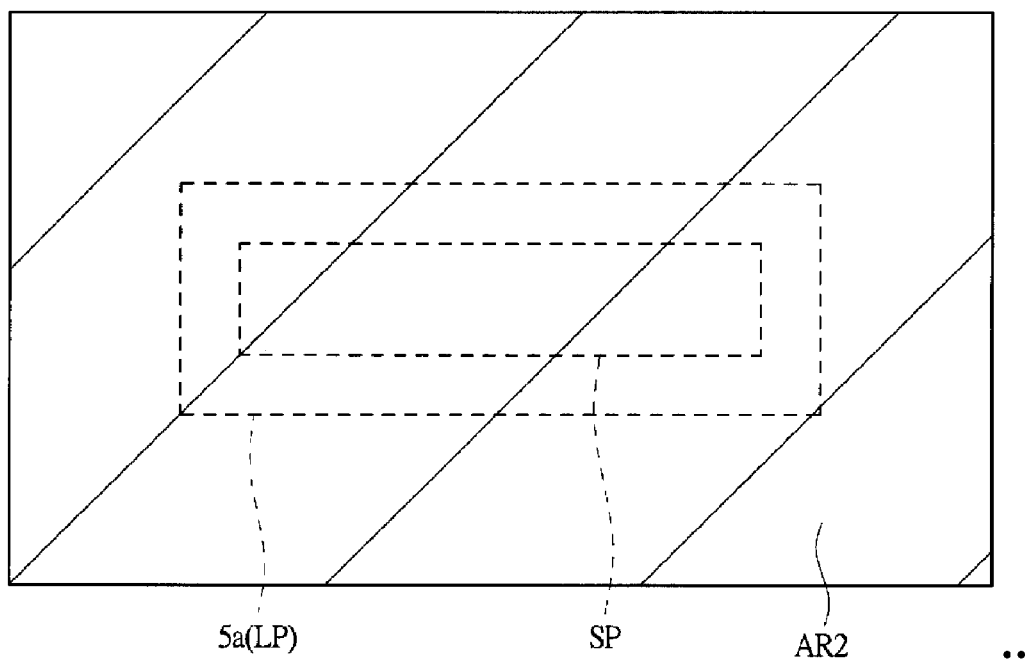
FIG. 4 is a relevant portion plan view of a semiconductor device of FIGS. 1 and 2.

A semiconductor device which is an embodiment of the present invention will be explained with reference to the drawings. FIG. 1 and FIG. 2 are relevant portion cross-sectional views of a semiconductor device which is an embodiment of the present invention. FIG. 3 and FIG. 4 are relevant portion plan views of a semiconductor device which is an embodiment of the present invention. A semiconductor device of the present embodiment is a semiconductor device including a resistance element and a MISFET (Metal Insulator Semiconductor Field Effect Transistor) element. FIG. 3 and FIG. 4 show the same region of a resistance element formation region 1B. Among these drawings, FIG. 3 shows a planar layout of an active region AR2, a second laminate insulating film 5a (belonging to laminated pattern LP), a silicon film pattern SP, and a contact hole CNT, from which illustration of the other configuration is omitted, and, on the other side, FIG. 4, while being a plan view of the same region as in FIG. 3, provides hatching for the active region AR and shows the silicon film pattern SP and the second laminate insulating film 5a (belonging to laminated pattern LP) by dotted lines, for easy understanding. The cross-sectional view along the 1-1 line in FIG. 3 corresponds to the cross-sectional view of the resistance element formation region 1B in FIG. 1, and the cross-sectional view along the 2-2 line in FIG. 3 corresponds to the cross-sectional view of the resistance element formation region 1B in FIG. 2. A plan view of a MISFET formation region 1A is not shown in the drawings.

As shown in FIG. 1 and FIG. 2, a semiconductor substrate 1 configuring the semiconductor device of the present embodiment includes p-type single crystal silicon having a specific resistance of approximately 1 to 10 Ωcm, for example.

The semiconductor substrate 1 includes the MISFET formation region 1A (transistor forming region) which is a region where a MISFET is formed and the resistance element formation region 1B which is a region where a resistance element is formed. FIG. 1 shows relevant portion cross-sectional views of the MISFET formation region 1A and the resistance element formation region 1B, and FIG. 2 shows a relevant portion cross-sectional view of the resistance element formation region 1B. While, in FIG. 1, the MISFET formation region 1A and the resistance element formation region 1B are shown neighboring each other for easy understanding, the actual positional relationship between the MISFET formation region 1A and the resistance element formation region 1B in the semiconductor substrate 1 can be changed as needed. Further, while, in FIG. 1, a region where a p-channel type MISFET is formed is shown in the MISFET formation region 1A, actually not only the p-channel type MISFET but also an n-channel type MISFET is formed in the MISFET formation region 1A. The semiconductor substrate 1 of the MISFET formation region 1A in FIG. 1, the semiconductor substrate 1 of the resistance element formation region 1B in FIG. 1, and the semiconductor substrate 1 of the resistance element formation region 1B in FIG. 2 are the same semiconductor substrate 1.

As shown in FIG. 1, an element isolation region 2 is formed in a major surface of the semiconductor substrate 1. The element isolation region 2 includes an insulator (insulating film, i.e., silicon oxide film or the like) which is embedded in an element isolation trench (trench) 2a (see FIG. 7) formed in the major surface of the semiconductor substrate 1 and can be formed by the STI (Shallow Trench Isolation) method.

In the semiconductor substrate 1, an active region is defined (demarcated) by the element isolation region 2, and a MISFET Q1 is formed within this active region in the MISFET formation region 1A and a resistance element RST is formed over the active region on the laminated pattern LP in the resistance element formation region 1B. The active region corresponds to a region (substrate region) where the element isolation region 2 is not formed in the major surface of the semiconductor substrate 1.

In the MISFET formation region 1A, an n-type well (n-type semiconductor region) NW is formed in a region across the major surface and a predetermined depth of the semiconductor substrate 1. While, in FIG. 1, the well region is not formed in the resistance element formation region 1B, a p-type or n-type well region also can be formed in the semiconductor substrate 1 of the resistance element formation region 1B as another mode.

In the MISFET formation region 1A, the MISFET Q1 is formed in the major surface of the semiconductor substrate 1 and, in the resistance element formation region 1B, the resistance element RST is formed in the major surface of the semiconductor substrate 1.

A specific configuration will be explained for the MISFET Q1 formed in the MISFET formation region 1A.

A gate electrode GE of the MISFET Q1 is formed in the MISFET formation region 1A over the surface of the n-type well NW (that is, over the major surface of the semiconductor substrate 1) on a gate insulating film GI. That is, the gate insulating film GI intermediates between the gate electrode GE and the n-type well NW. The gate insulating film GI is an insulating film functioning as a gate insulating film of the MISFET Q1 formed in the MISFET formation region 1A.

Preferably, the gate insulating film GI is a film of an insulating material having a dielectric constant (relative permittivity) higher than a silicon nitride, that is, a so-called High-k film (high dielectric constant film). Note that, in the present application, a High-k film, a high dielectric constant film, or a high dielectric constant gate insulating film means a film having a dielectric constant (relative permittivity) higher than a silicon nitride film. As the gate insulating film GI, it is possible to use a metal oxide film such as a hafnium oxide film, a zirconium oxide film, an aluminum oxide film, a tantalum oxide film, or a lanthanum oxide film, for example, and sometimes this metal oxide film can contain either one or both of nitrogen and silicon.

Further, when a high dielectric constant gate insulating film as described above is used as the gate insulating film GI, while it is possible to form the gate insulating film GI directly on the surface (silicon surface) of the semiconductor substrate 1 (n-type well NW), it is also possible to provide an insulating interface layer (insulating layer or insulating film) including a thin silicon oxide film or silicon nitride film at an interface between the gate insulating film GI and the semiconductor substrate 1 (n-type well NW). When the interface layer including the silicon oxide or silicon nitride is provided, it is possible to cause an interface between the gate insulating film and the semiconductor substrate (silicon surface thereof) to have a structure of $SiO_2/Si$ (or SiON/Si) and it is possible to reduce the number of defects such as traps to improve driving capability and reliability.

The gate electrode GE is formed by a laminated film of a first gate metal film (metal layer) 4b, which is formed over the first gate insulating film GI and contacts the first gate insulating film GI, and a first gate silicon film 6b over this first gate metal film 4b. The gate electrode GE includes the first gate metal film 4b which contacts the first gate insulating film GI and is a so-called metal gate electrode.

Note that, in the present application, a metal film (metal layer) means a conductive film (conductive layer) showing metal conduction, and includes not only single metal film (pure metal film) and a metal-alloy film but also a metal compound film (metal nitride film, metal carbide film, or the like). Accordingly, each of the common first metal film 4, the first gate metal film 4b and a first laminate metal film 4a to be described below is a conductive film showing the metal conduction and has a resistivity as low as a metal level one. A film preferable in particular as the first gate metal film 4b is a titanium nitride (TiN) film, a tantalum nitride (TaN) film, a tungsten nitride (WN) film, a titanium carbide (TiC) film, a tantalum carbide (TaC) film, a tungsten carbide (WC) film, or a tantalum carbonitride (TaCN) film.

Specifically, the gate silicon film 6b includes a polycrystalline silicon film (poly-silicon film) and is doped with impurities to have a low resistivity. That is, the gate silicon film 6b includes a doped poly-silicon film. The first gate metal film 4b has a resistivity lower than the first gate silicon film 6b.

In the n-type well NW of the MISFET formation region 1A, a $p^-$-type semiconductor region (extension region or LDD region) EX and a $p^+$-type semiconductor region (source-drain region) SD having an impurity concentration higher than the $p^-$-type semiconductor region EX are formed as a source-drain region of an LDD (Lightly Doped Drain) structure in the p-channel type MISFET Q1. The $p^+$-type semiconductor region SD has a higher impurity concentration and a deeper junction depth than the $p^-$-type semiconductor region EX.

Over the side wall of the gate electrode GE, a side wall spacer (side wall or side wall insulating film) SW1 including an insulator (insulating film) is formed. In the MISFET formation region 1A, the $p^-$-type semiconductor region EX is formed to be aligned with the gate electrode GE and the $p^+$-type semiconductor region SD is formed to be aligned with the side wall spacer SW1 provided over the side wall of the gate electrode GE. That is, the $p^-$-type semiconductor region EX is located under the side wall spacer SW1 formed over the side wall of the gate electrode GE and intermediates between a channel region of the p-channel type MISFET Q1 and the $p^+$-type semiconductor region SD.

Over the surface of the $p^+$-type semiconductor region SD and the surface of the first gate silicon film 6b configuring the gate electrode GE, a metal silicide layer 13 such as a cobalt silicide layer or a nickel silicide layer is formed by the use of the Salicide (Self Aligned Silicide) technique. It is possible also to consider the combination of the first gate metal film 4b and the first gate silicon film 6b configuring the gate electrode GE and the metal silicide layer 13 in the upper portion of the first gate silicon film 6b as the gate electrode GE.

Further, while the case that the MISFET Q1 formed in the MISFET formation region 1A is a p-channel type MISFET is shown here, it is also possible to form an n-channel type MISFET as the MISFET Q1 formed in the MISFET formation region 1A by reversing the conduction type of each region. Further, in the MISFET formation region 1A, it is possible to form both of the p-channel type MISFET and the n-channel type MISFET, that is, a CMISFET (Complementary Metal Insulator Semiconductor Field Effect Transistor).

Next, a specific configuration will be explained for the resistance element RST formed in the resistance element formation region 1B.

The resistance element (poly-silicon resistance element) RST is formed by a silicon film pattern (patterned silicon film) SP. Specifically, the silicon film pattern SP includes a polycrystalline silicon film (poly-silicon film) and is doped with impurities to have a low resistivity. That is, the silicon film pattern SP includes a doped poly-silicon film. The silicon film pattern SP includes a silicon film in the same layer as the first gate silicon film 6b of the gate electrode GE in the MISFET formation region 1A and is formed in the same step. That is, the silicon film pattern SP configuring the resistance element RST includes the silicon film in the same layer formed in the same step as the first gate silicon film 6b of the gate electrode GE.

Further, while the silicon film pattern SP and the first gate silicon film 6b of the gate electrode GE are including the silicon film in the same layer, impurity concentration (also kind of impurity depending on the case) may be different therebetween. By making the impurity concentration different between the silicon film pattern SP and the first gate silicon film 6b of the gate electrode GE, it is possible to set the conduction type and the impurity concentration of the first gate silicon film 6b of the gate electrode GE to be a conduction type and an impurity concentration suitable for the MISFET formation and to set the conduction type and the impurity concentration of the silicon film pattern SP to be a conduction type and an impurity concentration suitable for the formation of the resistance element RST.

Further, over the side wall of the silicon film pattern SP, a side wall spacer (side wall or side wall insulating film) SW2 is formed similarly to the above side wall spacer SW1. The side wall spacer SW2 is formed in the same step as the side wall spacer SW1 in the MISFET formation region 1A.

The silicon film pattern SP is not formed directly on the surface of the semiconductor substrate 1 but the laminated pattern LP is formed over the surface of the semiconductor substrate 1 and the silicon film pattern SP is formed over this laminated pattern LP. That is, the laminated pattern LP intermediates between the silicon film pattern SP and the semiconductor substrate 1 and the silicon film pattern SP is formed over the semiconductor substrate 1 on the laminated pattern LP.

The laminated pattern LP is a laminated film. Specifically, the laminated pattern LP is formed by a laminated film comprising a first laminate insulating film 3a, a first laminate metal film 4a over the first laminate insulating film 3a, and a second laminate insulating film 5a over the first laminate metal film 4a. The first laminate insulating film 3a of the laminated pattern LP includes an insulating film in the same layer as the first gate insulating film GI in the MISFET formation region 1A and formed in the same step. That is, the first laminate insulating film 3a of the laminated pattern LP includes the insulating film in the same layer formed in the same step as the first gate insulating film GI in the MISFET formation region 1A. Thereby, the first laminate insulating film 3a of the laminated pattern LP includes the same material (insulating material) as the first gate insulating film GI in the MISFET formation region 1A. Accordingly, when a high dielectric constant film (High-k film) as described above is used for the first gate insulating film GI in the MISFET formation region 1A, the first laminate insulating film 3a of the laminated pattern LP also becomes a high dielectric constant film (High-k film).

Further, the first laminate metal film 4a of the laminated pattern LP includes a metal film in the same layer as the first gate metal film 4b of the gate electrode GE in the MISFET formation region 1A and formed in the same step. That is, the first laminate metal film 4a of the laminated pattern LP includes the metal film in the same layer formed in the same step as the first gate metal film 4b of the gate electrode GE in the MISFET formation region 1A. Accordingly, the first laminate metal film 4a of the laminated pattern LP includes the same material (metal material) as the first gate metal film 4b of the gate electrode GE in the MISFET formation region 1A. The first laminate metal film 4a of the laminated pattern LP has a resistivity lower than the silicon film pattern SP.

Further, over the side wall of the laminated pattern LP, a side wall spacer (side wall or side wall insulating film) SW3 is formed similarly to the above side wall spacers SW1 and SW2. The side wall spacer SW3 is formed in the same step as the side wall spacer SW2 and the side wall spacer SW1 in the MISFET formation region 1A.

Further, when a high dielectric constant film (High-k film) as described above is used for the first gate insulating film GI and the first laminate insulating film 3a and when the first gate insulating film GI is formed directly on the surface (silicon surface) of the semiconductor substrate 1 (n-type well NW), also the first laminate insulating film 3a of the laminated pattern LP is configured to have a state of being formed directly on the surface (silicon surface) of the semiconductor substrate 1. Meanwhile, when a high dielectric constant film (High-k film) as described above is used for the first gate insulating film GI and the first laminate insulating film 3a and when an insulating interface layer including a thin silicon oxide film or silicon oxynitride film is provided at the interface between the first gate insulating film GI and the semiconductor substrate 1 (n-type well NW), an insulating interface layer including a silicon oxide film or silicon oxynitride film is formed also at the interface between the insulating film 3a of the laminated pattern LP and the semiconductor substrate 1.

As apparent from FIG. 3, the silicon film pattern SP is included within the second laminate insulating film 5a in a planar view. That is, the second laminate insulating film 5a is formed having a planar shape larger than the silicon film pattern SP and the silicon film pattern SP does not protrude from the laminated pattern LP in the planar view. Accordingly, the whole silicon film pattern SP is located over the second laminate insulating film 5a and the whole silicon film pattern SP (lower surface thereof) contacts the second laminate insulating film 5a (upper surface thereof). Since the silicon film pattern SP is included within the second laminate insulating film 5a in the planar view, the whole silicon film pattern SP is located over the second laminate insulating film 5a and the silicon film pattern SP does not contact the first laminate metal film 4a while contacting the second laminate insulating film 5a. Note that "planar view" or "in a planar view" means a view of a plane parallel to the major surface of the semiconductor substrate 1. This may also be referred to a "top view" when viewing the device from above.

Further, the laminated pattern LP has the same planar shape as the insulating film 5a. Accordingly, the silicon film pattern SP is included within the laminated pattern LP in the planar view. That is, the laminated pattern LP is formed having a planar shape larger than the silicon film pattern SP and the silicon film pattern SP does not protrude from the laminated pattern LP in the planar view.

Further, in the resistance element formation region 1B, third insulating film 11 including a silicon oxide film or the like is formed over the major surface of the semiconductor substrate 1 so as to cover the silicon film pattern SP, the laminated patter LP, and the side wall spacers SW2 and SW3. This third insulating film 11 is an insulating film provided for preventing the metal silicide layer 13 from being formed in the Salicide process. In the MISFET formation region 1A, the third insulating film 11 is removed for the formation of the metal silicide layer 13 over the surface of the $p^+$-type semiconductor region SD and the surface of the first gate silicon film 6b of the gate electrode GE, and on the other side, in the resistance element formation region 1B, the silicon film pattern SP is covered by the third insulating film 11 and thereby the metal silicide layer 13 is prevented from being formed over the silicon film pattern SP. The third insulating film 11 may be formed over the side wall spacers SW2 and SW3 and may be formed over a part of the laminated pattern LP which is not covered by the silicon film pattern SP or the side wall spacer SW2.

Figure 5:
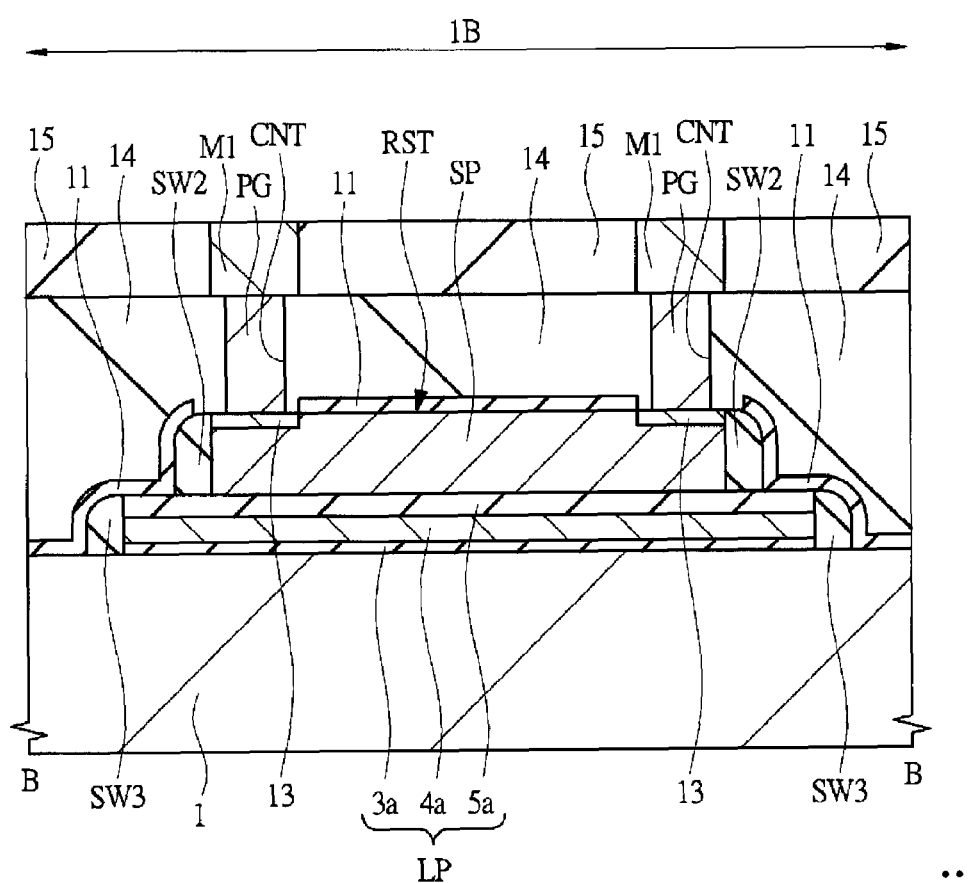
FIG. 5 is a relevant portion cross-sectional view of a semiconductor device in a first modified example.

Here, as a first modified example, as shown in FIG. 5, the metal silicide layer 13 can be formed also in a region which is to be connected with a plug PG, in the upper surface of the silicon film pattern SP. In the case of this first modified example (FIG. 5), the metal silicide layer 13 is not formed over the whole silicon film pattern SP; it is only formed in the upper surface of the silicon film pattern SP in the portion(s) (regions) to which the plug PG is connected. Over the upper surface of the silicon film pattern SP where the metal silicide layer 13 is not formed, the third insulating film 11 is formed. Note that FIG. 5 is a relevant portion cross-sectional view of the first modified example of the present embodiment and shows a cross-sectional view corresponding to above FIG. 2. Further, in a second modified example and a third modified example to be described below, as in the first modified example, the metal silicide layer 13 can be formed also in a region which is connected with the plug PG, in the upper surface of the silicon film pattern SP.

In this manner, the MISFET Q1 is formed in the MISFET formation region 1A and the resistance element RST including the silicon film pattern SP is formed in the resistance element formation region 1B.

Over the whole major surface of the semiconductor substrate 1, a fourth insulating film (first interlayer insulating film) 14 is formed so as to cover the gate electrode GE and the silicon film pattern SP. The first interlayer insulating film 14 includes a single film of silicon oxide film, a laminated film of a silicon nitride film and a silicon oxide film thicker than the silicon nitride film (silicon nitride film on the lower layer side), or the like, and the upper surface of the first interlayer insulating film 14 is made flat so as to cause the height thereof to be approximately the same between the MISFET formation region 1A and the resistance element formation region 1B.

The contact hole (opening portion, through-hole, or connection hole) CNT is formed in the first interlayer insulating film 14, and the conductive plug (connection conductor) PG is formed within the contact hole CNT. While the plug PG is formed by a conductive barrier film (e.g., titanium film, titanium nitride film, or laminated film thereof) which is formed over the bottom portion and the side wall of the contact hole CNT and a major conductor film including a tungsten (W) film or the like which is formed over the conductive barrier film so as to fill the inside of the contact hole CNT, the conductive barrier film and the major conductor film are shown as the plug PG without discrimination in FIG. 2 and FIG. 5 for simplification of the drawings.

The contact hole CNT and the plug PG filling the contact hole CNT are formed over each of the p-type semiconductor region SD and the gate electrode GE in the MISFET formation region 1A, the silicon film pattern SP in the resistance element formation region 1B, and the like. FIG. 1 shows the plug PG formed over the p-type semiconductor region SD in the MISFET formation region 1A, and the bottom portion of this plug PG contacts the metal silicide layer 13 formed in the surface (upper surface) of the p-type semiconductor region SD and is connected electrically thereto. Further, FIG. 2 shows the plug PG formed over the edge portion of the silicon film pattern SP in the resistance element formation region 1B, and the bottom portion of this plug PG contacts the upper surface of an edge portion in the silicon film pattern SP and is connected electrically thereto. Note that, in the case of the first modified example of FIG. 5, the bottom portion of the plug PG contacts the metal silicide layer 13 formed in the upper surface of the edge portion in the silicon film pattern SP and is connected electrically thereto.

Over the first interlayer insulating film 14 in which the plug PG is embedded, a fifth insulating film 15 (second interlayer insulating film 15) including a silicon oxide film, for example, is formed, and a wiring as a first layer wiring (wiring layer or first wiring layer) M1 is formed in a wiring trench (opening portion) formed in the second interlayer insulating film 15.

While the wiring M1 is formed by a conductive barrier film (e.g., titanium film, titanium nitride film, or laminated film thereof) formed over the bottom portion and the side wall of the wiring trench which is formed in the second interlayer insulating film 15 and a major conductor film of copper formed over the conductive barrier film so as to fill the wiring trench, the conductive barrier film and the major conductor film are shown as the wiring M1 without discrimination in FIG. 1, FIG. 2, and FIG. 5 for simplification of the drawings. The wiring M1 is connected electrically to each of the p-type semiconductor region SD and gate electrode GE in the MISFET formation region 1A, the silicon film pattern SP in the resistance element formation region 1B, and the like via the plug PG.

While the wiring M1 is formed by a damascene technique (here, single damascene technique), the wiring M1 can be formed also by a patterned conductor film (e.g., tungsten wiring or aluminum wiring) as another mode.

Next, manufacturing steps of a semiconductor device in the present embodiment will be explained with reference to the drawings.

Figure 6:
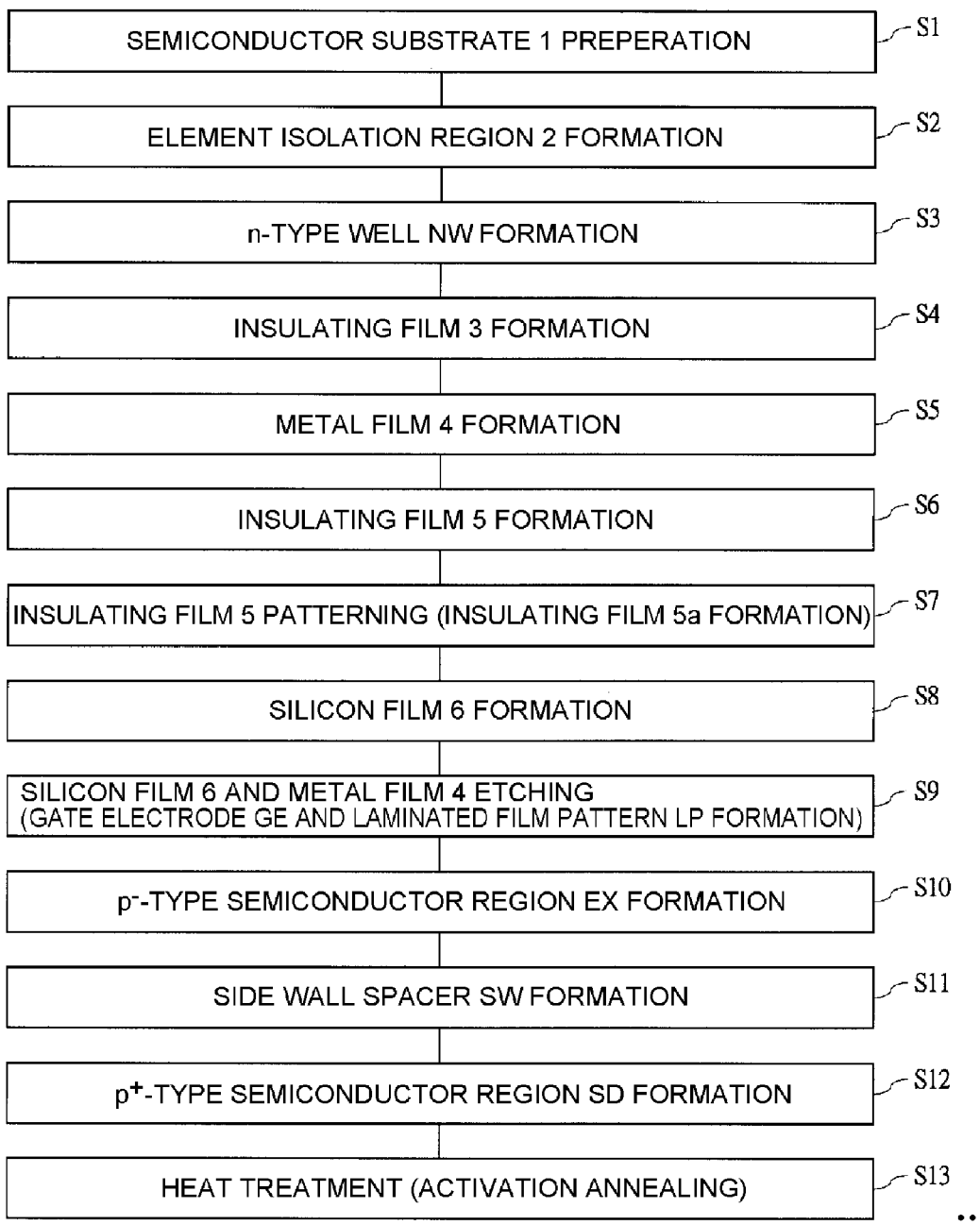
FIG. 6 is a manufacturing process flowchart showing some manufacturing steps of a semiconductor device in an embodiment of the present invention.
Figure 20:
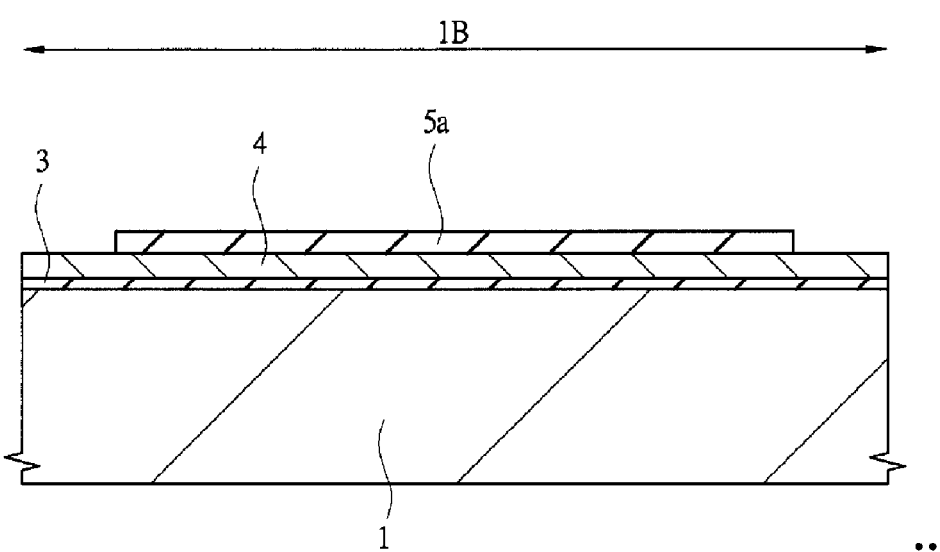
FIG. 20 is a relevant portion cross-sectional view in the same manufacturing step of a semiconductor device as the step of FIG. 19, and shows the cross-section along the line 20-20 in FIG. 21.
Figure 21:
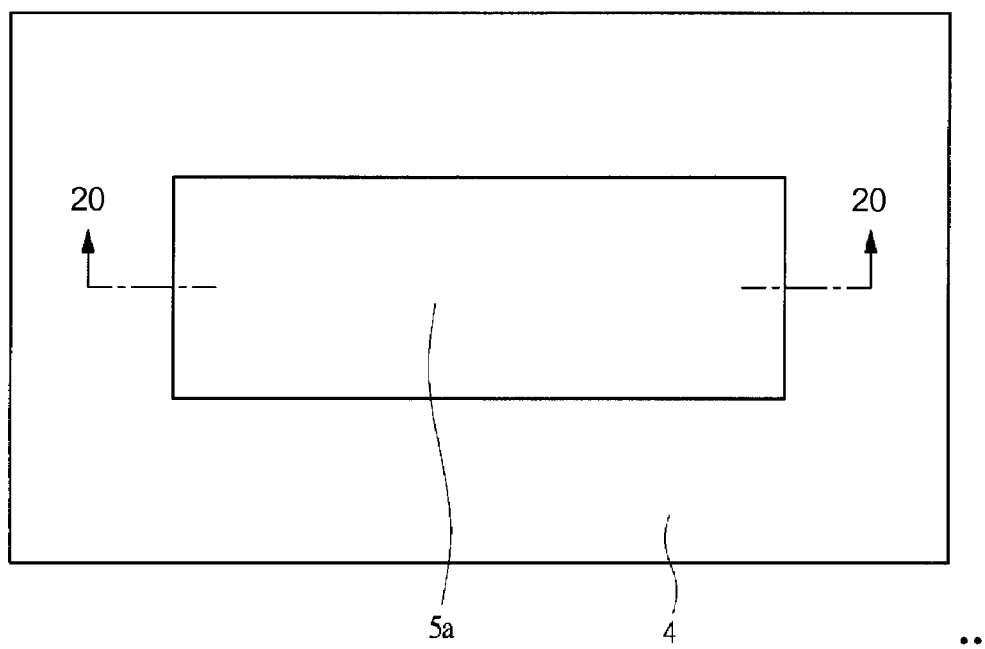
FIG. 21 is a relevant portion plan view in the same manufacturing step of a semiconductor device as the step of FIG. 19.

FIG. 6 is a manufacturing process flowchart showing some of the manufacturing steps of a semiconductor device in the present embodiment. FIG. 7 to FIG. 49 are relevant portion cross-sectional views or relevant portion plan views in the manufacturing steps of a semiconductor device in the present embodiment. Among FIG. 7 to FIG. 49, FIG. 7 to FIG. 20, FIG. 22 to FIG. 25, FIG. 27 to FIG. 30, and FIG. 32 to FIG. 49 are relevant portion cross-sectional views, and FIG. 21, FIG. 26, and FIG. 31 are relevant portion plan views. Among these drawings, FIG. 7, FIG. 9, FIG. 11, FIG. 13, FIG. 15, FIG. 17, FIG. 19, FIG. 22, FIG. 24, FIG. 27, FIG. 29, FIG. 32, FIG. 34, FIG. 36, FIG. 38, FIG. 40, FIG. 42, FIG. 44, FIG. 46, and FIG. 48 show cross sections of a region corresponding to above FIG. 1. Further, FIG. 8, FIG. 10, FIG. 12, FIG. 14, FIG. 16, FIG. 18, FIG. 20, FIG. 23, FIG. 25, FIG. 28, FIG. 30, FIG. 33, FIG. 35, FIG. 37, FIG. 39, FIG. 41, FIG. 43, FIG. 45, FIG. 47, and FIG. 49 show cross sections of a region corresponding to above FIG. 2. Further, FIG. 21, FIG. 26, and FIG. 31 show planar regions corresponding to above FIG. 3. Note that the cross-sectional view along the 20-20 line in FIG. 21 corresponds to FIG. 20, the cross-sectional view along the 25-25 line in FIG. 26 corresponds to FIG. 25, and the cross-sectional view along the 30-30 line in FIG. 31 corresponds to FIG. 30.

Figure 7:
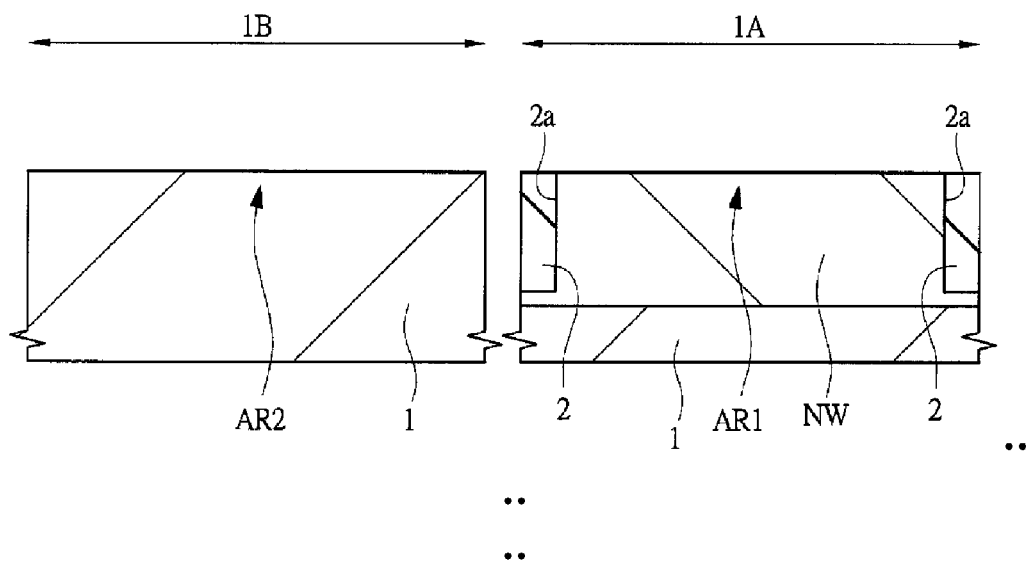
FIG. 7 is a relevant portion cross-sectional view in a manufacturing step of a semiconductor device in an embodiment of the present invention.
Figure 8:
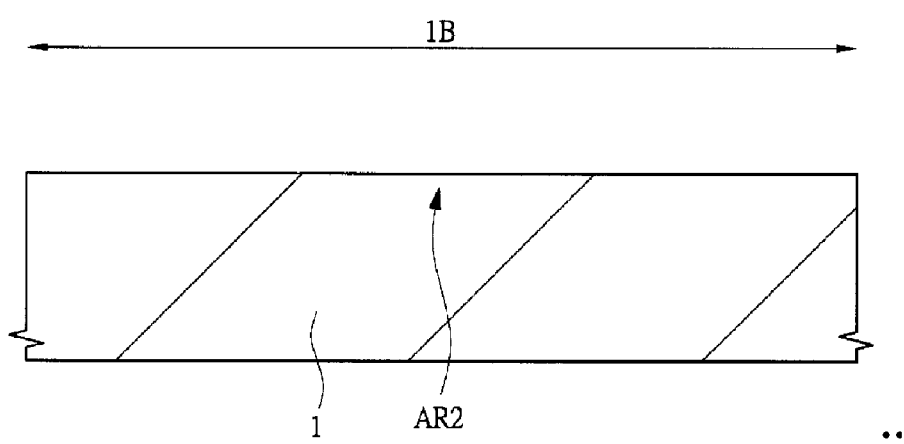
FIG. 8 is a relevant portion cross-sectional view in the same manufacturing step of a semiconductor device as the step of FIG. 7.

First, as shown in FIG. 7 and FIG. 8, the semiconductor substrate (semiconductor wafer) 1 including p-type single crystal silicon having a specific resistance of approximately 1 to 10 Ωcm, for example, or the like is prepared (Step S1 of FIG. 6). As described above, the semiconductor substrate 1 in which a semiconductor device of the present embodiment is formed includes the MISFET formation region 1A where the MISFET is to be formed and the resistance element formation region 1B where the resistance element (resistance element RST) is to be formed. After that, in the major surface of the semiconductor substrate 1, the element isolation region 2 including an insulator (insulator embedded within a trench) is formed (Step S2 of FIG. 6).

That is, after the element isolation trench (trench) 2a has been formed in the major surface of the semiconductor substrate 1 by etching or the like, an insulating film including a silicon oxide film (e.g., ozone TEOS (Tetraethoxysilane) oxide film) or the like is formed over the semiconductor substrate 1 so as to fill the element isolation trench 2a. After that, by polishing of this insulating film by a CMP (Chemical Mechanical Polishing) method, excess insulating film outside the element isolation trench 2a is removed and also an insulating film is left within the element isolation trench 2a, and thereby it is possible to form the element isolation region 2 including the insulating film (insulator) filling the element isolation trench 2a.

The active region of the semiconductor substrate 1 is defined by the element isolation region 2. The MISFET Q1 is formed as described below in a first active region AR1 defined by the element isolation region 2 in the MISFET formation region 1A. Further, the resistance element RST is formed as described below in a second active region AR2 defined by the element isolation region 2 in the resistance element formation region 1B.

Next, the n-type well (n-type semiconductor region) NW is formed in a region across the major surface of the semiconductor substrate 1 and a predetermined depth (Step S3 of FIG. 6). The n-type well NW is formed in the semiconductor substrate 1 of the MISFET formation region 1A and can be formed by ion implantation of an n-type impurity such as phosphor (P) or arsenic (As), for example, into the semiconductor substrate 1. Further, while FIG. 7 and FIG. 8 show a case in which the well region is not formed in the resistance element formation region 1B, a p-type or n-type well region can be formed also in the semiconductor substrate 1 of the resistance element formation region 1B as another mode.

Next, a natural oxide film over the surface of the semiconductor substrate 1 is removed by wet etching using hydrofluoric acid (HF) water solution, for example, or the like, and the surface of the semiconductor substrate 1 is cleaned (washed). Thereby, the surface (silicon surface) of the semiconductor substrate 1 (n-type well NW in the MISFET formation region 1A) is exposed.

Next, as shown in FIG. 9 and FIG. 10, a common first insulating film 3 is formed over the major surface of the semiconductor substrate 1 (Step S4 of FIG. 6). While the first insulating film 3 is formed in both of the MISFET formation region 1A and the resistance element formation region 1B, the first insulating film 3 in the MISFET formation region 1A becomes the first gate insulating film GI later and the first insulating film 3 in the resistance element formation region 1B becomes the first laminate insulating film 3a later. The first insulating film 3 is a high dielectric constant film (High-k film) and a usable material example thereof is the same as that described above for the first gate insulating film GI. The first insulating film 3 can be formed by the use of a sputtering method, an ALD (Atomic Layer Deposition) method, a CVD (Chemical Vapor Deposition) method, or the like. The thickness of the first insulating film 3 can be set to approximately 0.7 to 2.5 nm, for example.

Further, an interface layer including a silicon oxide film or silicon oxynitride film can be formed first over the surface of the semiconductor substrate 1 by a thermal oxidation method before the formation of the first insulating film 3, and then the first insulating film 3 can be formed over this interface layer (the interface layer is not shown in FIG. 9 or FIG. 10). When this interface layer is formed, while the first insulating film 3 is formed over this interface layer, this interface layer is not formed over the element isolation region 2, and the first insulating film 3 is formed directly on the element isolation region 2. When the interface layer is formed and then the first insulating film 3 is formed over this interface layer, it is possible to reduce the number of defects such as traps and to improve the driving capability and the reliability of the MISFET Q1 to be formed later.

Figure 11:
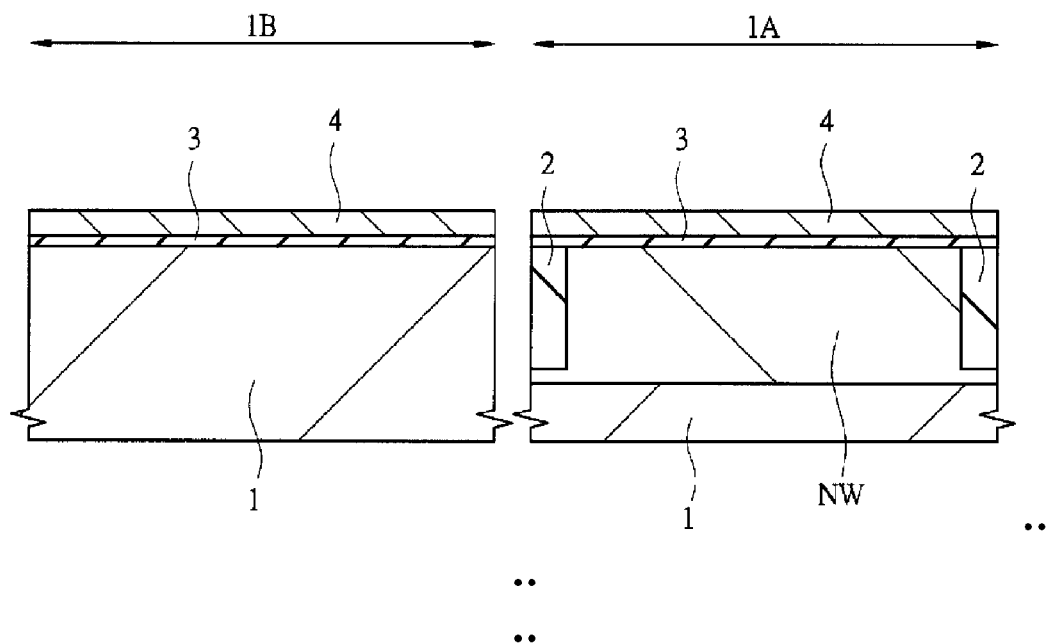
FIG. 11 is a relevant portion cross-sectional view in the manufacturing step of a semiconductor device succeeding the step of FIG. 9.
Figure 12:
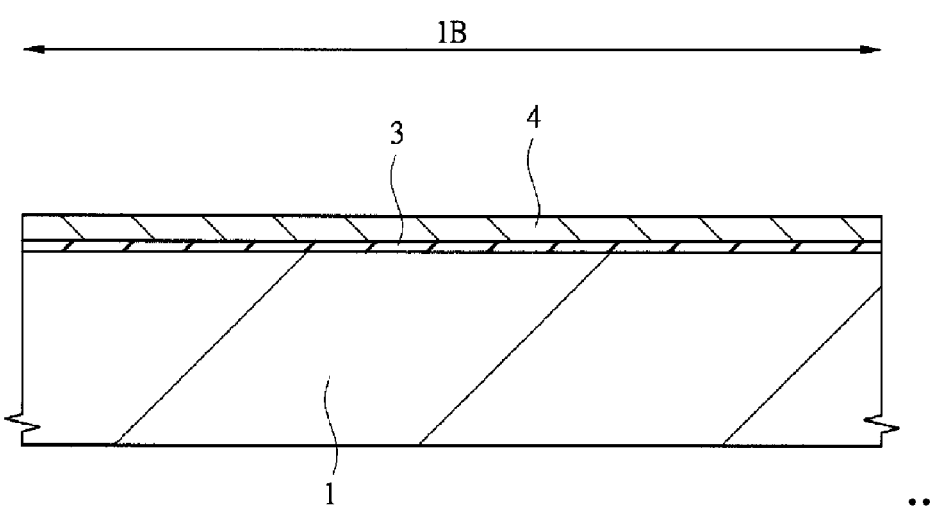
FIG. 12 is a relevant portion cross-sectional view in the same manufacturing step of a semiconductor device as the step of FIG. 11.

Next, as shown in FIG. 11 and FIG. 12, a common first metal film (metal layer) 4 for the metal gate (metal gate electrode) is formed (deposited) over the major surface (whole major surface) of the semiconductor substrate 1, that is, over the first insulating film 3 (Step S5 of FIG. 6). A preferable material example for the first metal film 4 is the same as that described above as the preferable material for the first gate metal film 4b of the gate electrode GE. The first metal film 4 can be formed by a sputtering method, or the like, for example. The thickness (formation thickness) of the first metal film 4 can be set to approximately 5 to 20 nm, for example.

Figure 13:
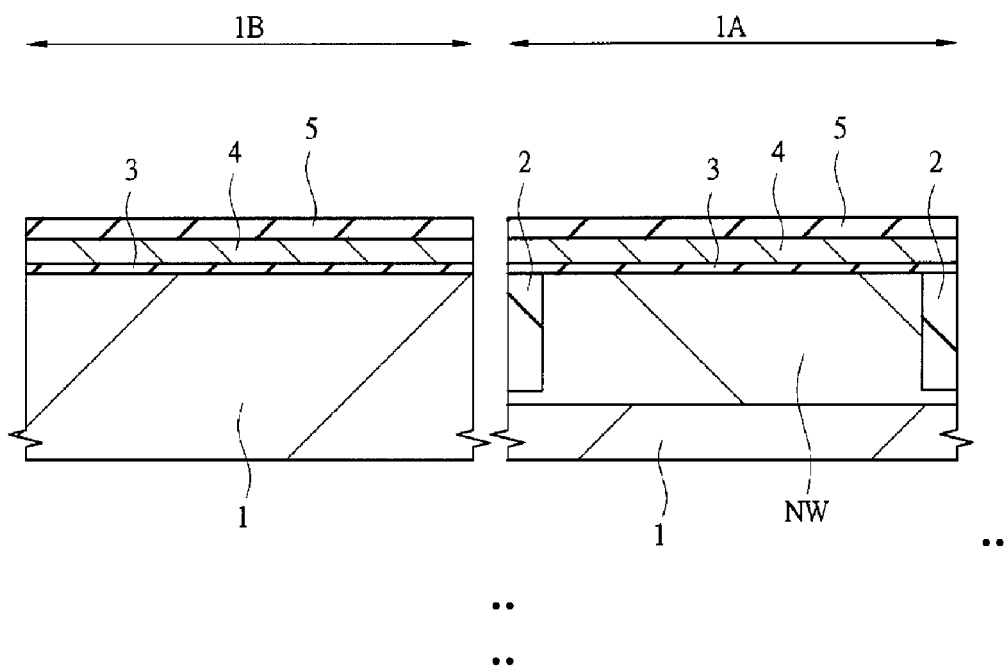
FIG. 13 is a relevant portion cross-sectional view in the manufacturing step of a semiconductor device succeeding the step of FIG. 11.
Figure 14:
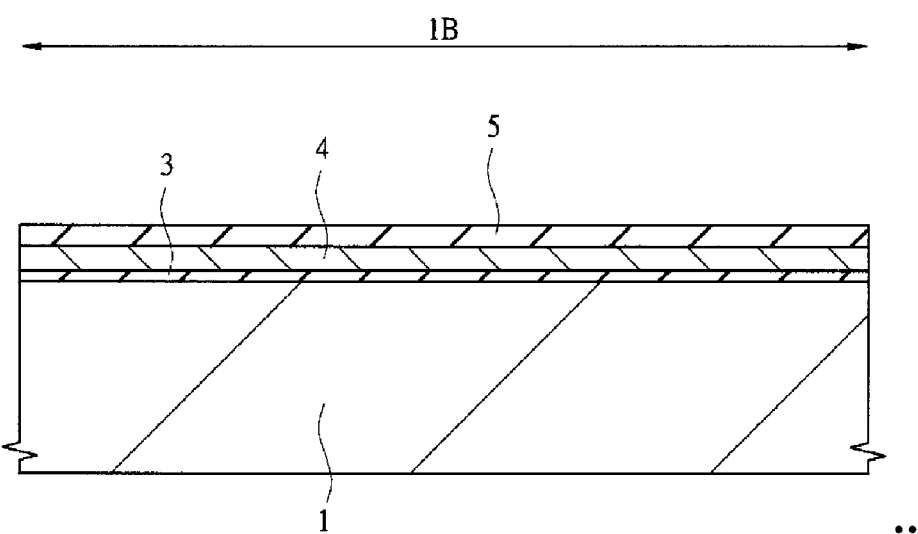
FIG. 14 is a relevant portion cross-sectional view in the same manufacturing step of a semiconductor device as the step of FIG. 13.

Next, as shown in FIG. 13 and FIG. 14, a second insulating film 5 is formed (deposited) over the major surface (whole major surface) of the semiconductor substrate 1, that is, over the first metal film 4 (Step S6 of FIG. 6).

The insulating film 5 (also second laminate insulating film 5a formed from the insulating film 5) includes a silicon oxide film (typically, SIO$_2$ film), a silicon nitride film (SiN film), a silicon oxynitride film (SiON film), a silicon carbide film (SiC film), a silicon carbonitride film (SiCN film), or a silicon carbide-oxide film (SiCO film), for example. Among these films, the silicon oxide film and the silicon nitride film are preferable for the insulating film 5. This is because the silicon oxide film and the silicon nitride film are easily removed (by wet etching using hydrofluoric acid (HF) for the silicon oxide film and by wet etching using hot phosphoric acid for the silicon nitride film) and the insulating film 5 is easily removed without providing a harmful effect to the first metal film 4 in Step S7 to be described below. In this case, a titanium nitride (TiN) film is preferable for the first metal film 4. Further, the silicon oxide film is more preferable for the insulating film 5 (also as the second laminate insulating film 5a formed from the insulating film 5), and this is because the silicon oxide film has a low dielectric constant and it is possible to suppress parasitic capacitance formed by the silicon film pattern SP, second laminate insulating film 5a, and first laminate metal film 4a.

The insulating film 5 can be formed by the use of a CVD method or the like. The thickness of the insulating film 5 can be set to approximately 10 to 30 nm, for example.

Figure 15:
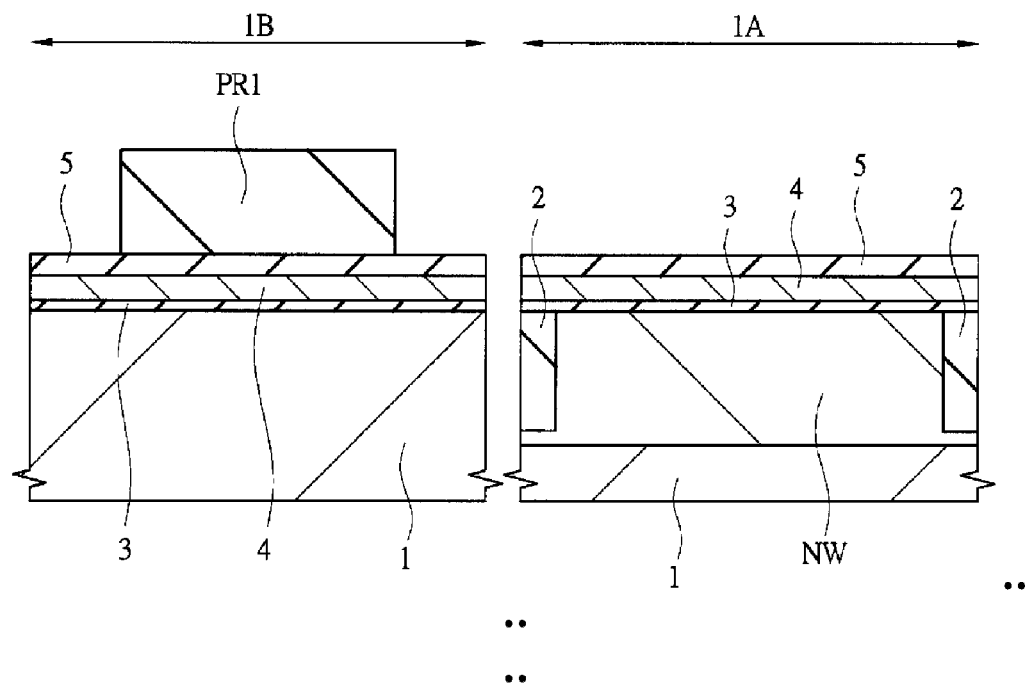
FIG. 15 is a relevant portion cross-sectional view in the manufacturing step of a semiconductor device succeeding the step of FIG. 13.
Figure 16:
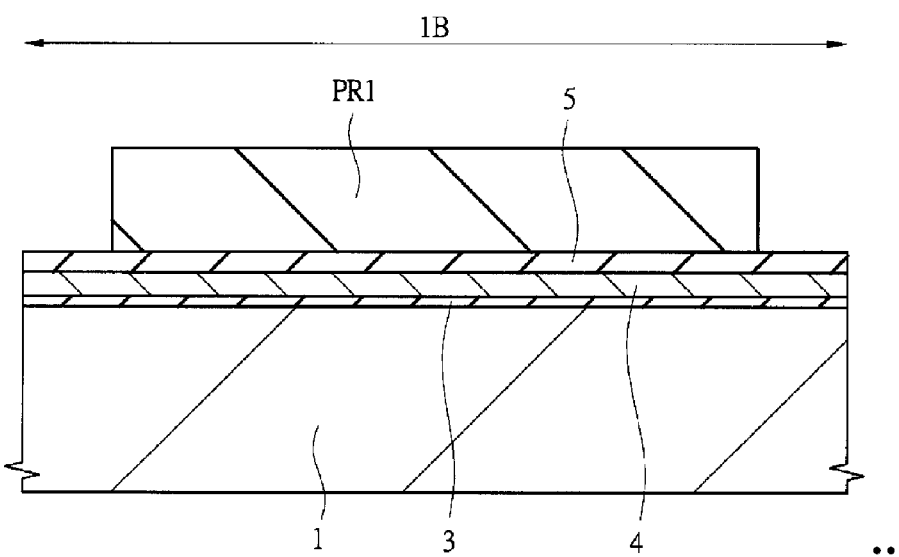
FIG. 16 is a relevant portion cross-sectional view in the same manufacturing step of a semiconductor device as the step of FIG. 15.
Figure 17:
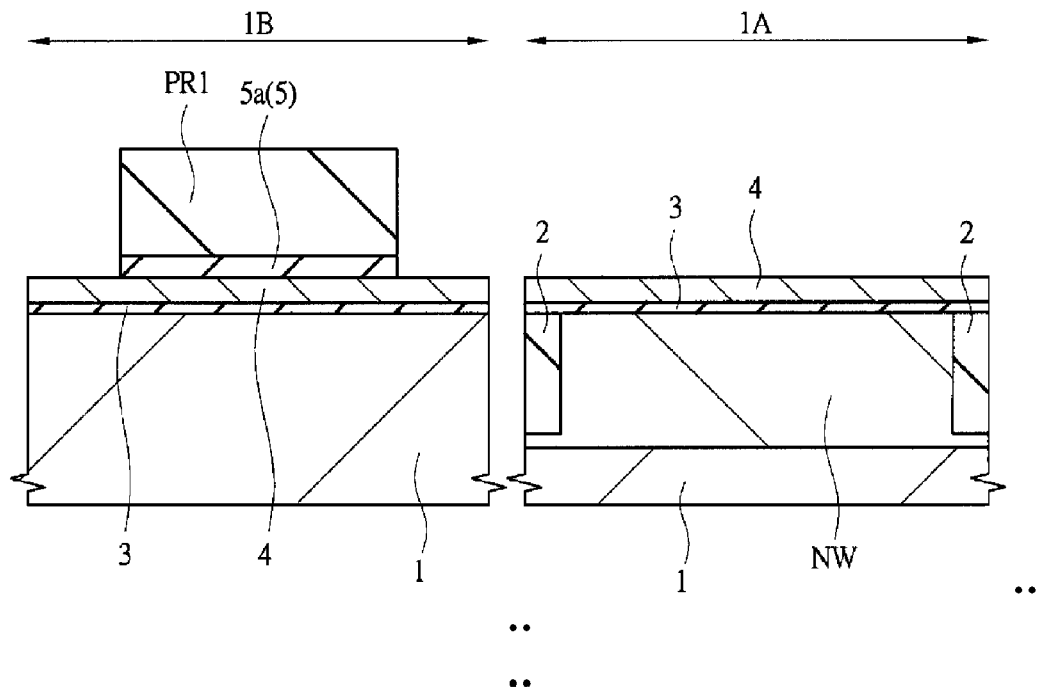
FIG. 17 is a relevant portion cross-sectional view in the manufacturing step of a semiconductor device succeeding the step of FIG. 15.
Figure 18:
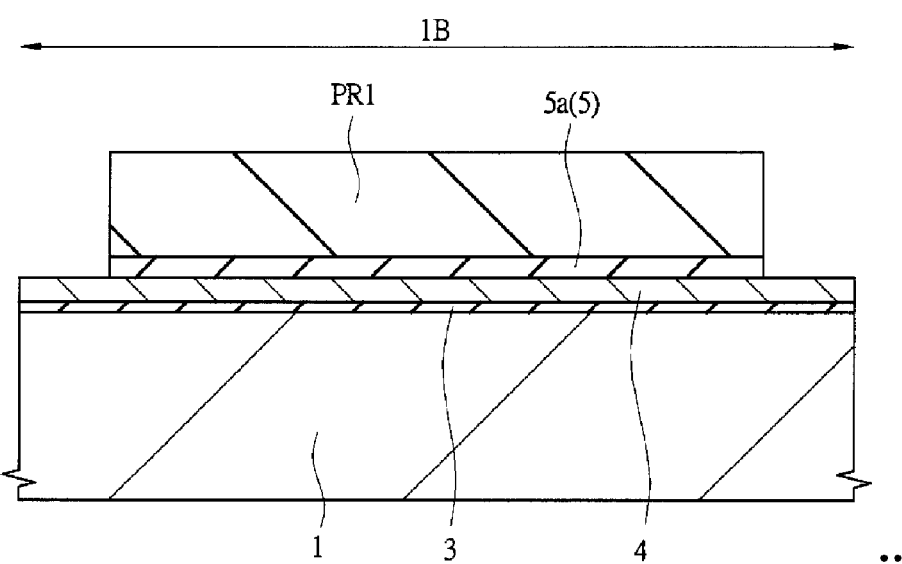
FIG. 18 is a relevant portion cross-sectional view in the same manufacturing step of a semiconductor device as the step of FIG. 17.
Figure 19:
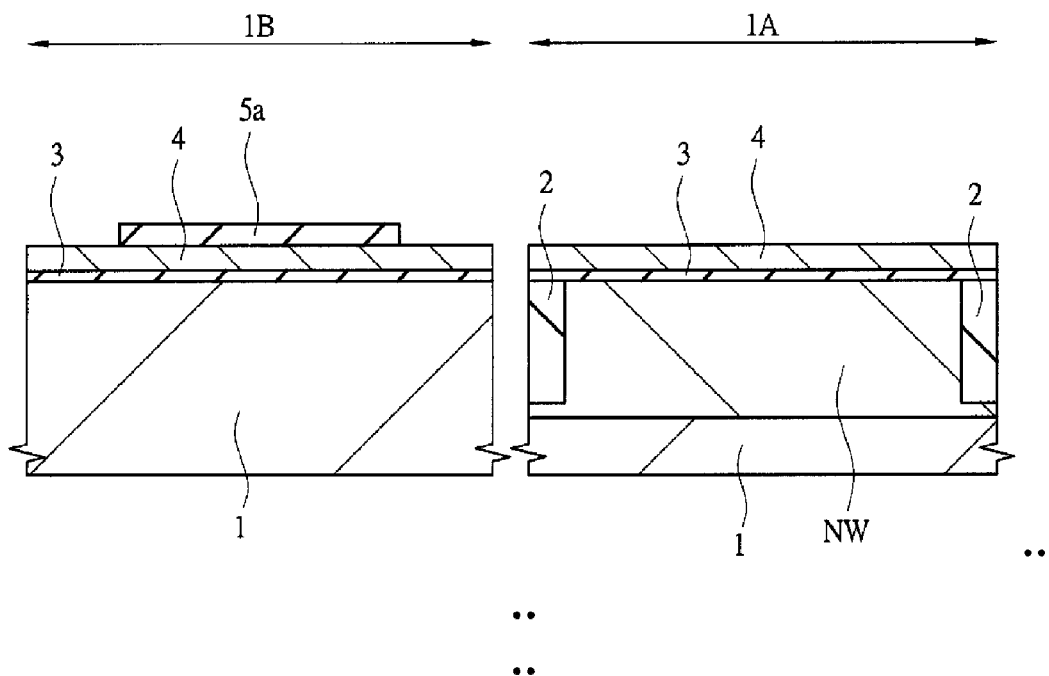
FIG. 19 is a relevant portion cross-sectional view in the manufacturing step of a semiconductor device succeeding the step of FIG. 17.

Next, as shown in FIG. 15 and FIG. 16, a first photo-resist pattern (resist pattern) PR1 is formed over the insulating film 5 as a resist pattern (etching mask layer) by the use of a photolithography technique. This first photo-resist pattern PR1 is formed in a part of the resistance element formation region 1B (region where the laminated pattern LP is to be formed). Also an anti-reflection film (BARC film) can be formed as a foundation of this first photo-resist pattern PR1. Then, as shown in FIG. 17 and FIG. 18, the insulating film 5 is etched and patterned by the use of the first photo-resist pattern PR1 as an etching mask (Step S7 of FIG. 6). In the etching of Step S7, a part of the insulating film 5 which is covered by the first photo-resist pattern PR1 is left and the insulating film 5 in the other region is removed. After that, as shown in FIG. 19 and FIG. 20, the first photo-resist pattern PR1 is removed.

By this Step S7, the second insulating film 5 is patterned and becomes the second laminate insulating film (insulating film pattern) 5a. That is, the second laminate insulating film 5a is formed by patterning the insulating film 5. While the second insulating film 5 is formed in both of the whole MISFET formation region 1A and the whole resistance element formation region 1B at the point when the second insulating film 5 has been formed in Step S6, the second laminate insulating film 5a is left in a part of the resistance element formation region 1B (region where the laminated pattern LP is to be formed) and the insulating film 5 is removed in the other region (including the MISFET formation region 1A) when the second insulating film 5 is patterned into the second laminate insulating film 5a in Step S7. FIG. 21 is a plan view of the resistance element formation region 1B in the same step as the step of FIG. 19 and FIG. 20, and shows a planar layout of the second laminate insulating film 5a. The cross-sectional view along the 20-20 line of FIG. 21 corresponds to FIG. 20.

Step S7 preferably performs the etching of the insulating film 5 without providing the harmful effect to the first metal film 4. This is because the first metal film 4 is used for the gate electrode later. In this viewpoint, wet etching is preferable for the etching performed in Step S7. In Step S7, it is possible to etch the insulating film 5 selectively by performing the wet etching using hydrofluoric acid when the insulating film 5 is a silicon oxide film, and by performing the wet etching using hot phosphoric acid when the insulating film 5 is a silicon nitride film.

Figure 22:
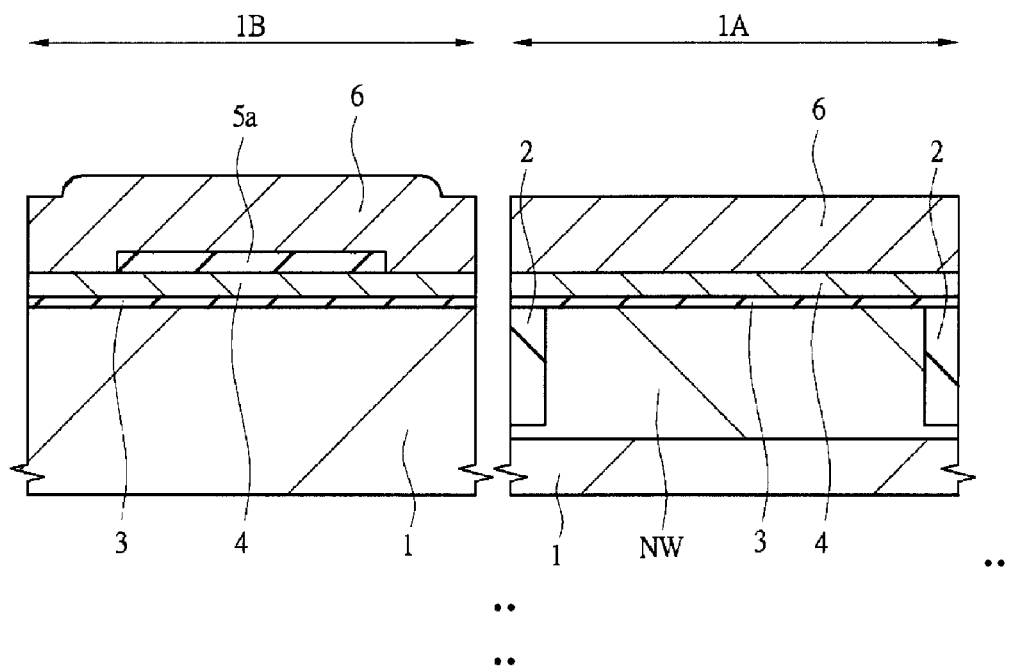
FIG. 22 is a relevant portion cross-sectional view in the manufacturing step of a semiconductor device succeeding the step of FIG. 19.
Figure 23:
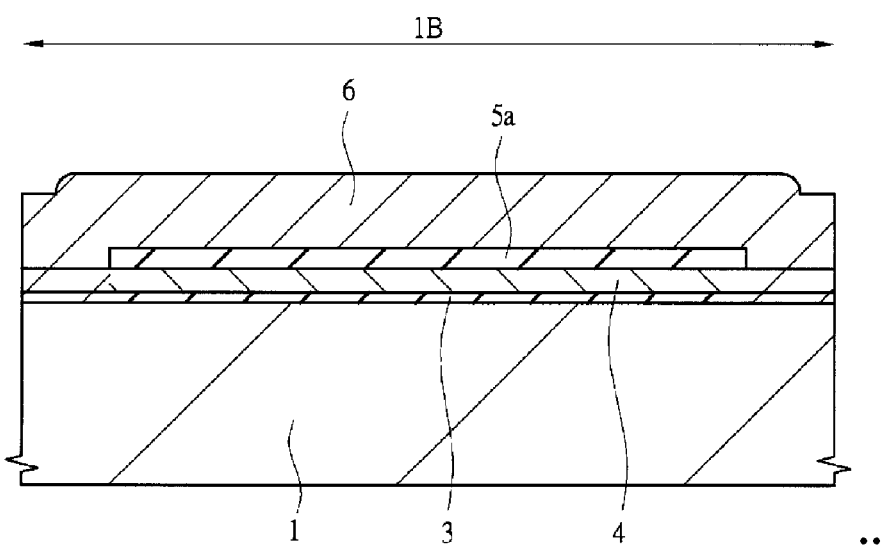
FIG. 23 is a relevant portion cross-sectional view in the same manufacturing step of a semiconductor device as the step of FIG. 22.

Next, as shown in FIG. 22 and FIG. 23, the common first silicon film 6 is formed (deposited) over the major surface (whole major surface) of the semiconductor substrate 1, that is, over the first metal film 4 (Step S8 of FIG. 6). Note that, while the first silicon film 6 is formed directly on the first metal film 4 in the MISFET formation region 1A, the first silicon film 6 is formed over the first metal film 4 so as to cover the second laminate insulating film 5a in the resistance element formation region 1B.

The first silicon film 6 includes a polycrystalline silicon film (poly-silicon film) and can be formed by the use of a CVD method or the like. The thickness (deposition film thickness) of the first silicon film 6 can be set to approximately 30 to 150 nm, for example. After forming the first silicon film 6 as an amorphous silicon film at the deposition, it is also possible to convert the amorphous silicon film into the polycrystalline silicon film by heat treatment.

The first silicon film 6 is made to have a low resistivity by introducing impurities (e.g., n-type impurity such as phosphor (P) or arsenic (As) or p-type impurity such as boron (B)). The impurities can be introduced during or after the deposition of the first silicon film 6. When the impurities are introduced during the silicon film deposition, it is possible to deposit the first silicon film 6 having the impurities introduced therein by causing deposition gas of the first silicon film 6 to contain doping gas (impurity doping gas). On the other hand, when the impurities are introduced after the deposition of silicon film, it is possible to form the first silicon film 6 having the impurities introduced therein, after having deposited the silicon film without intentionally introducing impurities, by introducing impurities into this silicon film by an ion implantation method or the like. Further, when impurities are introduced after the deposition of silicon film, the impurities can be ion-implanted into the silicon film in the resistance element formation region 1B in a state in which the MISFET formation region 1A is covered by a photo-resist pattern (not shown in the drawings), and the impurities can be ion-implanted into the silicon film in the MISFET formation region 1A in a state in which the resistance element formation region 1B is covered by a photo-resist pattern (not shown in the drawings). In this case, the impurity concentration of the first silicon film 6 can be made different between the MISFET formation region 1A and the resistance element formation region 1B, and it is possible to make the conduction type and the impurity concentration of the first silicon film 6 in the MISFET formation region 1A suitable for the gate electrode GE to be formed later and to make the conduction type and the impurity concentration of the silicon film in the resistance element formation region 1B suitable for the silicon film pattern SP of the resistance element RST to be formed later. In this case, the impurity concentration becomes different between the silicon film pattern SP and the first gate silicon film 6b of the gate electrode GE in the manufactured semiconductor device.

Figure 24:
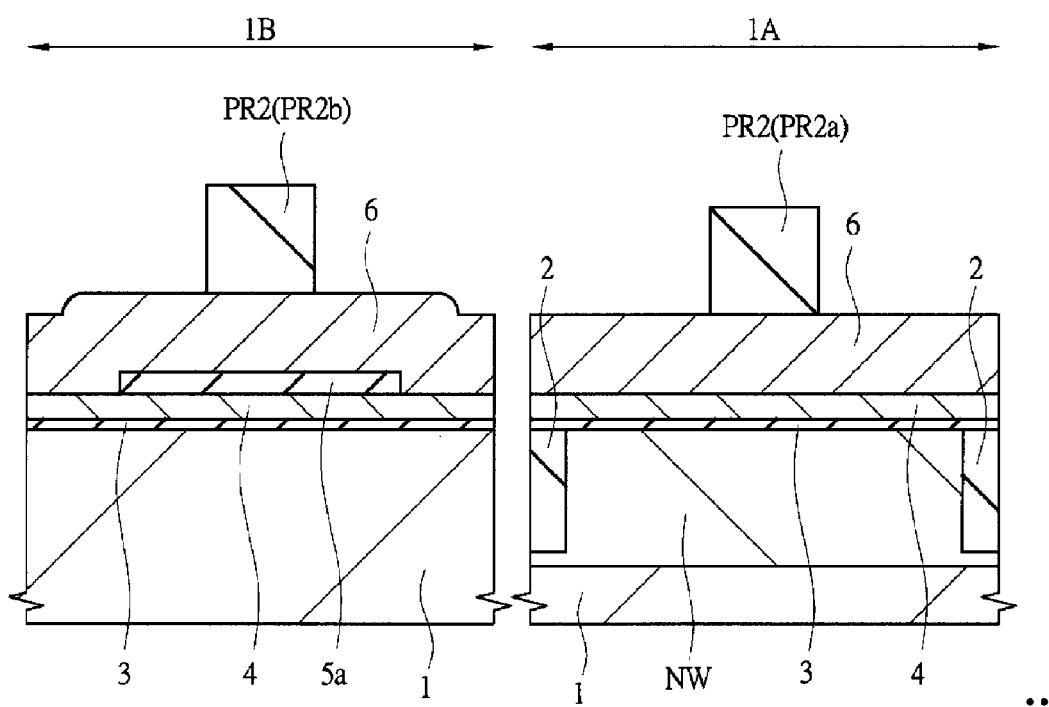
FIG. 24 is a relevant portion cross-sectional view in the manufacturing step of a semiconductor device succeeding the step of FIG. 22.
Figure 25:
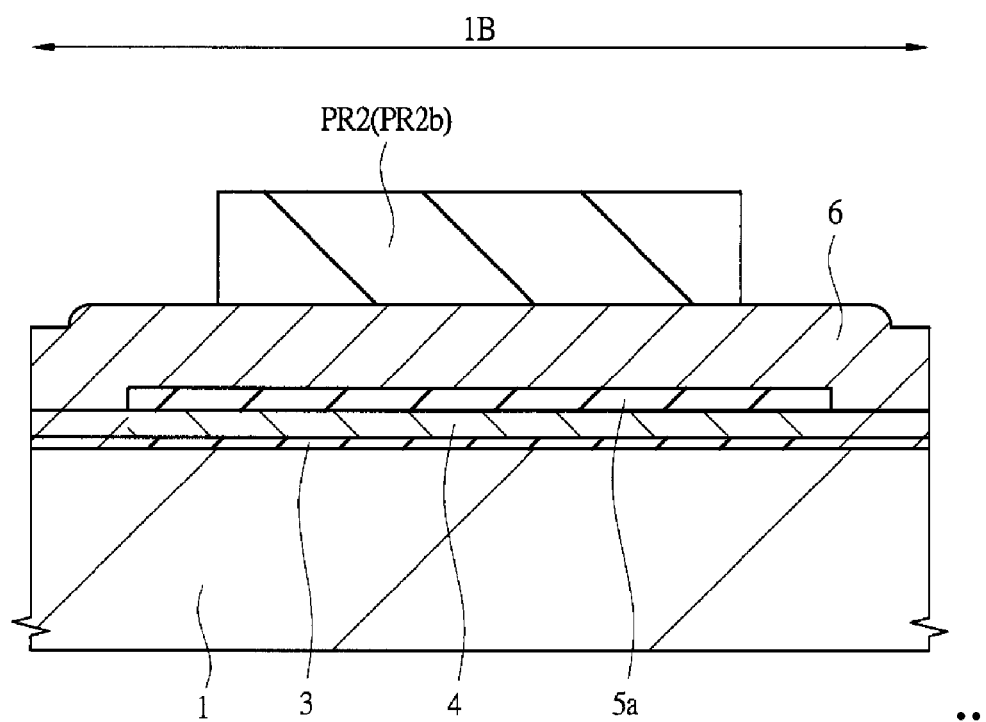
FIG. 25 is a relevant portion cross-sectional view in the same manufacturing step of a semiconductor device as the step of FIG. 24, and shows the cross-section along the line 25-25 in FIG. 26.
Figure 26:
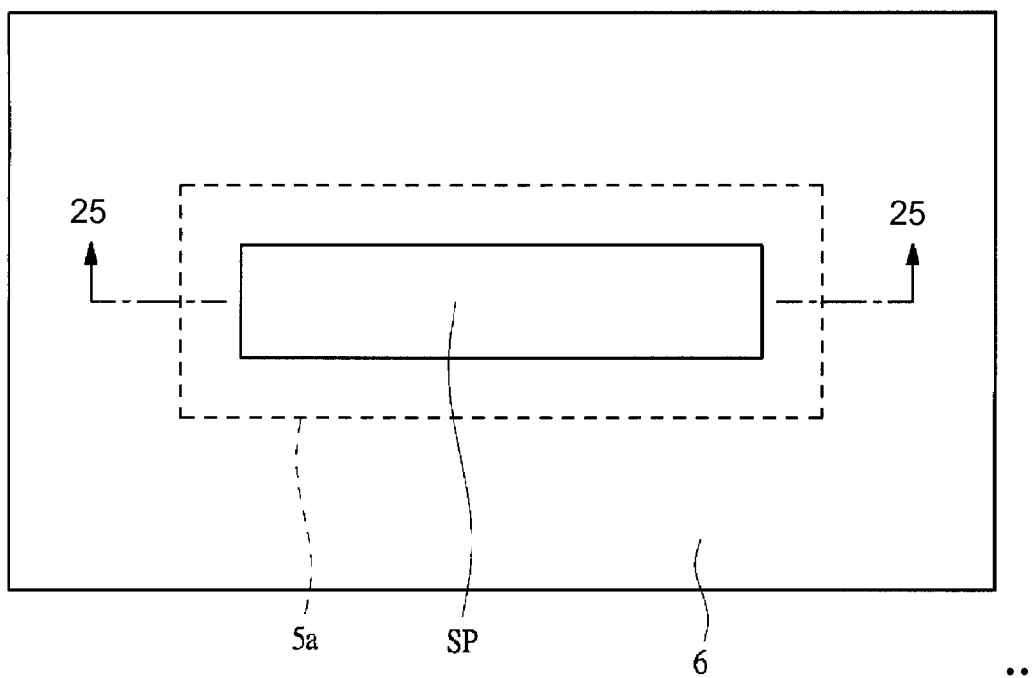
FIG. 26 is a relevant portion cross-sectional view in the same manufacturing step of a semiconductor device as the step of FIG. 24.

Next, as shown in FIG. 24 and FIG. 25, a photo-resist pattern (resist pattern) PR2 is formed over the first silicon film 6 as a resist pattern (etching mask layer) by the use of a photolithography technique. This photo-resist pattern PR2 is formed in a region where the gate electrode GE is to be formed in the MISFET formation region 1A and a region where the silicon film pattern SP is to be formed in the resistance element formation region 1B. Here, in the photo-resist pattern PR2, the photo-resist pattern PR2 formed in the region where the gate electrode GE is to be formed in the MISFET formation region 1A is provided with symbol PR2a and called a photo-resist pattern PR2a, and the photo-resist pattern PR2 formed in the region where the silicon film pattern SP is to be formed in the resistance element formation region 1B is provided with symbol PR2b and called a photo-resist pattern PR2b. Accordingly, the photo-resist pattern PR2 has (includes) the photo-resist pattern (first, or gate-side, resist pattern portion) PR2a and the photo-resist pattern (second, or resistor-side, resist pattern portion) PR2b, which are formed simultaneously. FIG. 26 is a plan view of the resistance element formation region 1B in the same step as the step of FIG. 24 and FIG. 25, and shows a planar layout of the photo-resist pattern PR2a and shows the second laminate insulating film 5a located under the first silicon film 6 by dotted lines. The cross-sectional view along the 25-25 line in FIG. 26 corresponds to FIG. 25.

As apparent from FIG. 26, in the resistance element formation region 1B, the photo-resist pattern PR2b is formed so as to be included within the insulating film 5a in the planar view (not to protrude from the insulating film 5a). This is performed so that the silicon film pattern SP to be formed later is included within the insulating film 5a in the planar view as in FIG. 31 to be described below.

Figure 27:
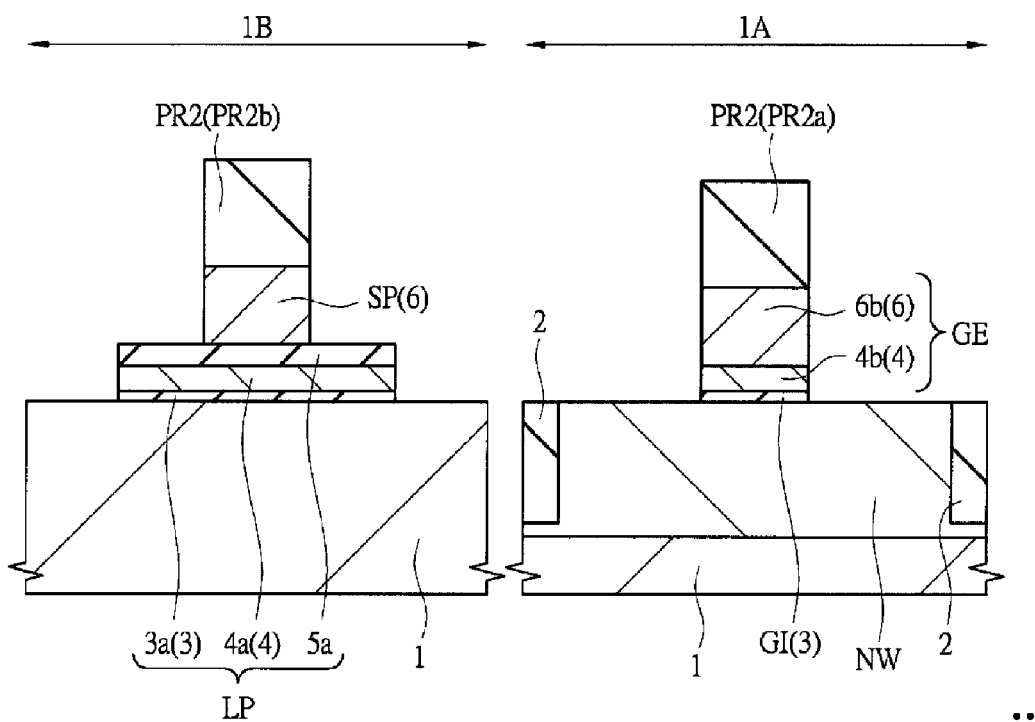
FIG. 27 is a relevant portion cross-sectional view in the manufacturing step of a semiconductor device succeeding the step of FIG. 24.
Figure 28:
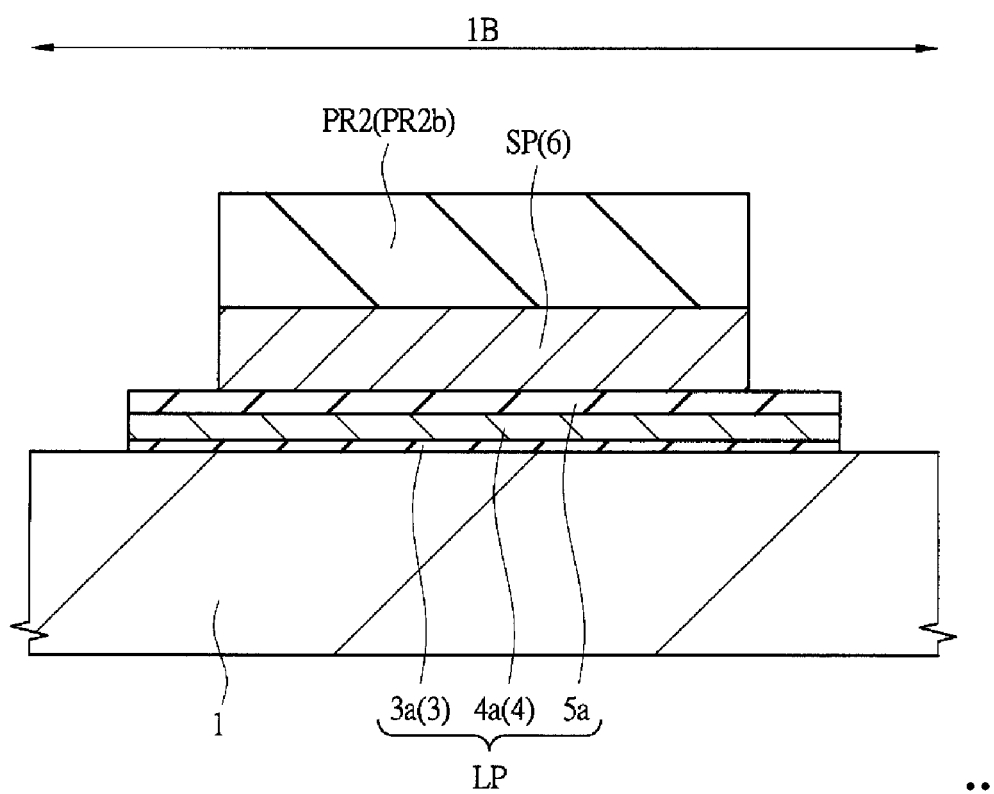
FIG. 28 is a relevant portion cross-sectional view in the same manufacturing step of a semiconductor device as the step of FIG. 27.

Next, as shown in FIG. 27 and FIG. 28, the first silicon film 6 and the first metal film 4 are etched (preferably dry-etched) sequentially by the use of the photo-resist pattern PR2 as an etching mask (Step S9 of FIG. 6). In the etching step of this Step S9, for the etching of the first silicon film 6, it is possible to use dry etching using fluorine based gas or the like, for example, and, for the etching of the first metal film 4, while depending on the material of the first metal film 4, it is possible to use the dry etching using $Cl_2$ gas, HBr gas or the like when the first metal film 4 is a titanium nitride film, for example.

In the etching step of Step S9, the laminated film of the first silicon film 6 and the first metal film 4 is etched and patterned by the use of the photo-resist pattern PR2a as an etching mask in the MISFET formation region 1A, and thereby the gate electrode GE including the first metal film 4 and the first silicon film 6 over the first metal film 4 is formed. The gate electrode GE is formed by patterning the laminated film of the first metal film 4 and the first silicon film 6 and has a planar pattern (planar shape) similar to the gate-side photo-resist pattern PR2a. That is, by the etching step of Step S9, the first silicon film 6 and the first metal film 4 are removed in a portion which is not covered by the gate-side photo-resist pattern PR2a in the MISFET formation region 1A, and the first silicon film 6 and the first metal film 4 remain under the gate-side photo-resist pattern PR2a to form the gate electrode GE. The first silicon film 6 and the first metal film 4 remaining under the gate-side photo-resist pattern PR2a to form the gate electrode GE become the first gate silicon film 6b and the first gate metal film 4b, respectively. That is, the gate electrode GE includes the first gate metal film 4b and the first gate silicon film 6b over the first gate metal film 4b, and the first gate metal film 4b and the first gate silicon film 6b are the patterned first metal film 4 and first silicon film 6, respectively.

In the resistance element formation region 1B, in the etching step of Step S9, the first silicon film 6 is etched and removed in a portion which is not covered by the resistor-side photo-resist pattern PR2b and successively the first metal film 4 which is exposed by the removal of the first silicon film 6 is etched and removed. However, the first metal film 4 and the first insulating film 3 are not etched and remain in a portion which is located under the second laminate insulating film 5a, since the second laminate insulating film 5a functions as an etching stopper film (etching mask film). That is, in the etching step of Step S9, first the first silicon film 6 is etched under an etching condition in which the first silicon film 6 is etched more easily than the second laminate insulating film 5a and the surface of the first metal film 4 is exposed, and then the first metal film 4 is etched under an etching condition in which the first metal film 4 is etched more easily than the second laminate insulating film 5a. Accordingly, in the etching step of Step S9, in the resistance element formation region 1B, the first silicon film 6 is removed in the portion which is not covered by the resistor-side photo-resist pattern PR2b and the first silicon film 6 remains to form the silicon film pattern SP under the resistor-side photo-resist pattern PR2b, and also the first metal film 4 is removed in a portion which is not covered by the second laminate insulating film 5a and the first metal film 4 is not removed and remains in the portion which is covered by the second laminate insulating film 5a to form the laminated pattern LP.

In the resistance element formation region 1B, the first metal film 4 remaining under the second laminate insulating film 5a becomes the first laminate metal film 4a. That is, the first laminate metal film 4a includes the first metal film 4 remaining in the lower portion of the second laminate insulating film 5a. The silicon film pattern SP is the patterned first silicon film 6 and includes the first silicon film 6 remaining under the resistor-side photo-resist pattern PR2b, and has a planar pattern (planar shape) similar to the resistor-side photo-resist pattern PR2b.

In the MISFET formation region 1A, the first insulating film 3 in a portion which is not covered by the gate electrode GE can be removed by the dry etching performed in Step S9 or wet etching performed after the dry etching. The first insulating film 3 located in the lower portion of the gate electrode GE is not removed by the dry etching performed in Step S9 or the wet etching performed after the dry etching and remains. In the MISFET formation region 1A, the first insulating film 3 remaining under the gate electrode GE becomes the first gate insulating film GI. Accordingly, the gate electrode GE including the first gate metal film 4b and the first gate silicon film 6b over the first gate metal film 4b comes to have a state of being formed over the semiconductor substrate 1 (n-type well NM) on the first gate insulating film GI (i.e., insulating film 3).

In the resistance element formation region 1B, a part of the first insulating film 3 which is not covered by the second laminate insulating film 5a can be removed by the dry etching performed in Step S9 or the wet etching after the dry etching. The first insulating film 3 located under the second laminate insulating film 5a (accordingly, also under the first laminate metal film 4a) is not removed by the dry etching in Step S9 or the wet etching after the dry etching and remains to become the first laminate insulating film 3a. That is, the first laminate insulating film 3a includes the first insulating film 3 remaining under the second laminate insulating film 5a (accordingly, also under the first laminate metal film 4a). Thereby, in the resistance element formation region 1B, the laminated pattern LP is formed by the second laminate insulating film 5a, the first laminate metal film 4a remaining under the second laminate insulating film 5a, and the first laminate insulating film 3a. That is, the laminated pattern LP includes the laminated film of the first laminate insulating film 3a, the first laminate metal film 4a over the first laminate insulating film 3a, and the second laminate insulating film 5a over the first laminate metal film 4a.

In the resistance element formation region 1B, the resistor-side photo-resist pattern PR2b is formed so as to be included within the second laminate insulating film 5a in the planar view, and thereby the silicon film pattern SP formed by the first silicon film 6 remaining under the resistor-side photo-resist pattern PR2b becomes a pattern to be included within the second laminate insulating film 5a in the planar view. Further, the laminated pattern LP is formed by the second laminate insulating film 5a, the first laminate metal film 4a and the first laminate insulating film 3a remaining under the second laminate insulating film 5a, and thereby the laminated pattern LP has a planar shape (and planar size, or collectively, planar footprint) similar to the second laminate insulating film 5a. Accordingly, the silicon film pattern SP comes to have a state of being formed over the semiconductor substrate 1 on the laminated pattern LP.

The first gate insulating film GI in the MISFET formation region 1A and the first laminate insulating film 3a in the resistance element formation region 1B (i.e., insulating film 3a of the laminated pattern LP) are formed from the first insulating film 3 in the same layer. Further, the first gate metal film 4b in the MISFET formation region 1A (i.e., the first gate metal film 4b of the gate electrode GE) and the first laminate metal film 4a in the resistance element formation region 1B (i.e., first laminate metal film 4a of the laminated pattern LP) are formed from the first metal film 4 in the same layer. Further, the first gate silicon film 6b in the MISFET formation region 1A (i.e., first gate silicon film 6b of the gate electrode GE) and the silicon film pattern SP in the resistance element formation region 1B are formed from the first silicon film 6 in the same layer.

Figure 29:
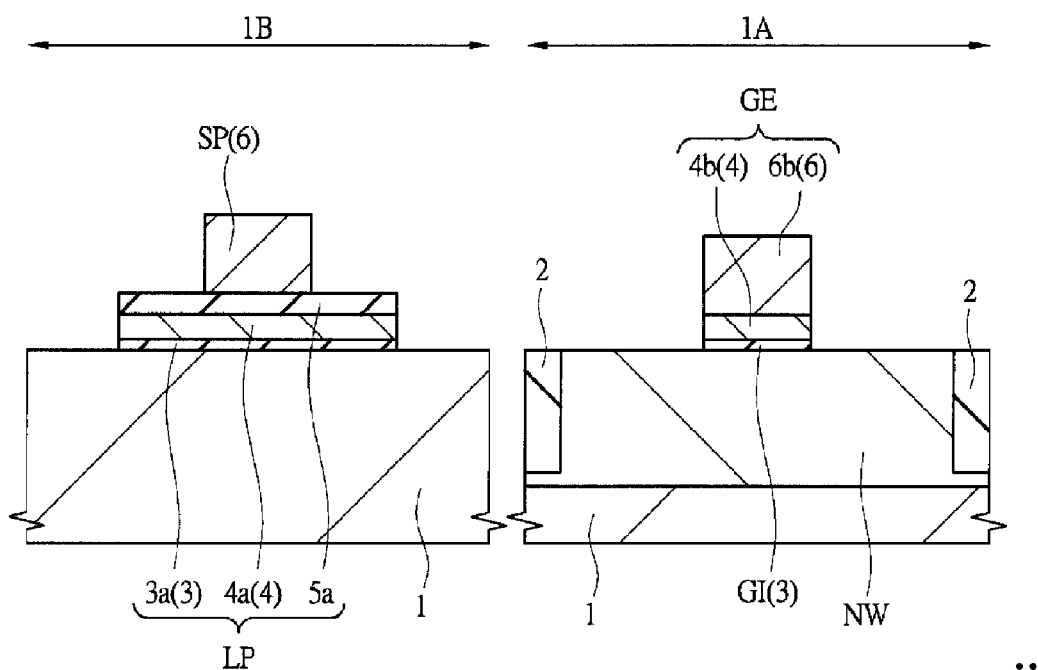
FIG. 29 is a relevant portion cross-sectional view in the manufacturing step of a semiconductor device succeeding the step of FIG. 27.
Figure 30:
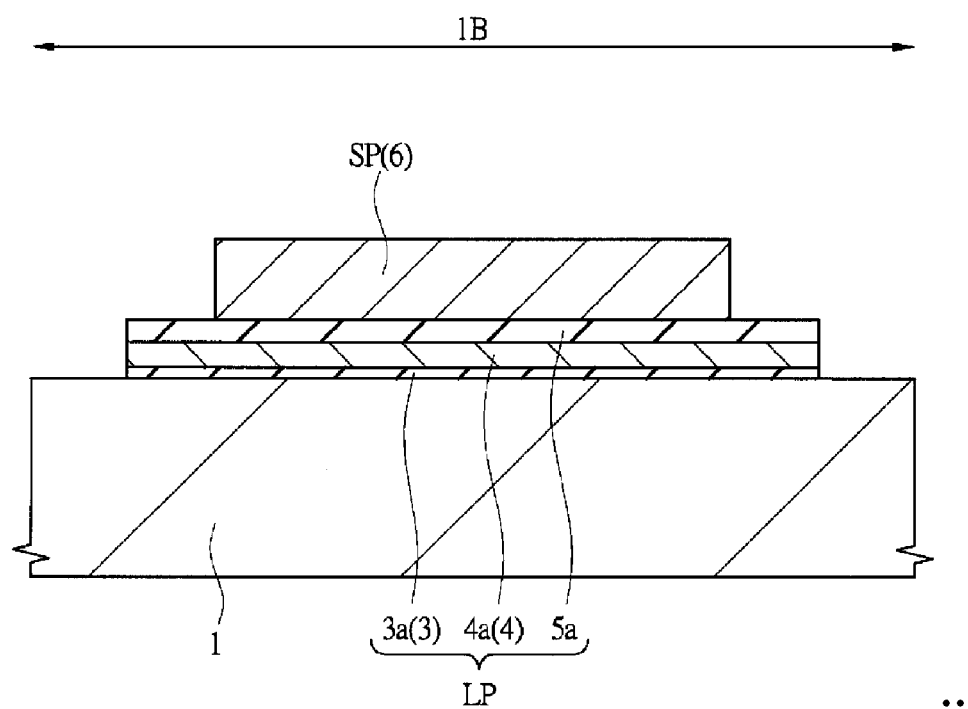
FIG. 30 is a relevant portion cross-sectional view in the same manufacturing step of a semiconductor device as the step of FIG. 29, and shows the cross-section along the line 30-30 in FIG. 31.
Figure 31:
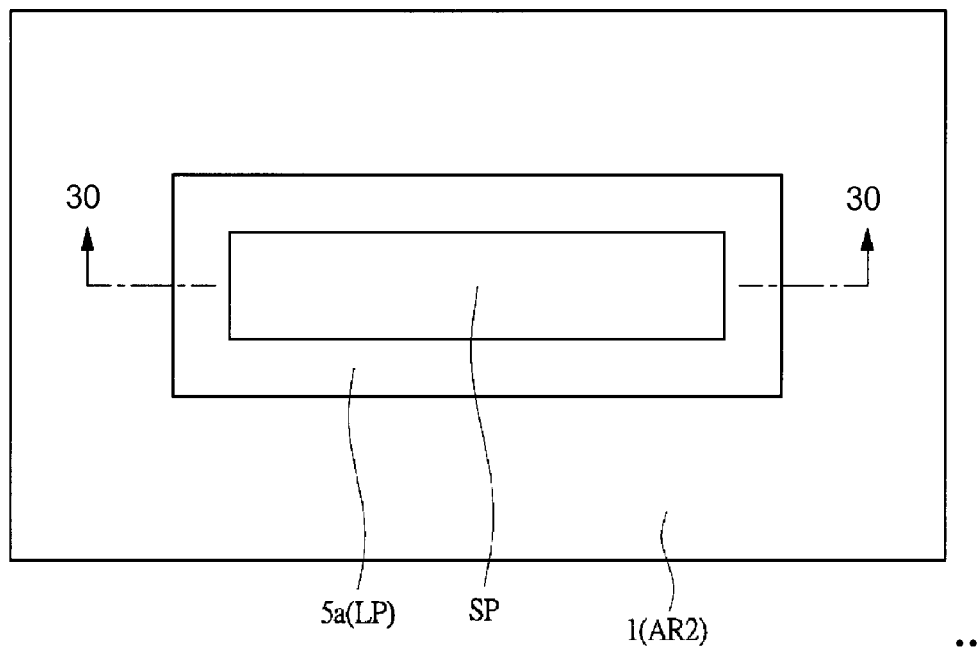
FIG. 31 is a relevant portion plan view in the same manufacturing step of a semiconductor device as the step of FIG. 29.

After the etching step of Step S9, as shown in FIG. 29 and FIG. 30, the photo-resist pattern PR2 is removed. FIG. 31 is a plan view of the resistance element formation region 1B in the same step as the step of FIG. 29 and FIG. 30, and shows a planar layout of the silicon film pattern SP and a planar layout of the second laminate insulating film 5a (i.e., planar layout of the laminated pattern LP). The cross section along the 30-30 line in FIG. 31 corresponds to FIG. 30.

Figure 32:
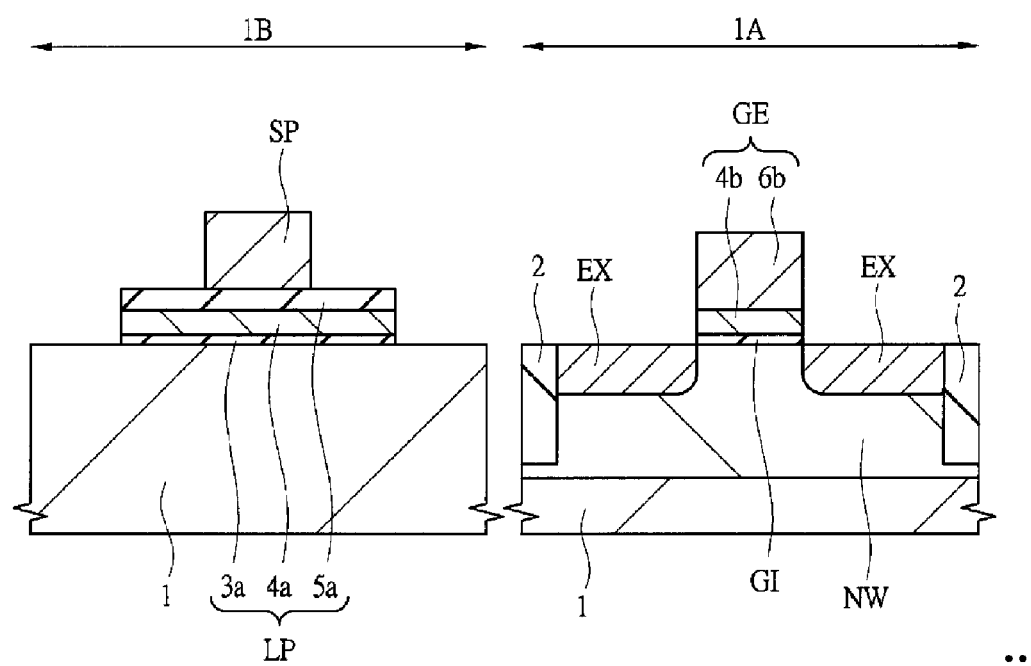
FIG. 32 is a relevant portion cross-sectional view in the manufacturing step of a semiconductor device succeeding the step of FIG. 29.
Figure 33:
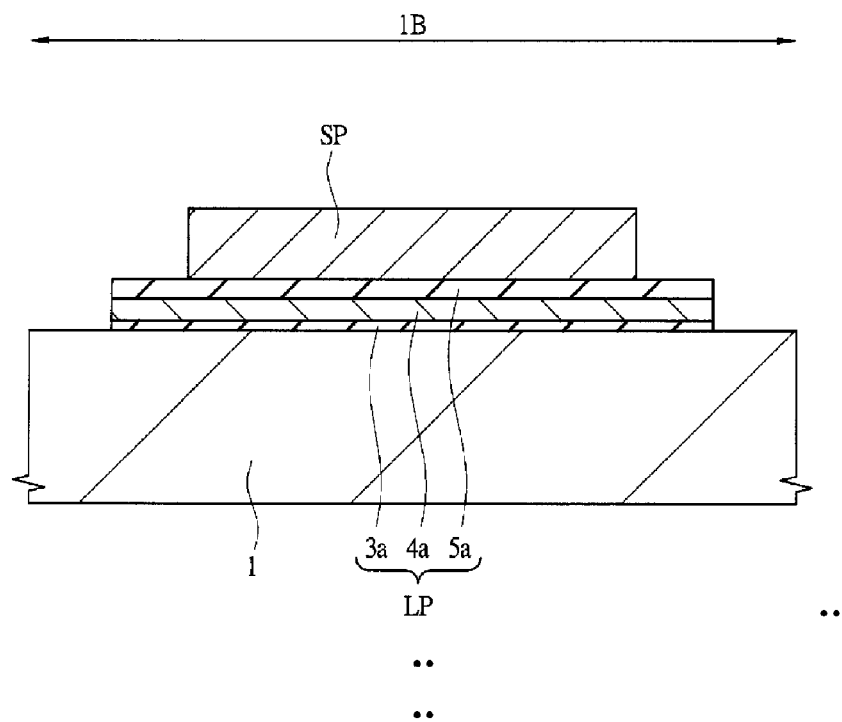
FIG. 33 is a relevant portion cross-sectional view in the same manufacturing step of a semiconductor device as the step of FIG. 32.

Next, as shown in FIG. 32 and FIG. 33, in the MISFET formation region 1A, the p⁻-type semiconductor region (impurity diffusion layer) EX is formed by the ion implantation of p-type impurity such as boron (B) into regions in the n-type well NW on both sides of the gate electrode GE (Step S10 of FIG. 6). In the ion implantation for the formation of this p⁻-type semiconductor region EX, the ion implantation is performed for the semiconductor substrate 1 (n-type well NW) in the MISFET formation region 1A by the use of the gate electrode GE as a mask (ion implantation blocking mask). In the ion implantation for the p⁻-type semiconductor region EX, the ion implantation is blocked by the gate electrode GE and is not performed for a region directly under the gate electrode GE in the n-type well NW. Further, by performing the ion implantation for forming the p⁻-type semiconductor region EX in a state in which a photo-resist pattern (not shown in the drawings) is formed in the resistance element formation region 1B, it is possible to prevent the ion implantation from being performed for the semiconductor substrate 1 and the silicon film pattern SP in the resistance element formation region 1B, in the ion implantation for forming the p⁻-type semiconductor region EX.

Figure 34:
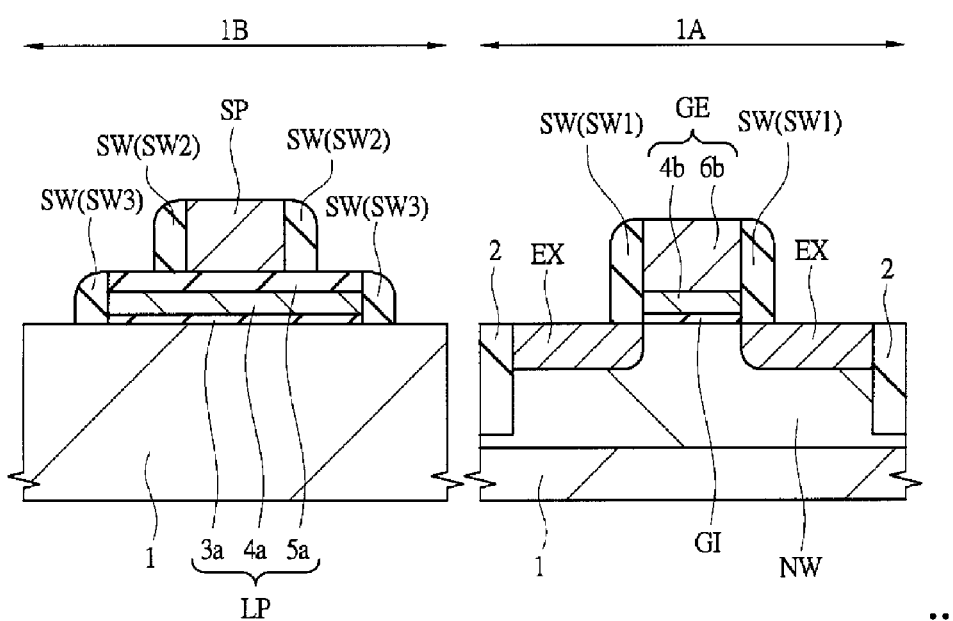
FIG. 34 is a relevant portion cross-sectional view in the manufacturing step of a semiconductor device succeeding the step of FIG. 32.
Figure 35:
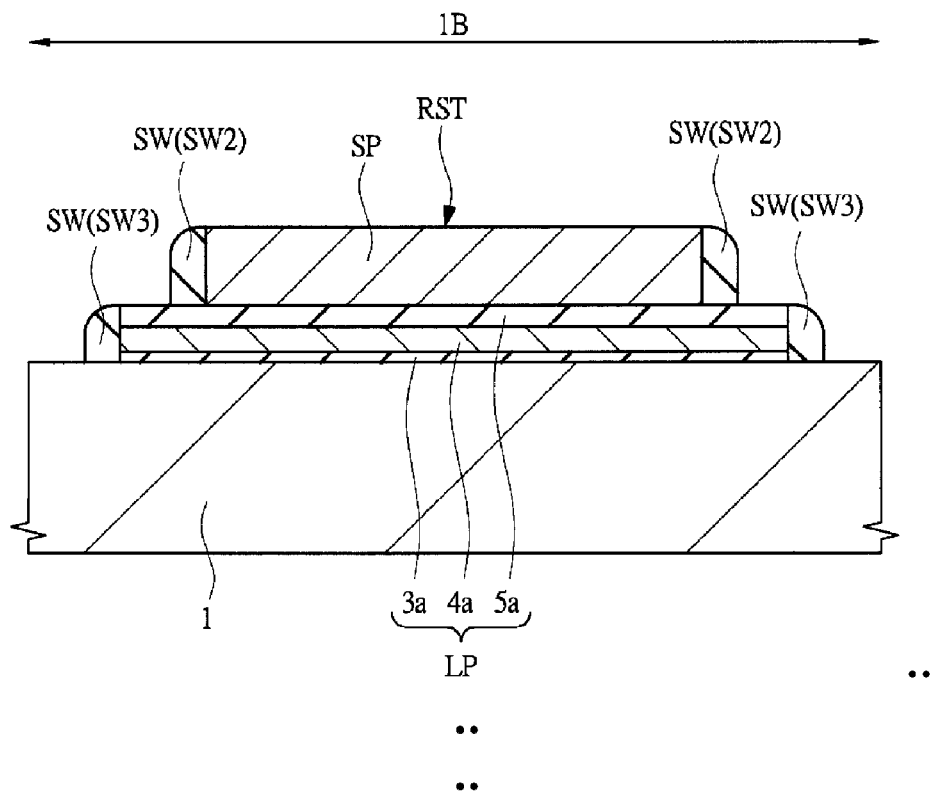
FIG. 35 is a relevant portion cross-sectional view in the same manufacturing step of a semiconductor device as the step of FIG. 34.

Next, as shown in FIG. 34 and FIG. 35, a side wall spacer SW including a silicon oxide film, a silicon nitride film, or a laminated film of these insulating films, for example, is formed over the side wall of the gate electrode GE as a side wall insulating film (insulating film) (Step 11 of FIG. 6). The side wall spacer SW can be formed not only over the side wall of the gate electrode GE but also over the side wall of silicon film pattern SP and over the side wall of the laminated pattern LP. The side wall spacer SW formed over the side wall of the gate electrode GE is called the gate side wall spacer SW1, the side wall spacer SW formed over the side wall of the silicon film pattern SP is called the pattern side wall spacer SW2, and the side wall spacer SW formed over the side wall of the laminated pattern LP is called laminate the side wall spacer SW3.

For example, the side wall spacer SW can be formed by the process of, for example, depositing a silicon oxide film, a silicon nitride film, or a laminated film of these films over the semiconductor substrate 1 so as to cover the gate electrode GE, the silicon film pattern SP, and the laminated pattern LP and providing anisotropic etching by an RIE (Reactive Ion Etching) method or the like for this silicon oxide film, silicon nitride film, or laminated film of these films. In this case, the side wall spacer SW includes the silicon oxide film, the silicon nitride film or the laminated film of these films remaining over the side wall of the gate electrode GE, the side wall of the silicon film pattern SP, and the side wall of the laminated pattern LP.

Figure 36:
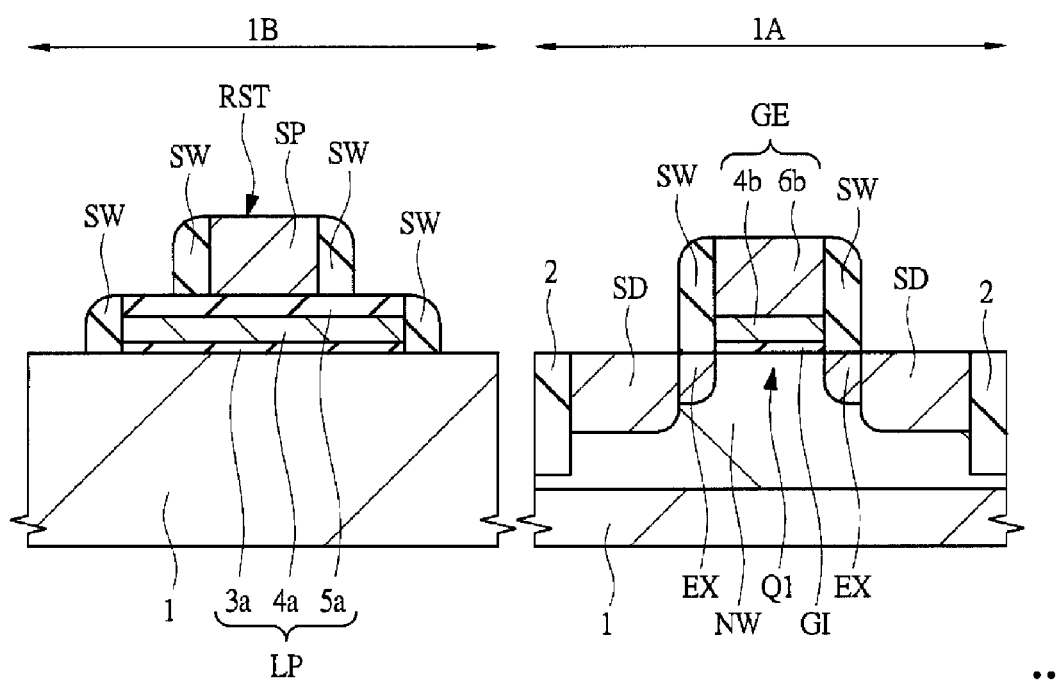
FIG. 36 is a relevant portion cross-sectional view in the manufacturing step of a semiconductor device succeeding the step of FIG. 34.
Figure 37:
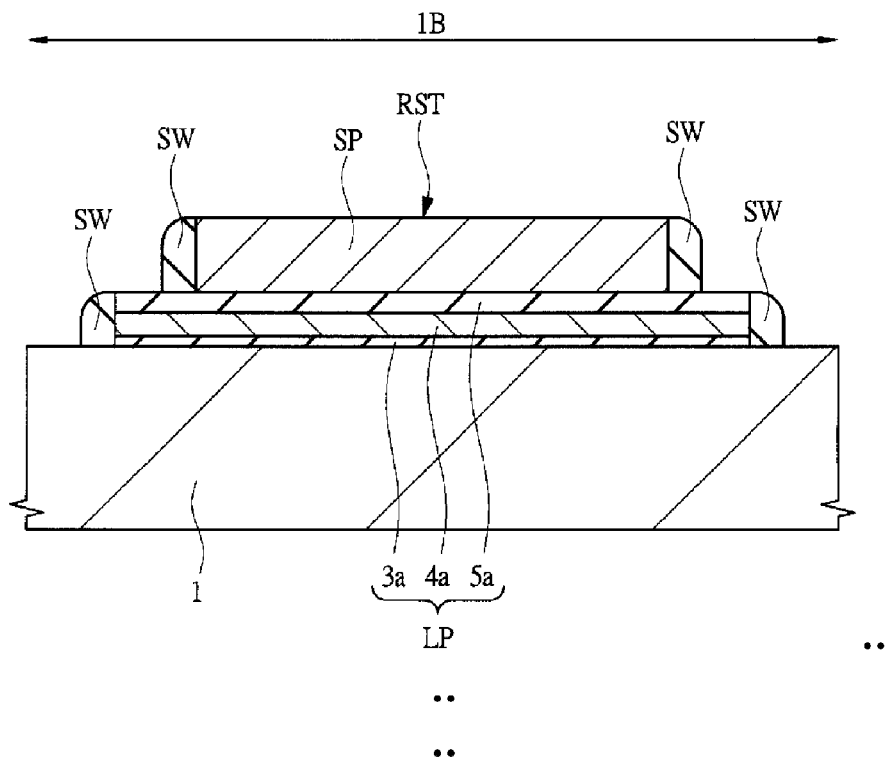
FIG. 37 is a relevant portion cross-sectional view in the same manufacturing step of a semiconductor device as the step of FIG. 36.

Next, as shown in FIG. 36 and FIG. 37, in the MISFET formation region 1A, the $p^+$-type semiconductor region SD (source-drain) is formed by ion implantation of p-type impurity such as boron (B) for regions in the n-type well NW on both sides of the gate electrode GE and the gate side wall spacers SW1 (Step S12 of FIG. 6). In the ion implantation for this $p^+$-type semiconductor region SD, the ion implantation is performed for the semiconductor substrate 1 (n-type well NW) of the MISFET formation region 1A by the use of the gate electrode GE and the gate side wall spacers SW1 over the side walls thereof as a mask (ion implantation blocking mask). Accordingly, the $p^-$-type semiconductor region EX is formed in alignment with the gate electrode GE (self alignment) and the $p^+$-type semiconductor region SD is formed in alignment with the gate side wall spacer SW1 over the side wall of the gate electrode GE (self alignment). In the ion implantation for the $p^+$-type semiconductor region SD, the ion implantation is blocked by the gate electrode GE and the gate side wall spacers SW1 over the side walls thereof and is not performed for a region in the n-type well NW directly under the gate electrode GE and the gate side wall spacers SW1 over the side walls thereof. Further, by performing the ion implantation for the $p^+$-type semiconductor region SD in a state in which a photo-resist pattern (not shown in the drawings) is formed in the resistance element formation region 1B, it is possible to prevent the ion implantation from being performed for the semiconductor substrate 1 and the silicon film pattern SP in the resistance element formation region 1B, when the ion implantation is performed for the $p^+$-type semiconductor region SD.

After the ion implantation, annealing processing (activation annealing or heat treatment) is performed for activation of the introduced impurities (Step S13 of FIG. 6). Thereby, it is possible to activate the impurities introduced in the $p^-$-type semiconductor region EX, the $p^+$-type semiconductor region SD, the silicon film pattern SP, the first gate silicon film 6b of the gate electrode GE, and the like.

In this manner, a structure shown in FIG. 36 and FIG. 37 is obtained, and the p-channel type MISFET Q1 is formed in the MISFET formation region 1A as a field effect transistor and the resistance element RST including the silicon film pattern SP is formed in the resistance element formation region 1B.

The $p^+$-type semiconductor region SD has a higher impurity concentration and a larger junction depth than the $p^-$-type semiconductor region EX. Thereby, a p-type semiconductor region (impurity diffusion layer) functioning as the source or the drain of the p-channel type MISFET Q1 is formed by the $p^+$-type semiconductor region SD and the $p^-$-type semiconductor region EX. Accordingly, the source-drain region of the p-channel type MISFET Q1 has the LDD (Lightly Doped Drain) structure. The $p^+$-type semiconductor region SD is considered to be a semiconductor region (source-drain region) for the source or the drain of the p-channel type MISFET Q1. The gate electrode GE functions as a gate electrode of the MISFET Q1.

Further, while the case that the MISFET Q1 formed in the MISFET formation region 1A is the p-channel type MISFET is explained here, it is also possible to change the MISFET Q1 formed in the MISFET formation region 1A to an n-channel type MISFET by reversing the conduction type of each region. Further, it is also possible to form both of the p-channel type MISFET and the n-channel type MISFET, that is, the CMISFET, in the MISFET formation region 1A.

Figure 38:
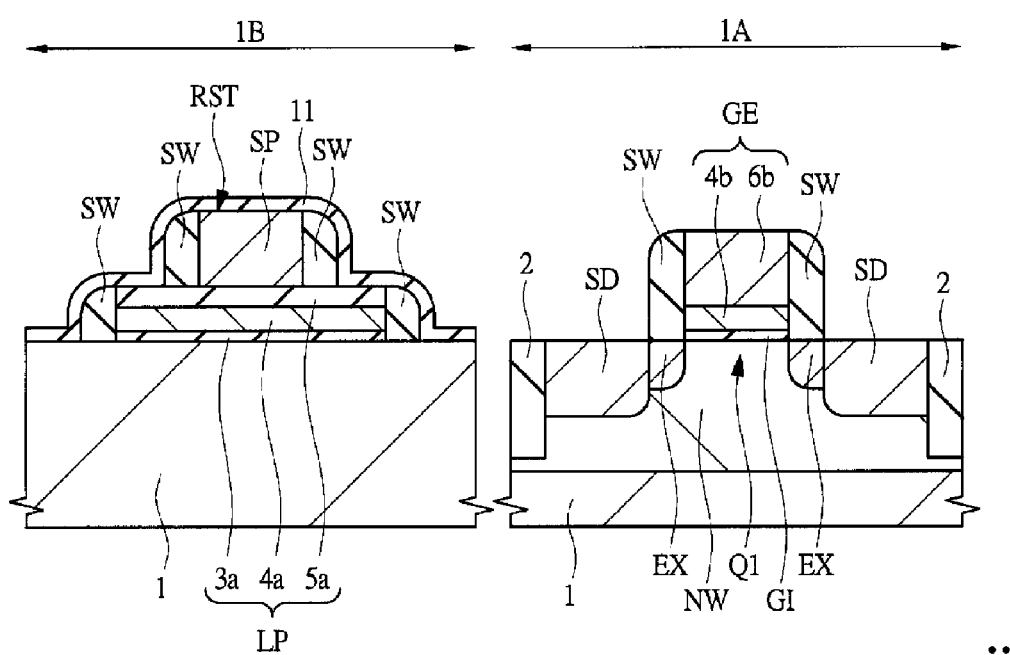
FIG. 38 is a relevant portion cross-sectional view in the manufacturing step of a semiconductor device succeeding the step of FIG. 36.
Figure 39:
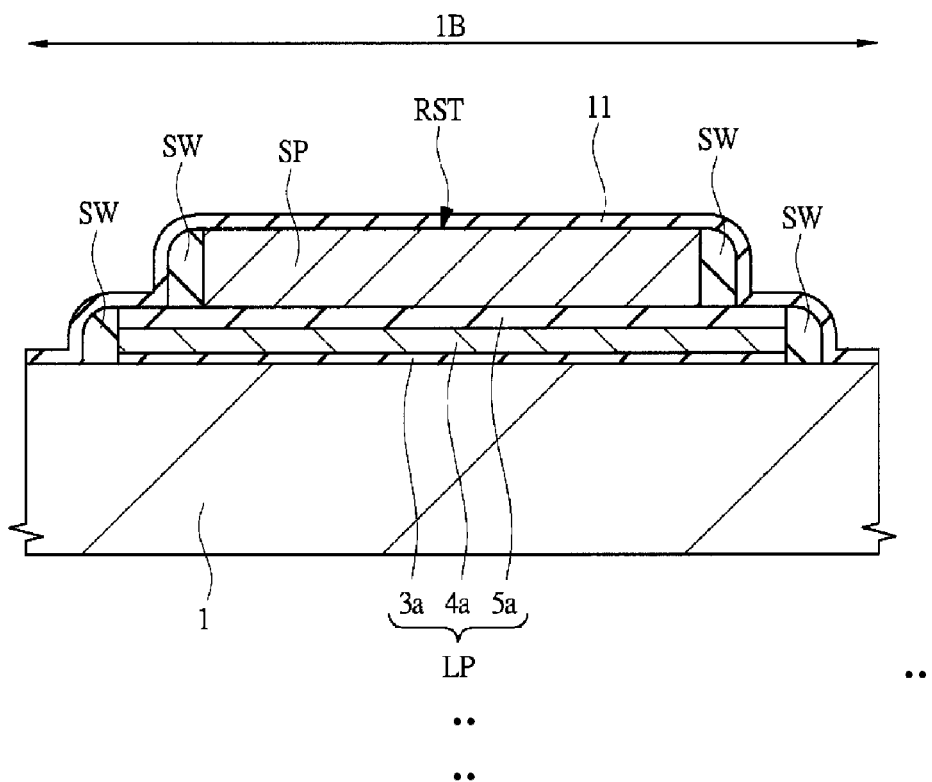
FIG. 39 is a relevant portion cross-sectional view in the same manufacturing step of a semiconductor device as the step of FIG. 38.

Next, the third insulating film 11 including a silicon oxide film or the like is formed over the whole major surface of the semiconductor substrate 1, and then this third insulating film 11 is provided with patterning by the use of a photolithography technique and an etching technique. Thereby, as shown in FIG. 38 and FIG. 39, the silicon surface is exposed in a region where the metal silicide layer 13 is to be formed and the third insulating film 11 is formed having a pattern so as to cover a silicon surface where the metal silicide layer 13 is not to be formed. Specifically, the upper surface of the $p^+$-type semiconductor region SD and the upper surface of the gate electrode GE (first gate silicon film 6b thereof) are not covered by the third insulating film 11 to be exposed in the MISFET formation region 1A, and, on the other hand, the upper surface of the silicon film pattern SP is covered by the third insulating film 11 in the resistance element formation region 1B.

Here, FIG. 38 and FIG. 39 show a case in which the third insulating film 11 is formed in both regions of the MISFET formation region 1A and the resistance element formation region 1B and then the third insulating film 11 is removed in the MISFET formation region 1A and the third insulating film 11 is left in the resistance element formation region 1B, and, in this case, the whole silicon film pattern SP is covered by the third insulating film 11 and thereby the metal silicide layer 13 is not formed over the upper surface of the silicon film pattern SP even when the Salicide process to be described below is performed.

Meanwhile, when the metal silicide layer 13 is desired to be formed in a region which is to be connected with the plug PG in the upper surface of the silicon film pattern SP as in above FIG. 5, the third insulating film 11 is formed in both regions of the MISFET formation region 1A and the resistance element formation region 1B and then not only the third insulating film 11 over the MISFET formation region 1A but also the third insulating film 11 over the vicinity of both ends of the silicon film pattern SP in the resistance element formation region 1B are removed. Thereby, in addition to the upper surface of the $p^+$-type semiconductor region SD and the upper surface of the gate electrode GE (first gate silicon film 6b thereof) in the MISFET formation region 1A, the upper surface in the vicinity of both ends of the silicon film pattern SP in the resistance element formation region 1B is exposed, and thereby it is possible to form the metal silicide layer 13 over the exposed surfaces by the Salicide process to be described below. Note that, in this case, a region other than the region to which the plug PG is to be connected later in the upper surface of the silicon film pattern SP is covered by the third insulating film 11 and thereby the metal silicide layer 13 is prevented from being formed in this covered region by the Salicide process to be described below.

Figure 40:
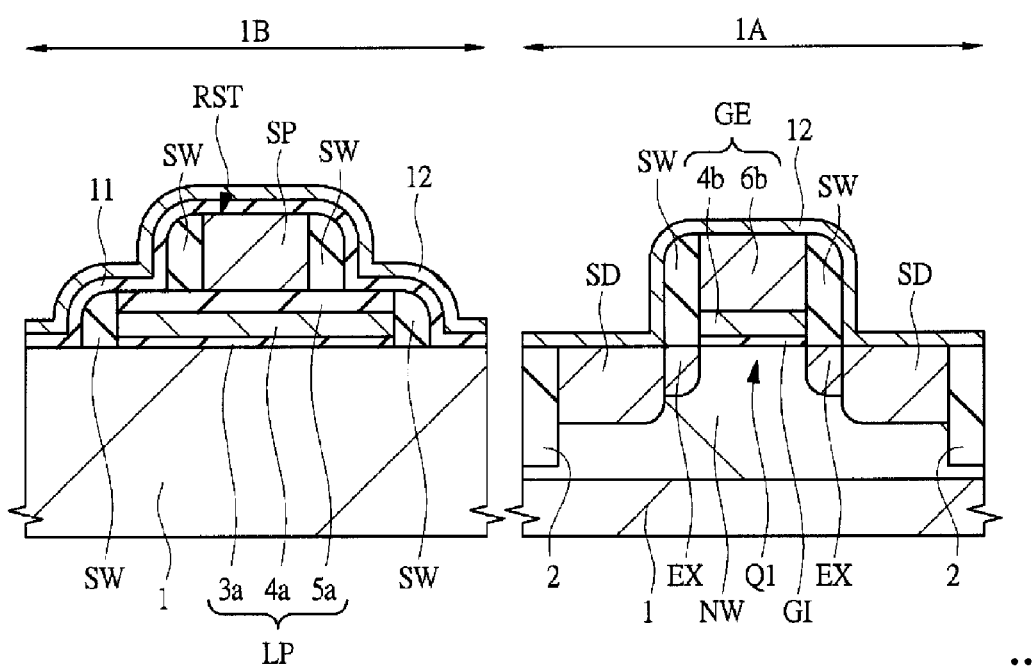
FIG. 40 is a relevant portion cross-sectional view in the manufacturing step of a semiconductor device succeeding the step of FIG. 38.
Figure 41:
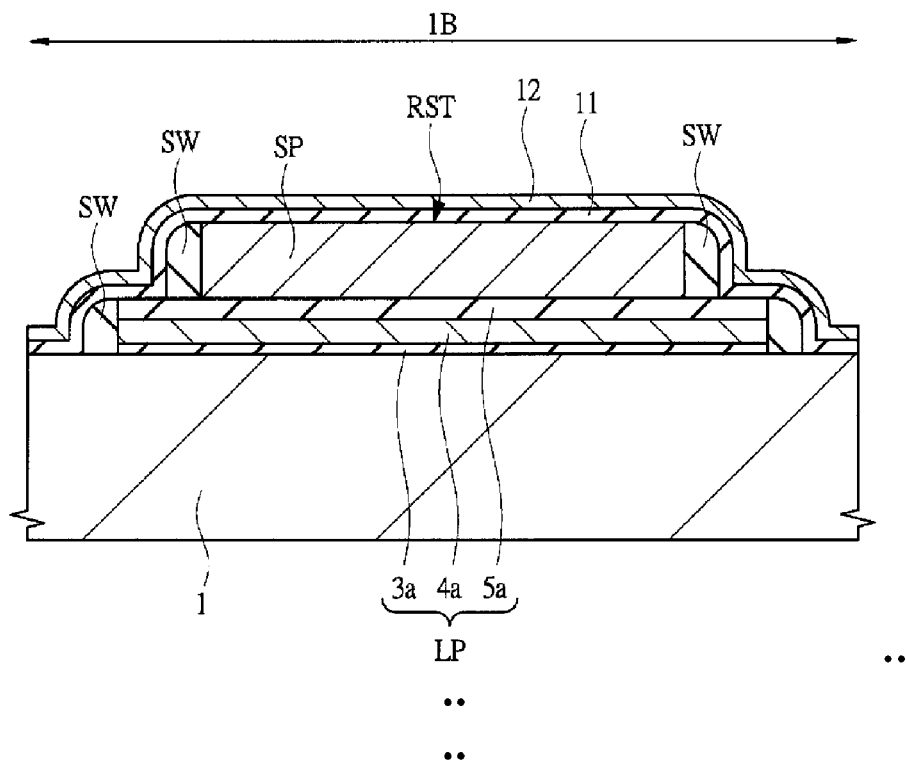
FIG. 41 is a relevant portion cross-sectional view in the same manufacturing step of a semiconductor device as the step of FIG. 40.

Next, the low resistance metal silicide layer 13 is formed by the Salicide process. Specifically, as shown in FIG. 40 and FIG. 41, a metal film 12 such as a cobalt (Co) film and a nickel (Ni) film is formed (deposited) by a sputtering method or the like over the major surface (whole major surface) of the semiconductor substrate 1 so as to cover the gate electrode GE, the p$^+$-type semiconductor region SD, and the silicon film pattern SP. Then, by heat treatment, the metal film 12 and the first gate silicon film 6b of the gate electrode GE are caused to react with each other and each upper portion of the p$^+$-type semiconductor region SD and the metal film 12 are caused to react with each other. Thereby, the metal silicide layers 13 are formed over the surfaces of the first gate silicon film 6b in the gate electrode GE and over the surfaces (upper surfaces) of the p$^+$-type semiconductor region SD, respectively. When the metal film 12 is a cobalt film, the metal silicide layer 13 is a cobalt silicide layer, and, when the metal film 12 is a nickel film, the metal silicide layer 13 is a nickel silicide layer. When a nickel-platinum alloy film is used as the metal film 12, the metal silicide layer 13 becomes a nickel-platinum silicide layer.

Figure 42:
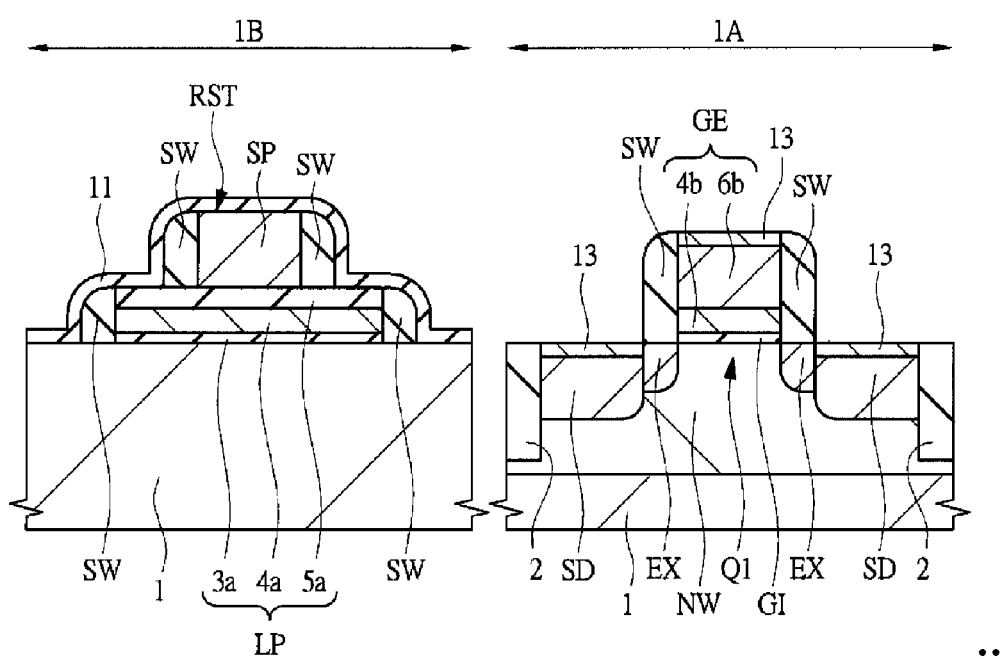
FIG. 42 is a relevant portion cross-sectional view in the manufacturing step of a semiconductor device succeeding the step of FIG. 40.
Figure 43:
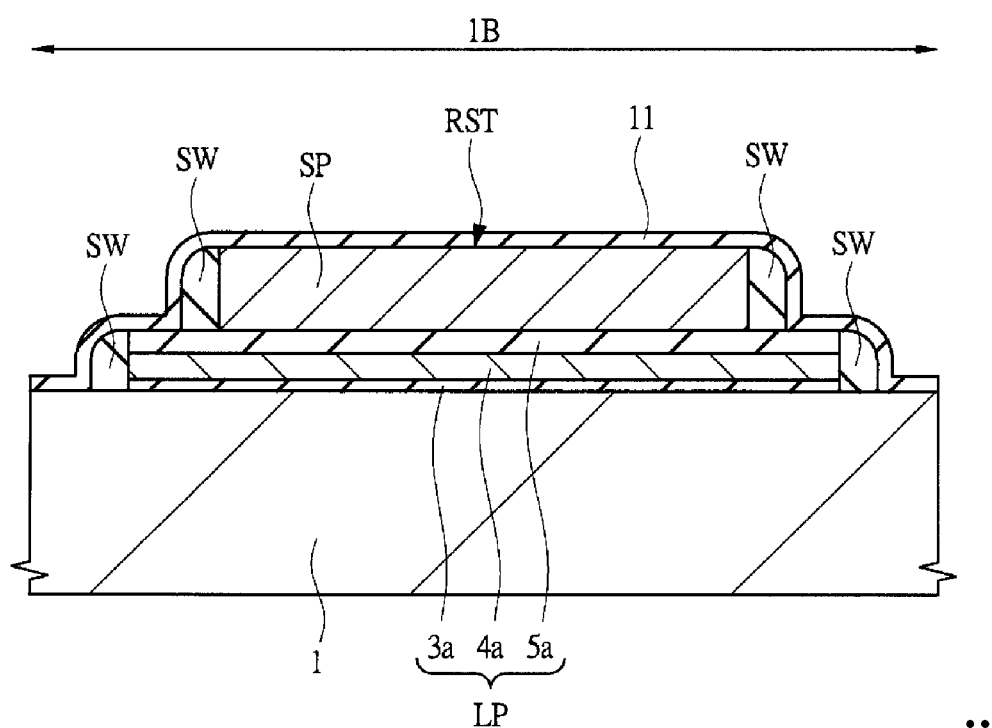
FIG. 43 is a relevant portion cross-sectional view in the same manufacturing step of a semiconductor device as the step of FIG. 42.

After that, the metal film which has not reacted is removed. FIG. 42 and FIG. 43 show a step after the removal of the unreacted metal film 12. By forming the metal silicide layer 13, it is possible to realize a lower resistance in a diffusion resistance and a contact resistance for each of the gate electrode GE (first gate silicon film 6b thereof) and the p$^+$-type semiconductor region SD.

Further, when the third insulating film 11 is removed also over the vicinity of both ends of the silicon film pattern SP in the resistance element formation region 1B, the metal silicide layer 13 is formed also over the upper surface of the vicinity of both ends of the silicon film pattern SP, and this case corresponds to above FIG. 5. In this case, it is possible to realize a lower resistance in the contact resistance for the silicon film pattern SP. Note that, in the surface (upper surface) of the silicon film pattern SP, a portion covered by the third insulating film 11 does not contact the metal film 12 and so the metal silicide layer 13 is not formed there.

Figure 44:
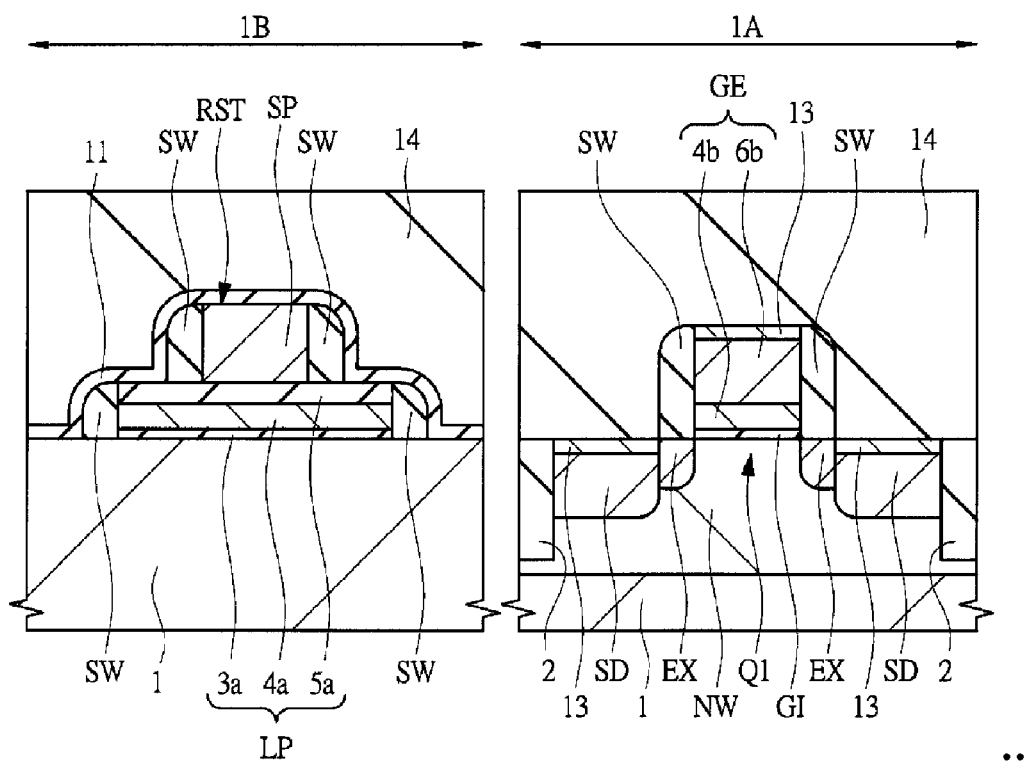
FIG. 44 is a relevant portion cross-sectional view in the manufacturing step of a semiconductor device succeeding the step of FIG. 42.
Figure 45:
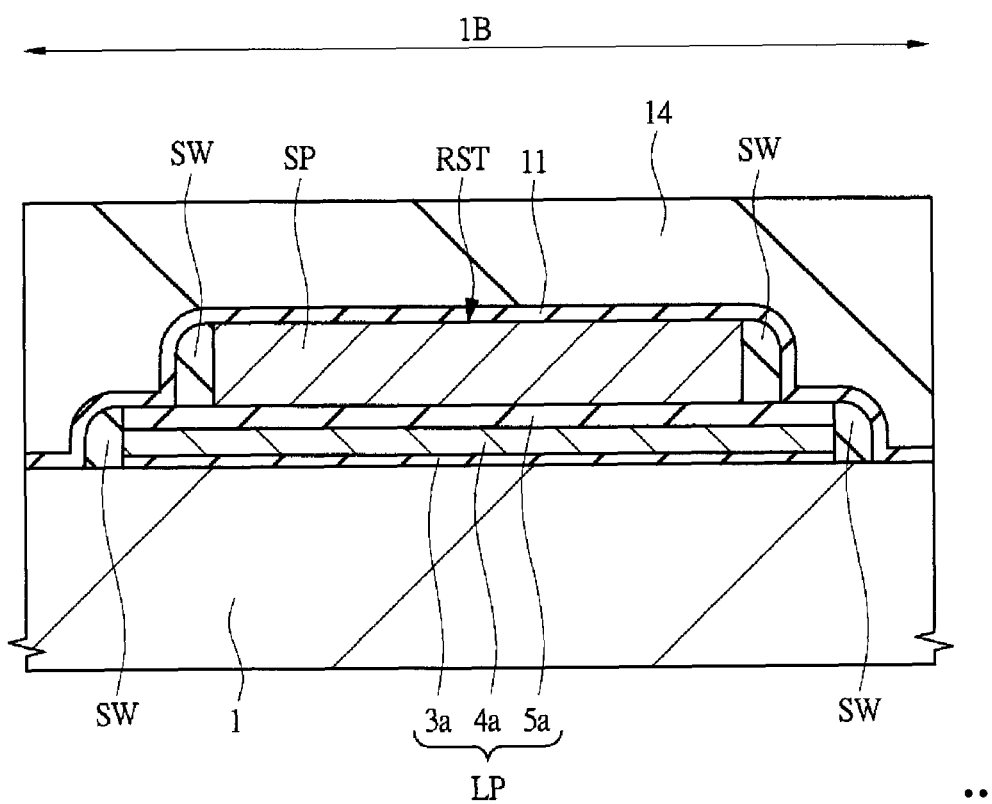
FIG. 45 is a relevant portion cross-sectional view in the same manufacturing step of a semiconductor device as the step of FIG. 44.

Next, as shown in FIG. 44 and FIG. 45, the first interlayer insulating film 14 is formed over the semiconductor substrate 1. That is, the first interlayer insulating film 14 is formed over the semiconductor substrate 1 so as to cover the gate electrode GE, the silicon film pattern SP, and the side wall spacer SW. The first interlayer insulating film 14 includes a single film of a silicon oxide film, a laminated film of a silicon nitride film and a silicon oxide film thicker than the silicon nitride film (silicon nitride film on the lower side), or the like, for example. After the formation of the first interlayer insulating film 14, the upper surface of the first interlayer insulating film 14 is made flat by CMP processing or the like.

Figure 46:
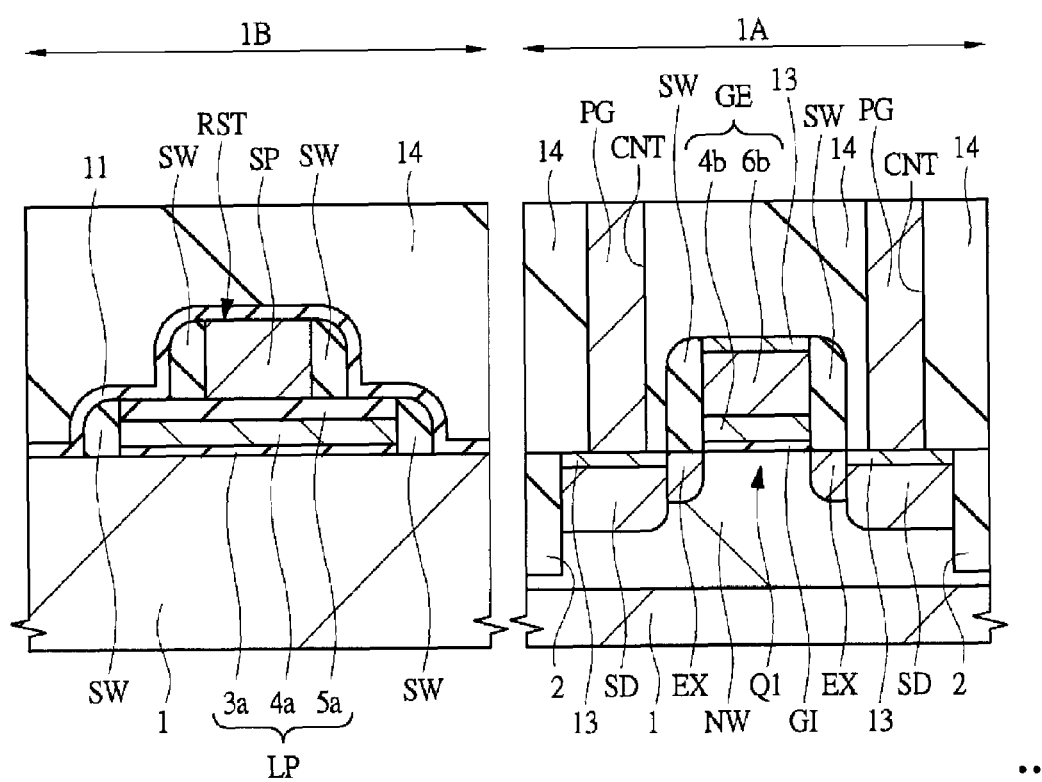
FIG. 46 is a relevant portion cross-sectional view in the manufacturing step of a semiconductor device succeeding the step of FIG. 44.
Figure 47:
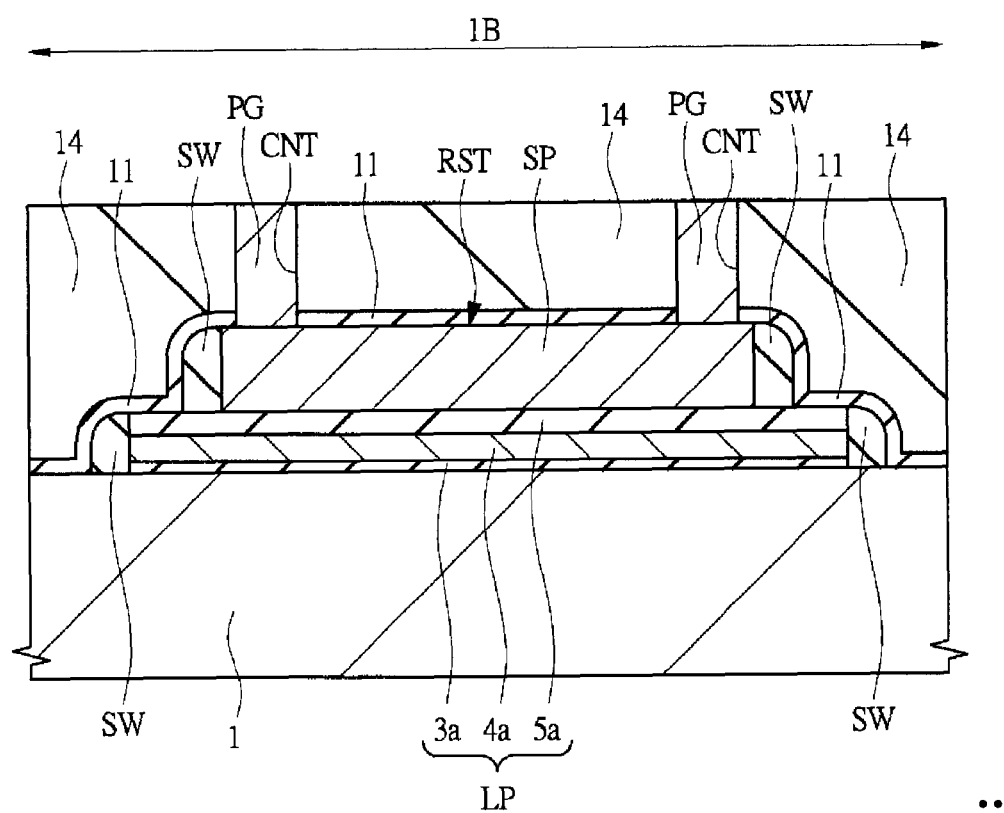
FIG. 47 is a relevant portion cross-sectional view in the same manufacturing step of a semiconductor device as the step of FIG. 46.

Next, the contact hole (opening portion, through-hole, or connection hole) CNT is formed in the first interlayer insulating film 14 as shown in FIG. 46 and FIG. 47, by dry etching of the first interlayer insulating film 14 using a photo-resist pattern (not shown in the drawings) which is formed over the first interlayer insulating film 14 by the use of a photolithography method, as an etching mask. At this time, when the contact hole CNT is formed in a region where the third insulating film 11 is formed, the contact hole CNT is formed in the first interlayer insulating film 14 and the third insulating film 11.

Next, the conductive plug PG including tungsten (W) or the like is formed within the contact hole CNT as a conductor portion (connection conductor portion).

For the formation of the plug PG, a barrier conductor film is formed over the first interlayer insulating film 14 including the inside (bottom portion and side wall) of the contact hole CNT, for example. This barrier conductor film can be including a titanium film, a titanium nitride film or a laminated film of these films, for example. Then, a major conductor film including a tungsten film or the like is formed over this barrier conductor film so as to fill the contact hole CNT, and the plug PG can be formed after excess major conductor film and the barrier conductor film over the first interlayer insulating film 14 have been removed by a CMP method or an etch-back method. Note that, in FIG. 46 and FIG. 47, the barrier conductor film and the major conductor film configuring the plug PG are shown in one unit for simplification of the drawings.

The contact hole CNT and the plug PG embedded therein are formed over each of the p$^+$-type semiconductor region SD, the gate electrode GE, the silicon film pattern SP, and the like. In the bottom portion of the contact hole CNT, for example, a part of the p-type semiconductor region SD (metal silicide layer 13 over the surface thereof), a part of the gate electrode GE (metal silicide layer 13 over the surface thereof), and a part of the silicon film pattern SP (metal silicide layer 13 when the metal silicide layer 13 is formed over the surface thereof) are exposed.

Next, the wiring (wiring layer) M1 is formed over the first interlayer insulating film 14 in which the plug PG is embedded. A case in which this wiring M1 is formed by the use of the damascene technique (here, single damascene technique) will be explained.

Figure 48:
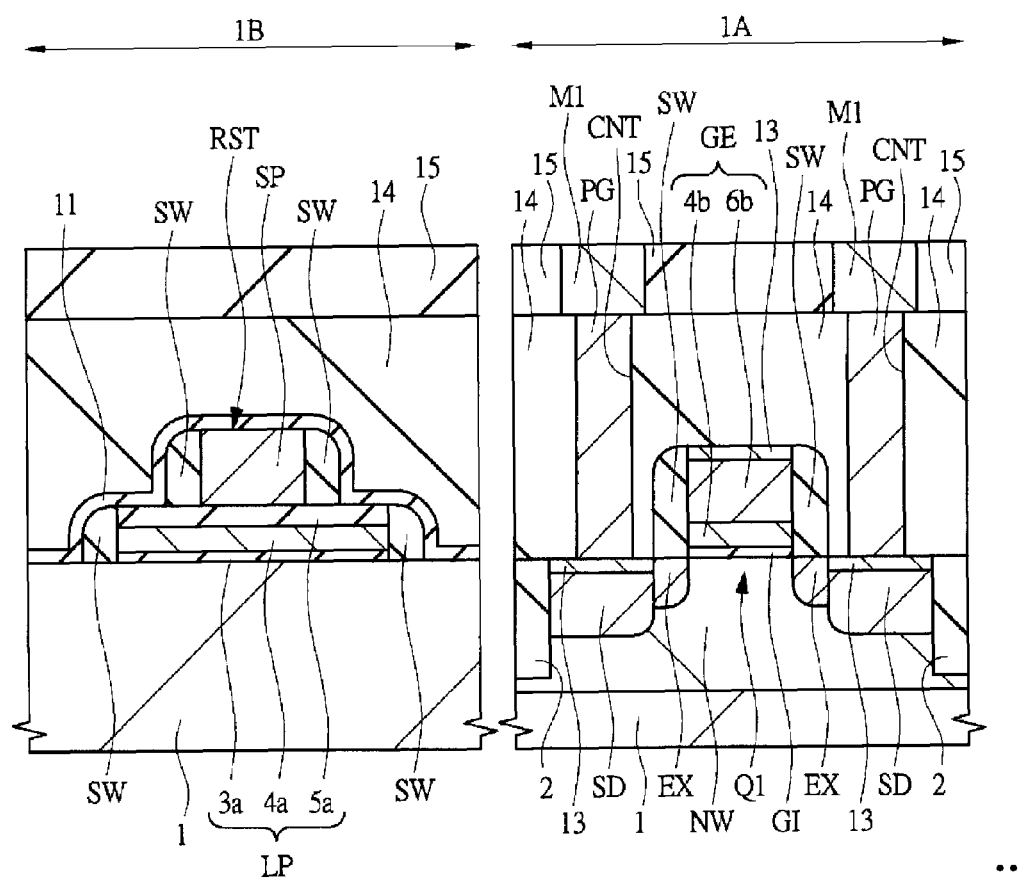
FIG. 48 is a relevant portion cross-sectional view in the manufacturing step of a semiconductor device succeeding the step of FIG. 46.
Figure 49:
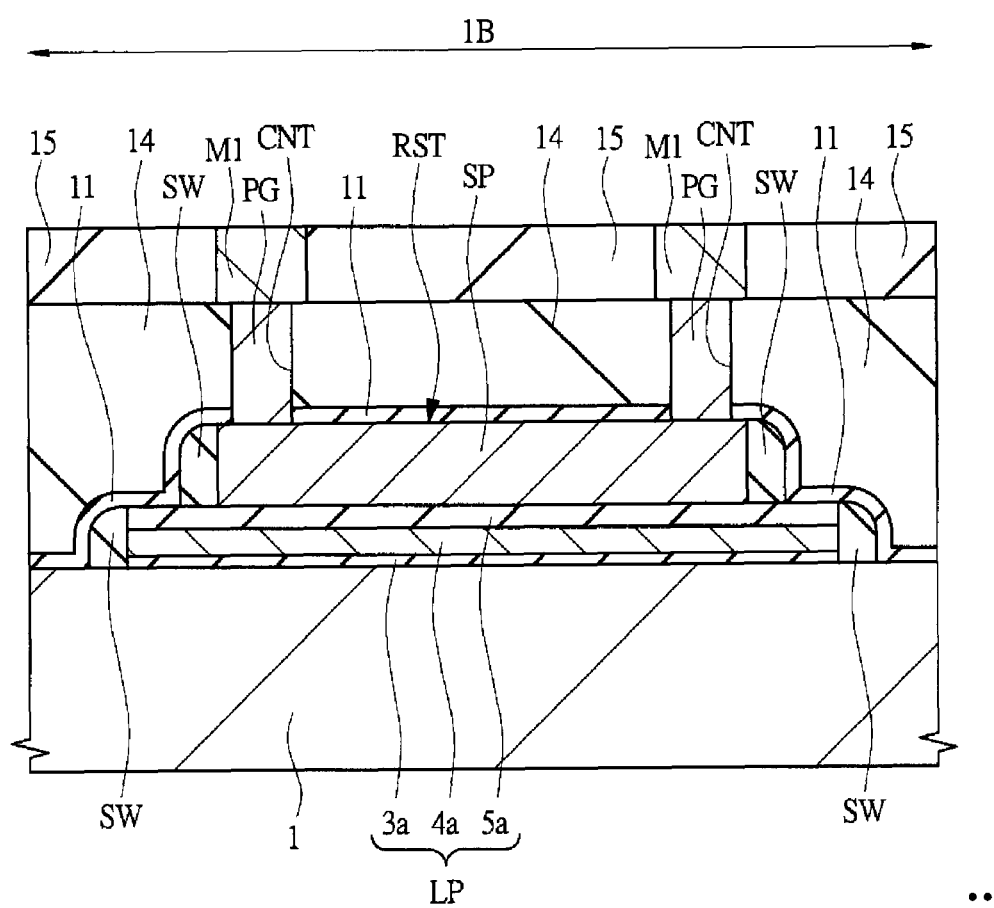
FIG. 49 is a relevant portion cross-sectional view in the same manufacturing step of a semiconductor device as the step of FIG. 48.

As shown in FIG. 48 and FIG. 49, first, a fifth insulating film (second interlayer insulating film) 15 is formed over the first interlayer insulating film 14 in which the plug PG is embedded, and then the wiring trench (trench in which the wiring M1 is to be embedded in the fifth insulating film 15) is formed in this second interlayer insulating film 15 by the use of a photolithography technique and a dry etching technique. Then, a barrier conductor film (e.g., titanium nitride film, tantalum film, a tantalum nitride film, or the like) is formed over the major surface of the semiconductor substrate 1 (i.e., over the second interlayer insulating film 15 including the bottom portion and the side wall of the wiring trench), and successively a copper seed layer is formed over the barrier conductor film by the use of a CVD method, a sputtering method, or the like, and further a copper plated film is formed over the seed layer by the use of an electrolytic plating method or the like and the inside of the wiring trench is filled with the copper plating film. After that, the copper plating film, the seed layer, and the barrier metal in regions other than the inside of the wiring trench are removed by a CMP method and the wiring M1 mainly including copper is formed as the major conducting material for the first layer. The wiring M1 has the state of being embedded in the wiring trench of the second interlayer insulating film 15. Note that, in FIG. 48 and FIG. 49, the copper plating film, the seed layer, and the barrier conductor film configuring the wiring M1 are shown in one unit for simplification of the drawings. The wiring M1 is connected electrically to each of the p-type semiconductor region SD and the gate electrode GE in the MISFET formation region 1A, the silicon film pattern SP in the resistance element formation region 1B, and the like via the plug PG.

While, after that, wirings for the second layer and succeeding layers are formed by the dual damascene method or the like, illustration and explanation thereof are omitted here. Further, each of the wiring M1 and the wirings for the upper layers can be formed also by patterning of a wiring conductor film, not limited to the damascene wiring (embedded wiring), and can be configured also with a tungsten wiring or an aluminum wiring, for example.

Next, major features and effects of the present embodiment will be explained in more detail.

The semiconductor device of the present embodiment is a semiconductor device including a MISFET to which a metal gate electrode is applied as a gate electrode. That is, the semiconductor device of the present embodiment includes the gate electrode GE formed over the major surface of the semiconductor substrate 1 on the first gate insulating film GI, and this gate electrode GE includes the first gate metal film 4b located over the first gate insulating film GI and is a so-called metal gate electrode. Accordingly, the depletion phenomenon of the gate electrode can be suppressed and the parasitic capacitance is eliminated, and it is possible also to realize miniaturization (thinner gate insulating film) of a MISFET element.

Further, in the present embodiment, a high dielectric constant gate insulating film is used as the first gate insulating film GI of the MISFET Q1. Accordingly, it is possible to increase a physical thickness of the first gate insulating film GI compared to a case of using a silicon oxide film as the first gate insulating film and it is possible to reduce leak current.

Further, in the present embodiment, the gate electrode GE includes the first gate metal film 4b over the first gate insulating film GI and the first gate silicon film 6b over the first gate metal film 4b. If the whole gate electrode GE is formed by a metal film only, the thickness of the metal film needs to be increased and there could arise a problem that the metal film is easily peeled off and a problem that the substrate is damaged by over etching when the metal film is patterned (gate formation). On the other hand, in the present embodiment, since the gate electrode GE is formed by the laminated film of the first gate metal film 4b and the first gate silicon film 6b and the thickness of the first gate metal film 4b can be reduced compared to a case of forming the gate electrode GE using a metal film only, it is possible to reduce the above problems (problem that the metal film is easily peeled off and problem that the substrate is damaged by over etching when the metal film is patterned). Further, when the gate electrode GE is formed by the first gate metal film 4b and the first gate silicon film 6b over the first gate metal film 4b, it is possible to follow the existing forming method and process of the poly-silicon gate electrode (gate electrode including poly-silicon), and it is also possible to obtain priority in fine pattern formation capability, production cost, and yield.

Then, the semiconductor device of the present embodiment is a semiconductor device including a MISFET and a resistance element, and the MISFET including the gate electrode GE having a laminated structure of the first gate metal film 4b and the first gate silicon film 6b and the resistance element RST are formed over the same semiconductor substrate 1 (mixed mounting).

When the laminated film of the first metal film 4 and the first silicon film 6 is patterned to form both the gate electrode GE and the resistance element, it may be difficult to form a resistance element having a desired resistance value, since the resistance value of the resistance element is defined not by the first silicon film 6 but by the resistance value of the first metal film 4. That is, when the resistance of the whole resistance element is formed solely by the laminated film of the first metal film 4 and the first silicon film 6, a poly-silicon resistance element is not realized.

In the present embodiment, while the gate electrode GE includes the laminated structure of the first metal film 4 and the first silicon film 6, the resistance element RST is configured to be a resistance element (so-called poly-silicon resistance element) formed by the silicon film pattern SP (patterned silicon film). By forming the resistance element RST by the silicon film pattern SP, the resistance value of the resistance element RST depends on the impurity concentration and the pattern shape of the silicon film pattern SP, and so it becomes possible to form a resistance element RST having a desired resistance value.

Further, in the present embodiment, the silicon film pattern SP configuring the resistance element RST is formed by the first silicon film 6 in the same layer as the first gate silicon film 6b of the gate electrode GE. Accordingly, it is possible to form the resistance element RST including the silicon film pattern SP while suppressing the number of manufacturing steps for the semiconductor device.

Further, in the present embodiment, the silicon film pattern SP is disposed over the laminated pattern LP for mixedly mounting (forming) the MISFET including the gate electrode GE having the laminated structure of the first gate metal film 4b and the first gate silicon film 6b and the resistance element RST (poly-silicon resistance element) including the silicon film pattern SP formed by the first silicon film 6 in the same layer as the first gate silicon film 6b of the gate electrode GE over the same semiconductor substrate 1. That is, the silicon film pattern SP for the resistance element RST is formed over the major surface of the semiconductor substrate 1 on the laminated pattern LP. This laminated pattern LP includes the first laminate insulating film 3a, the first laminate metal film 4a over the first laminate insulating film 3a, and the second laminate insulating film 5a over the first laminate metal film 4a. Accordingly, the silicon film pattern SP (lower surface thereof) contacts the second laminate insulating film 5a (upper surface thereof) of the laminated pattern LP. The silicon film pattern SP (lower surface thereof) contacts the second laminate insulating film 5a (upper surface thereof) of the laminated pattern LP, the second laminate insulating film 5a intermediates between the first laminate metal film 4a of the laminated pattern LP and the silicon film pattern SP, and the silicon film pattern SP does not contact the first laminate metal film 4a, and thereby the first laminate metal film 4a does not contribute to the resistance value of the resistance element RST and the resistance element RST can be realized as a resistance element formed by the silicon film pattern SP (so-called poly-silicon resistance element). The resistance value of the resistance element RST is defined not by the resistance of the first laminate metal film 4a but by the resistance of the silicon film pattern SP, and thereby the resistance value of the resistance element RST can be controlled easily and appropriately to have a desired value by adjustment of the impurity concentration and the pattern shape of the silicon film pattern SP, and it is possible to form the resistance element RST having a desired resistance value.

While the first laminate metal film 4a of the laminated pattern LP and the first gate metal film 4b of the gate electrode GE are formed from the first metal film 4 in the same layer, the second laminate insulating film 5a intermediates between this first laminate metal film 4a and the silicon film pattern SP and it is possible to prevent the contact between the first laminate metal film 4a and the silicon film pattern SP. On the other side, in the gate electrode GE, the second laminate insulating film 5a does not intermediate between the first gate metal film 4b and the first gate silicon film 6b and the first gate metal film 4b (upper surface thereof) and the first gate silicon film 6b (lower surface thereof) are caused to contact each other and the gate electrode GE can be configured to have the laminated structure of the first gate metal film 4b and the first gate silicon film 6b over the first gate metal film 4b.

That is, in the gate electrode GE, an insulating film does not intermediate between the first gate silicon film 6b and the first gate metal film 4b thereunder, and thereby it is possible to form the gate electrode GE having the laminated structure of the first gate metal film 4b and the first gate silicon film 6b, and on the other side, in the resistance element RST, the second laminate insulating film 5a intermediates between the silicon film pattern SP and the metal film thereunder, and thereby it is possible to form a resistance element RST including the silicon film pattern SP (poly-silicon resistance element).

The first laminate insulating film 3a of the laminated pattern LP is formed by the first insulating film 3 in the same layer as the first gate insulating film GI, the first laminate metal film 4a of the laminated pattern LP is formed by the first metal film 4 in the same layer as the first gate metal film 4b of the gate electrode GE, the silicon film pattern SP is formed by the first silicon film 6 in the same layer as the first gate silicon film 6b of the gate electrode GE. Furthermore, the first laminate metal film 4a and the silicon film pattern SP are insulated electrically from each other by the second laminate insulating film 5a which is the top layer of the laminated pattern LP. Accordingly, it is possible to form (mixedly mounting) the gate electrode GE (MISFET including the gate electrode GE) having the laminated structure of the first gate metal film 4b and the first gate silicon film 6b and the resistance element RST including the silicon film pattern SP (poly-silicon resistance element) over the same semiconductor substrate 1, while suppressing the number of the manufacturing steps for the semiconductor device.

In this manner, in the present embodiment, it is possible to form the metal gate electrode and the poly-silicon resistance element over the same semiconductor substrate easily while suppressing the number of the manufacturing steps.

Figure 50:
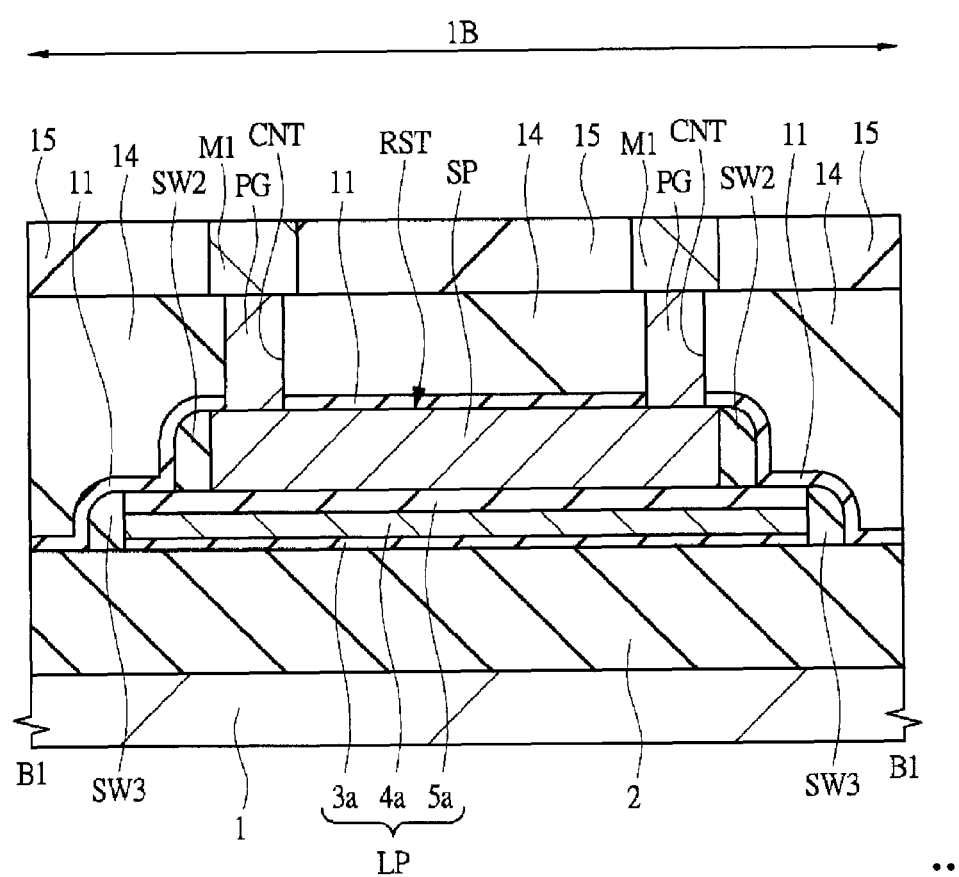
FIG. 50 is a relevant portion cross-sectional view of a semiconductor device in a second modified example.
Figure 51:
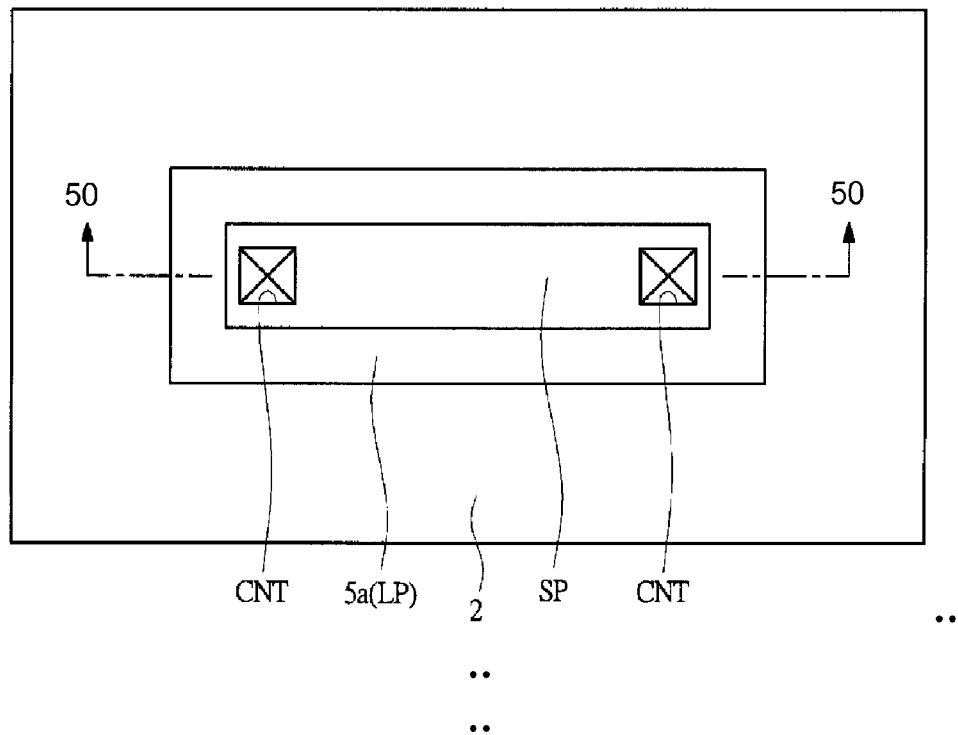
FIG. 51 is a relevant portion plan view of a semiconductor device in a second modified example.
Figure 52:
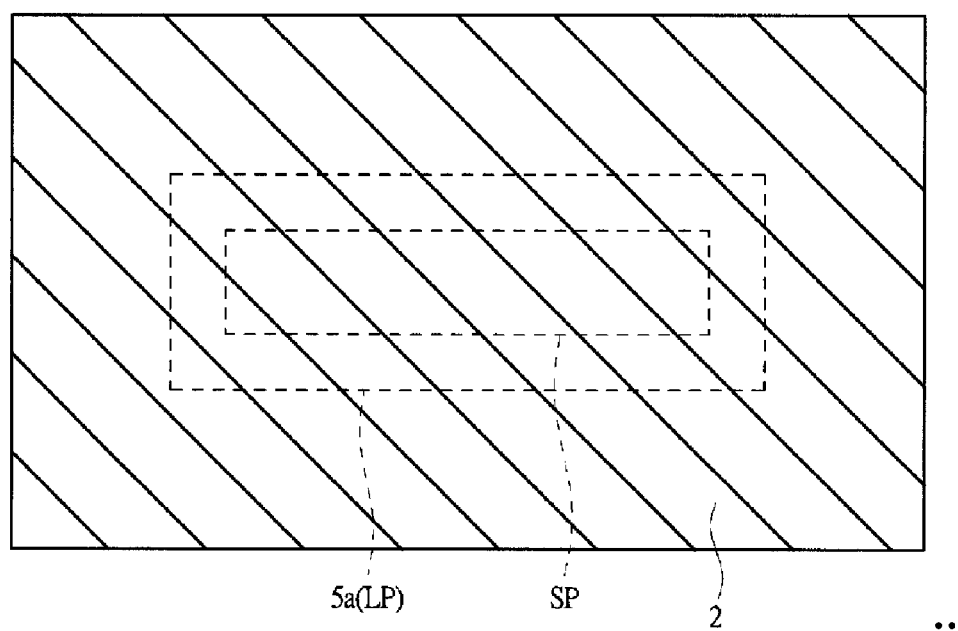
FIG. 52 is a relevant portion plan view of a semiconductor device in a second modified example.

Further, in the present embodiment, in a planar view, a footprint of the silicon film pattern SP is included within the second laminate insulating film 5a That is, the silicon film pattern SP does not protrude from the second laminate insulating film 5a in the planar view. Accordingly, a portion under the second laminate insulating film 5a (i.e., foundation of the laminated pattern) may be either the active region or the element isolation region, and it is possible to improve the freedom of the semiconductor device design. Above FIG. 2 to FIG. 4 show a case in which the laminated pattern LP is formed over the second active region AR2 of the semiconductor substrate 1; FIG. 50 to FIG. 52 show a case in which the laminated pattern LP is formed over the element isolation region 2; and FIG. 53 to FIG. 55 show a case in which the laminated pattern LP is formed over the second active region AR2 and the element isolation region 2 (i.e., case in which the laminated pattern LP is formed across both regions of the second active region AR2 and the element isolation region 2).

Figure 53:
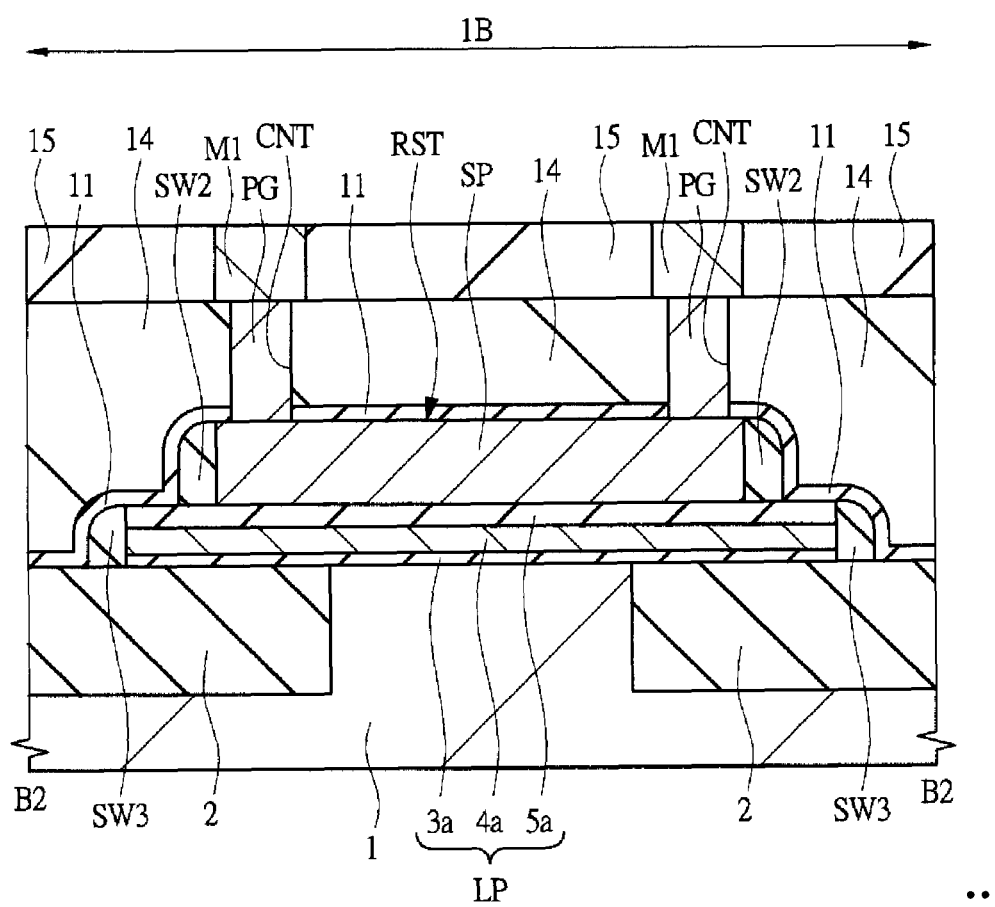
FIG. 53 is a relevant portion cross-sectional view of a semiconductor device in a third modified example.
Figure 54:
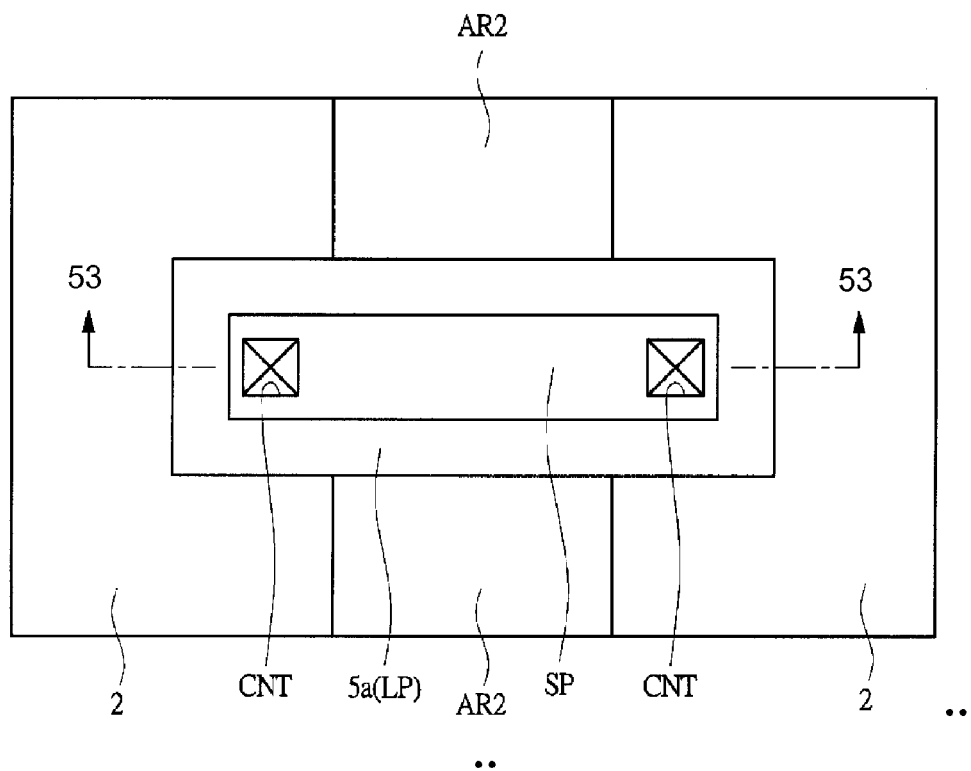
FIG. 54 is a relevant portion plan view of a semiconductor device in a third modified example.
Figure 55:
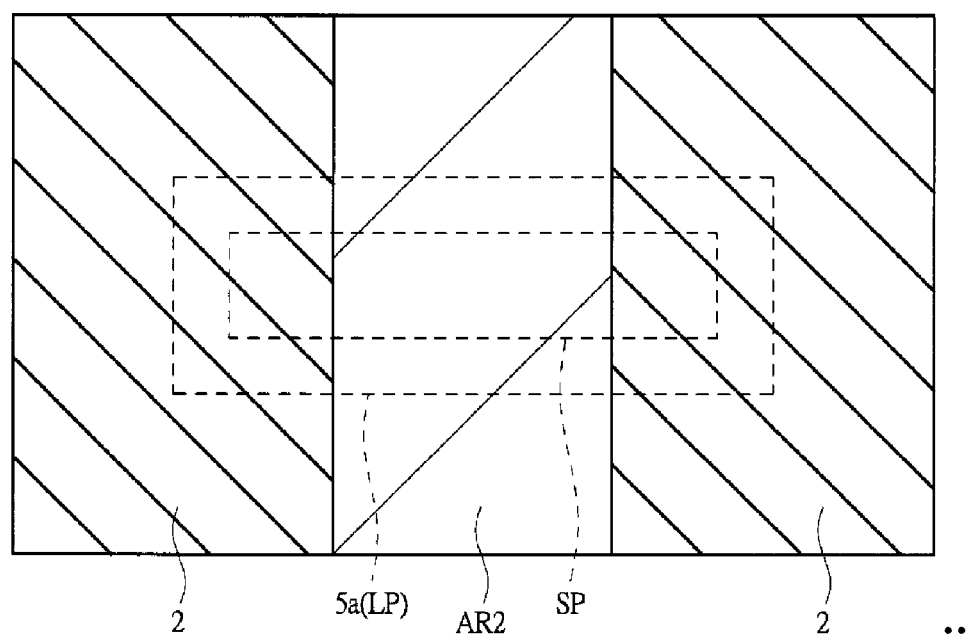
FIG. 55 is a relevant portion plan view of a semiconductor device in a third modified example.

Here, FIG. 50 to FIG. 52 are a relevant portion cross-sectional view (FIG. 50) and relevant portion plan views (FIG. 51 and FIG. 52) of a semiconductor device in a second modified example of the present embodiment, and FIG. 53 to FIG. 55 are a relevant portion cross-sectional view (FIG. 53) and relevant portion plan views (FIG. 54 and FIG. 55) of a semiconductor device in a third modified example of the present embodiment. The configuration of the MISFET formation region 1A is the same as that shown in above FIG. 1 also in the second modified example and the third modified example, and illustration thereof is omitted here. Note that FIG. 50 and FIG. 53 correspond to above FIG. 2, FIG. 51 and FIG. 54 correspond to above FIG. 3, and FIG. 52 and FIG. 55 correspond to above FIG. 4. FIG. 51 and FIG. 54 show a planar layout of the element isolation region 2 in the resistance element formation region 1B, the first active region AR1, the second laminate insulating film 5a (belonging to laminated pattern LP), the silicon film pattern SP, and the contact hole CNT. While FIG. 52 and FIG. 55 are plan views of the same region as that of FIG. 51 and FIG. 54, the element isolation region 2 and the second active region AR2 are provided with hatching and the silicon film pattern SP and the second laminate insulating film 5a (belonging to laminated pattern LP) are shown by dotted lines for easy understanding. Note that the cross-sectional view along the 50-50 line of FIG. 51 corresponds to the cross-sectional view of the resistance element formation region 1B in FIG. 50, and the cross-sectional view along the 53-53 line of the FIG. 54 corresponds to the cross-sectional view of the resistance element formation region 1B in FIG. 53.

In the present embodiment, in the planar view, the footprint of the silicon film pattern SP is included within the second laminate insulating film 5a, and thereby the foundation of the silicon film pattern SP is the second laminate insulating film 5a and the foundation of the laminated pattern LP does not affect the characteristic of the resistance element RST including the silicon film pattern SP. Accordingly, in the present embodiment, a portion (foundation) under the laminated pattern LP may be any of the second active regions AR2 as in FIG. 2 to FIG. 4, the element isolation region 2 as in FIG. 50 to FIG. 52, and both of the second active region AR2 and the element isolation region 2 as in FIG. 53 to FIG. 55. That is, in the present embodiment, the portion (foundation) under the laminated pattern LP is not required to be the element isolation region 2 or the second active region AR2. Accordingly, it is possible to improve the freedom (flexibility) of the semiconductor device design.

Further, even when there is a region where the element isolation region is not desired to be formed because of convenience in designing and the like and the poly-silicon resistance element is desired to be disposed in this region, in the present embodiment, the silicon film pattern SP may be formed over this region on the laminated pattern LP (without concern about the existence or nonexistence of the element isolation region). Accordingly, when the poly-silicon element (silicon film pattern SP) is formed over a region without the element isolation region 2 (i.e., active region) (corresponding to the case of FIG. 2 to FIG. 4 and the case of FIG. 53 to FIG. 55), application of the present embodiment provides a great effect.

Further, the present embodiment not only can improve the freedom of the semiconductor device design but also can realize miniaturization (realization of a smaller area) of the semiconductor device, the reason of which will be explained with reference to a comparative example described with respect to FIG. 56 to FIG. 69.

FIG. 56 to FIG. 67 are relevant portion cross-sectional views in manufacturing steps of the semiconductor device for a comparative example studied by the present inventors, and show manufacturing steps of mixedly mounting a MISFET including a gate electrode GE101 having a laminated structure patterned from a first metal film 104 and a first silicon film 106 over the first metal film 104 and a poly-silicon resistance element RST101 over the same semiconductor substrate 101. Hereinafter, with reference to FIG. 56 to FIG. 67, the manufacturing steps of the comparative example will be explained.

Figure 56:
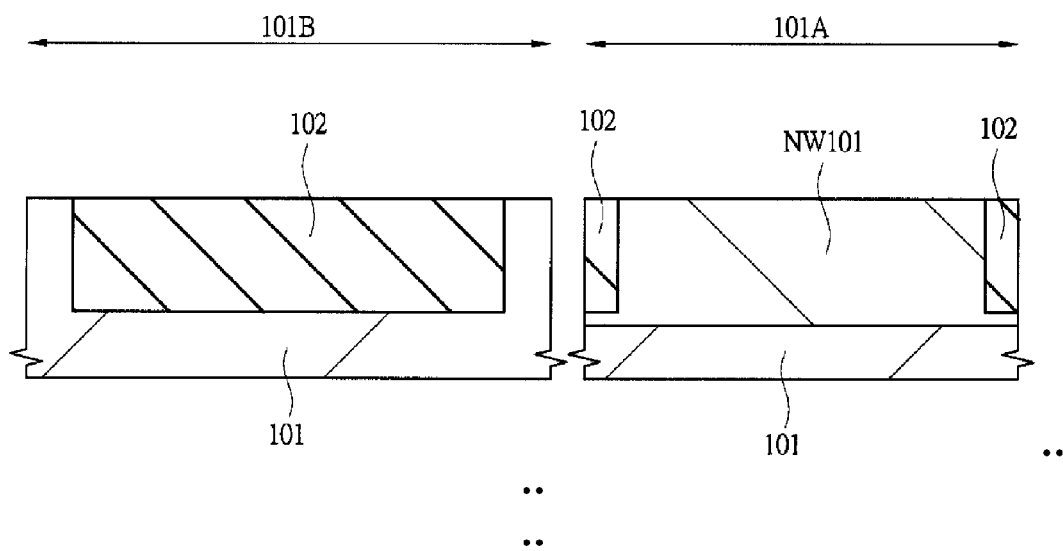
FIG. 56 is a relevant portion cross-sectional view of a semiconductor device of a comparative example in a manufacturing step.
Figure 57:
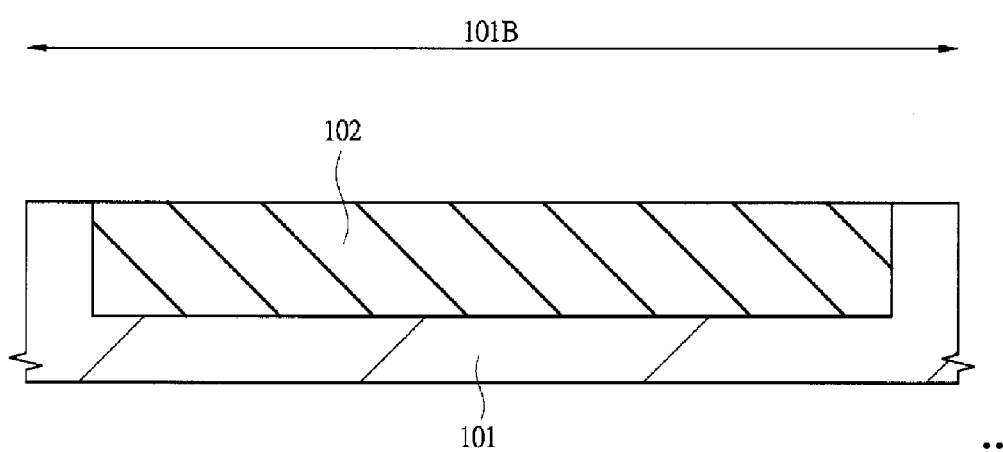
FIG. 57 is a relevant portion cross-sectional view in the same manufacturing step of a semiconductor device as the step of FIG. 56.

First, as shown in FIG. 56 and FIG. 57, a semiconductor substrate 101 corresponding to the semiconductor substrate 1 is provided, and an element isolation region 102 is formed over the major surface of the semiconductor substrate 101 by a method similar to that for the element isolation region 2. The semiconductor substrate 101 includes a MISFET formation region 101A corresponding to the MISFET formation region 1A and a resistance element formation region 101B corresponding to the resistance element formation region 1B, and the element isolation region 102 is formed also in a region where the poly-silicon resistance element RST101 is to be formed in the resistance element formation region 101B.

Figure 58:
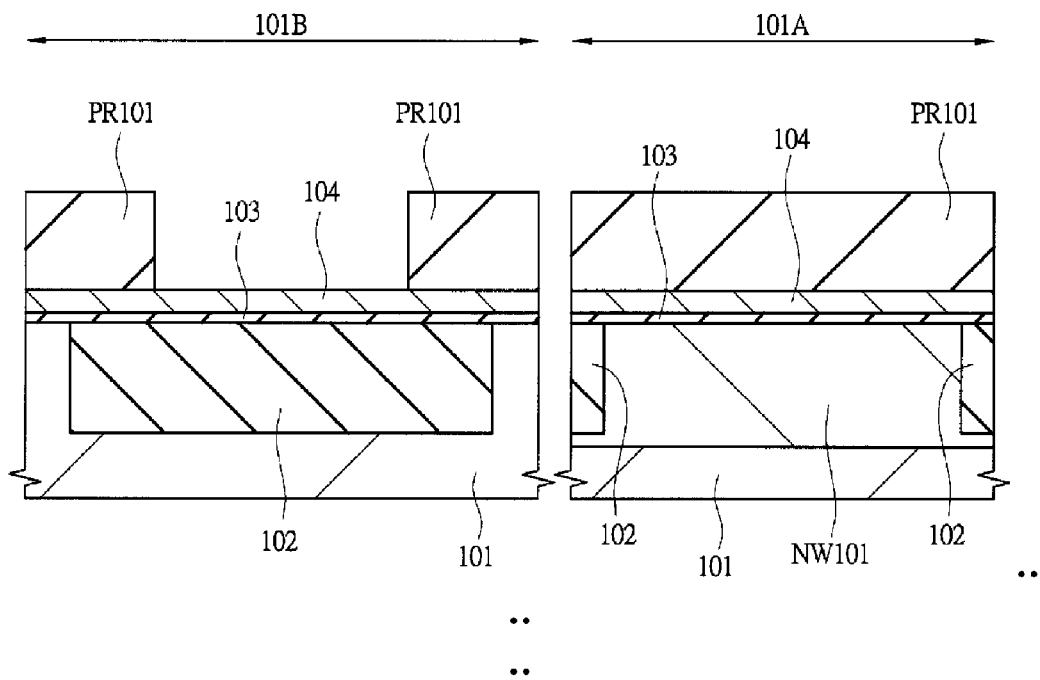
FIG. 58 is a relevant portion cross-sectional view in the manufacturing step of a semiconductor device succeeding the step of FIG. 56.
Figure 59:
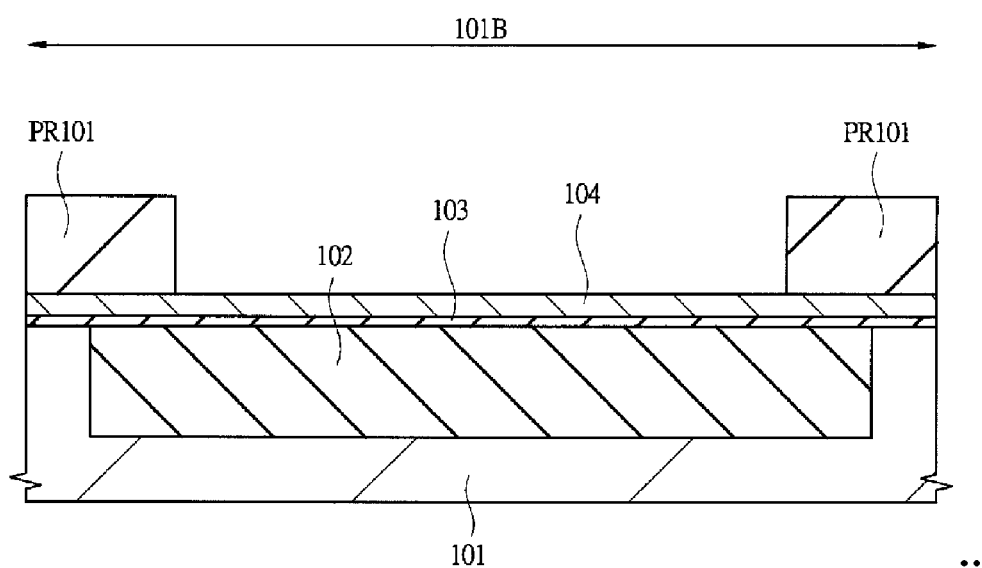
FIG. 59 is a relevant portion cross-sectional view in the same manufacturing step of a semiconductor device as the step of FIG. 58.

Then, an n-type well NW101 corresponding to the n-type well NW is formed in the MISFET formation region 101A, and, as shown in FIG. 58 and FIG. 59, a common first insulating film 103 corresponding to the first insulating film 3 is formed over the major surface of the semiconductor substrate 101 and a common first metal film 104 corresponding to the first metal film 4 is formed over the major surface of the semiconductor substrate 101 (i.e., over the first insulating film 103).

Then, a photo-resist pattern PR101 is formed over the metal film 104 by the use of a photolithography technique. This photo-resist pattern PR101 has a pattern shape so as to cover the first metal film 104 in the MISFET formation region 101A and to expose the first metal film 104 in the region where the poly-silicon resistance element RST101 is to be formed in the resistance element formation region 101B.

Figure 60:
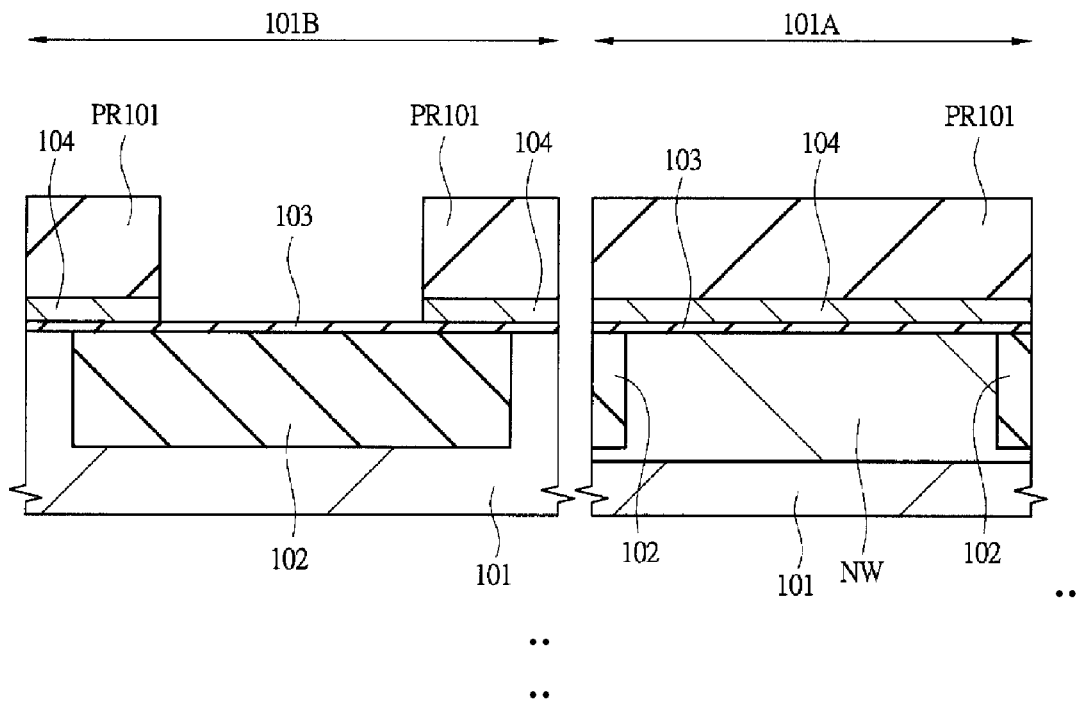
FIG. 60 is a relevant portion cross-sectional view in the manufacturing step of a semiconductor device succeeding the step of FIG. 58.
Figure 61:
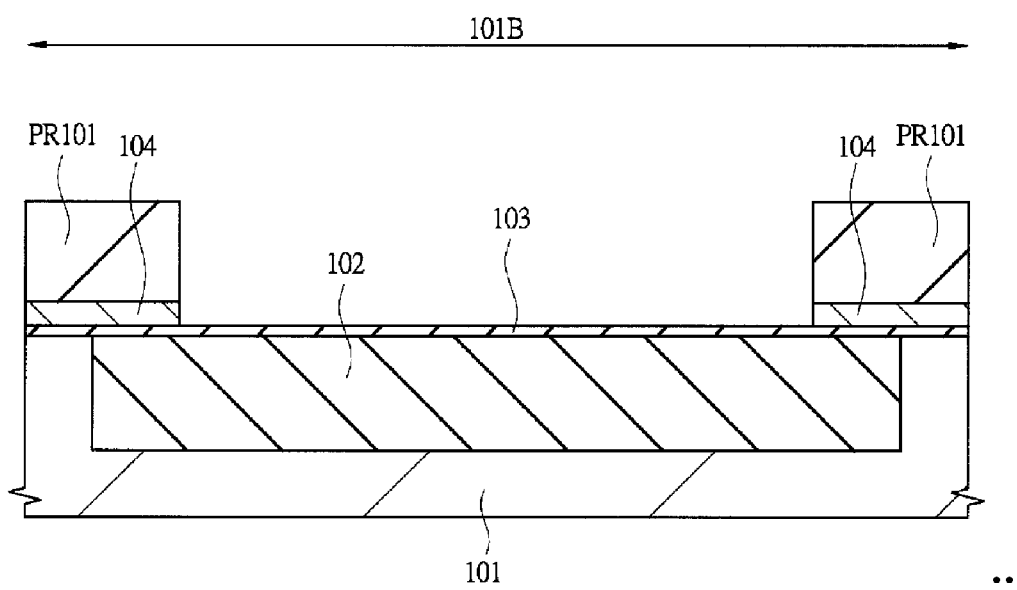
FIG. 61 is a relevant portion cross-sectional view in the same manufacturing step of a semiconductor device as the step of FIG. 60.

Then, as shown in FIG. 60 and FIG. 61, the first metal film 104 is etched (preferably, wet-etched) by the use of the photo-resist pattern PR101 as an etching mask. By this etching, a first portion of the first metal film 104 is removed in the region where the poly-silicon resistance element RST101 is to be formed in the resistance element formation region 101B, and on the other side, the first metal film 104 is not removed and remains in the MISFET formation region 101A, since the first metal film 104 is covered by the photo-resist pattern PR101. The result is that a first portion of the first insulating film is exposed in the region where the poly-silicon resistance element RST101 is to be formed in the resistance element formation region 101B. After that the photo-resist pattern PR101 is removed.

Figure 62:
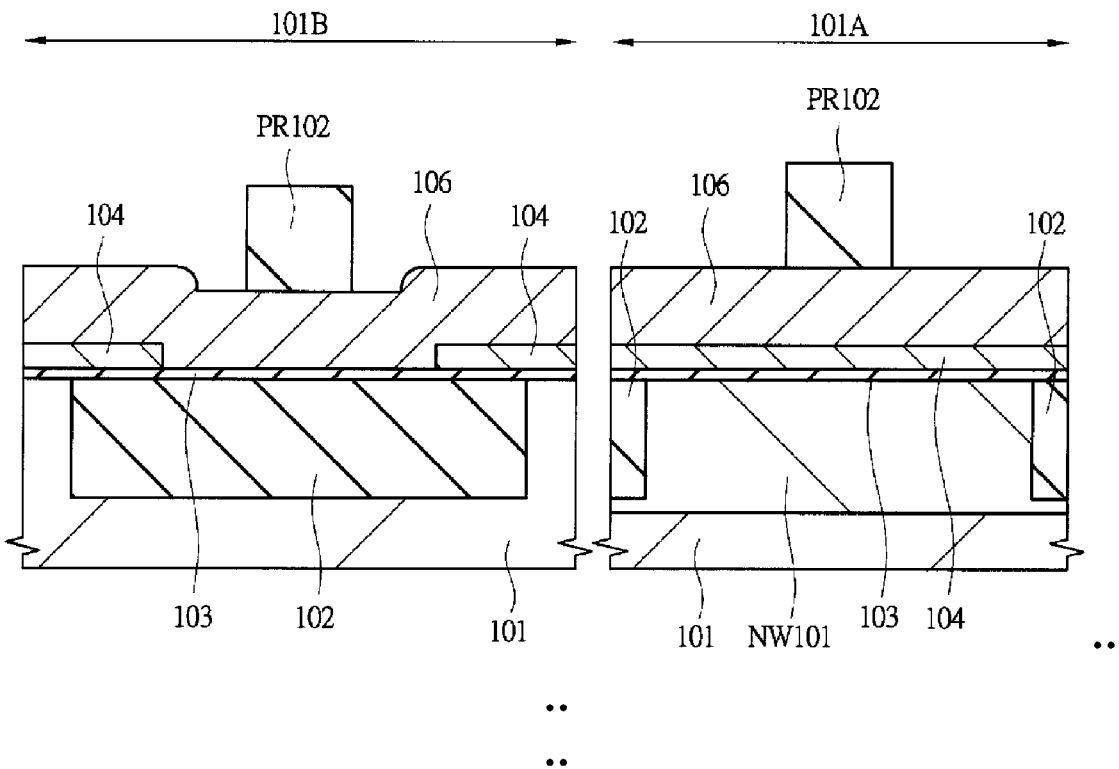
FIG. 62 is a relevant portion cross-sectional view in the manufacturing step of a semiconductor device succeeding the step of FIG. 60.
Figure 63:
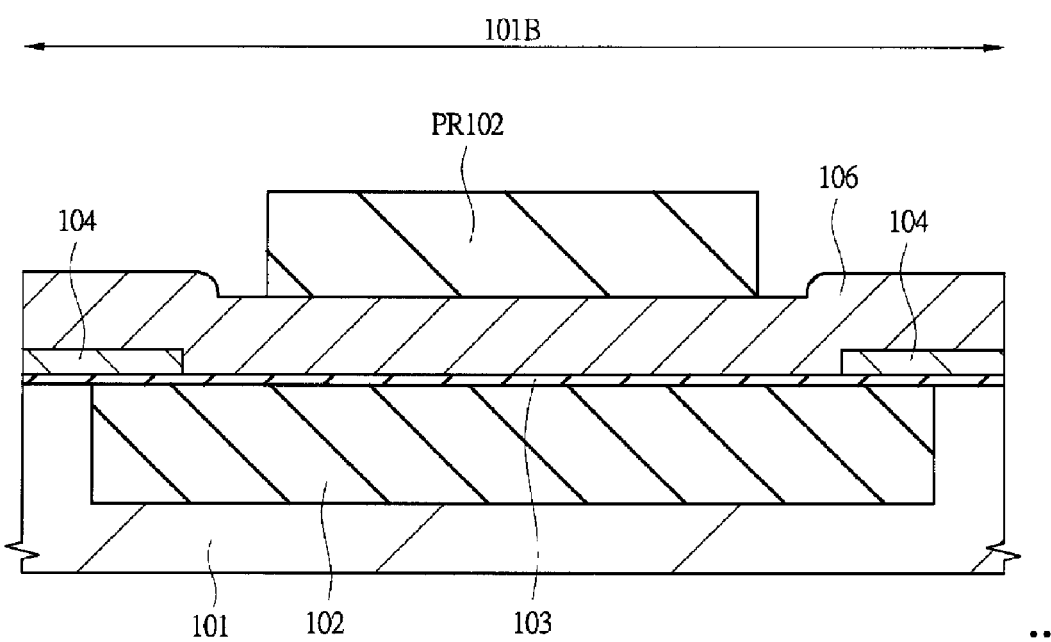
FIG. 63 is a relevant portion cross-sectional view in the same manufacturing step of a semiconductor device as the step of FIG. 62.

Then, as shown in FIG. 62 and FIG. 63, a first silicon film 106 corresponding to the first silicon film 6 is formed over the major surface (whole major surface) of the semiconductor substrate 101 so to cover surfaces both where the first metal film has been removed as well as where the first metal film remains. Thereby, a state in which the first insulating film 103, the first metal film 104, and the first silicon film 106 are laminated sequentially from under over the semiconductor substrate 101 (n-type well NW101) is obtained in the MISFET formation region 101A, and a state in which the first insulating film 103 and the first silicon film 106 are formed over the element isolation region 102 sequentially from under is obtained in the region where the poly-silicon resistance element RST101 is to be formed in the resistance element formation region 101B.

Then, a photo-resist pattern PR102 corresponding to the photo-resist pattern PR2 is formed over the silicon film 106 by the use of a photolithography technique. This photo-resist pattern PR102 is formed in a region where the gate electrode GE101 is to be formed in the MISFET formation region 101A and the region where a silicon film pattern SP101 is to be formed in the resistance element formation region 101B. Here, out of the photo-resist pattern PR102, the photo-resist pattern PR102 formed in the region where the gate electrode GE101 is to be formed in the MISFET formation region 101A is called a photo-resist pattern PT102a and the photo-resist pattern PR102 formed in the region where the silicon film pattern SP101 is to be formed in the resistance element formation region 101B is called a photo-resist pattern PR102b.

Figure 64:
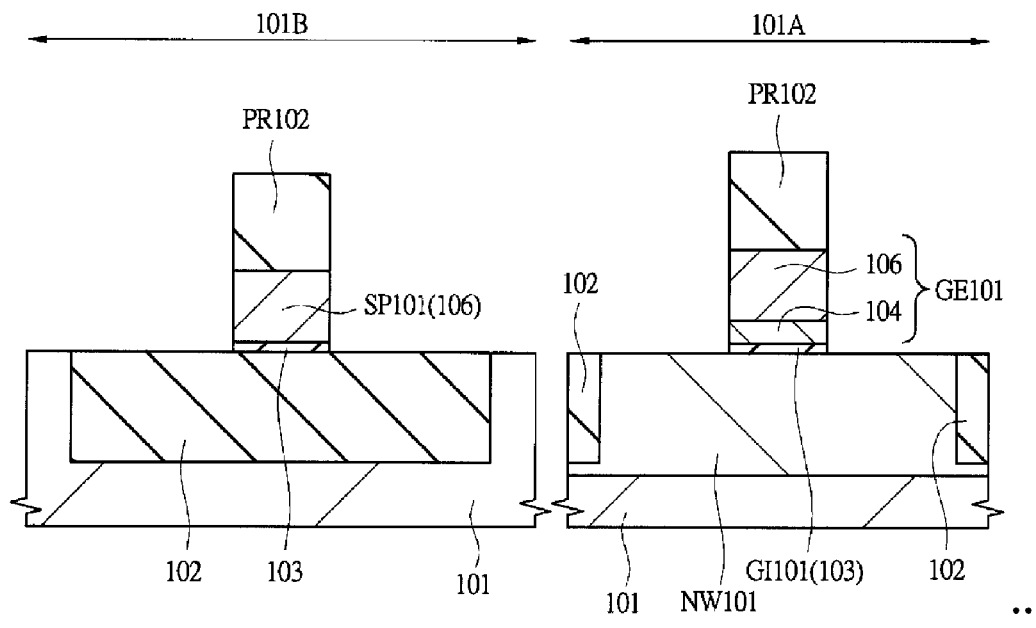
FIG. 64 is a relevant portion cross-sectional view in the manufacturing step of a semiconductor device succeeding the step of FIG. 62.
Figure 65:
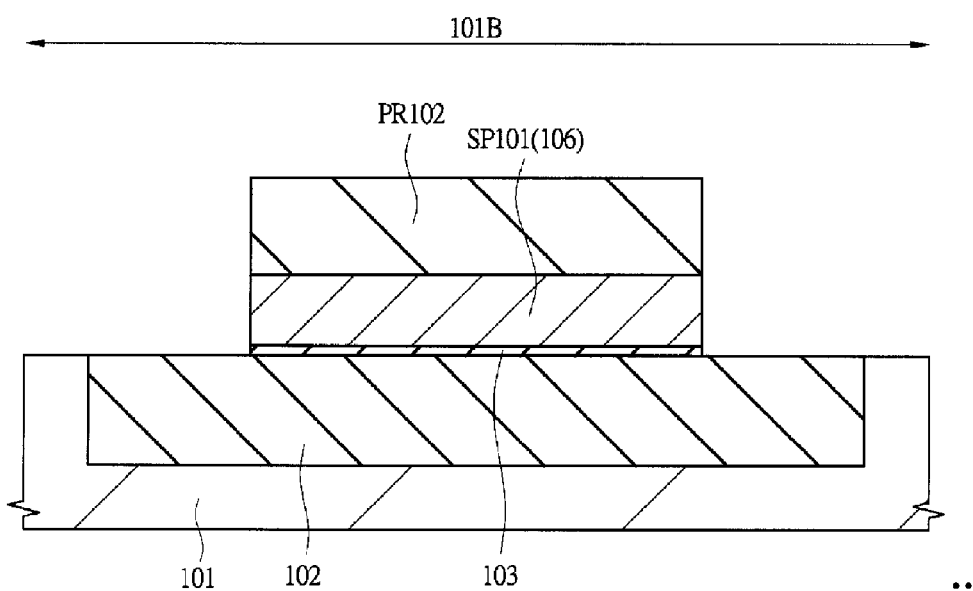
FIG. 65 is a relevant portion cross-sectional view in the same manufacturing step of a semiconductor device as the step of FIG. 64.
Figure 66:
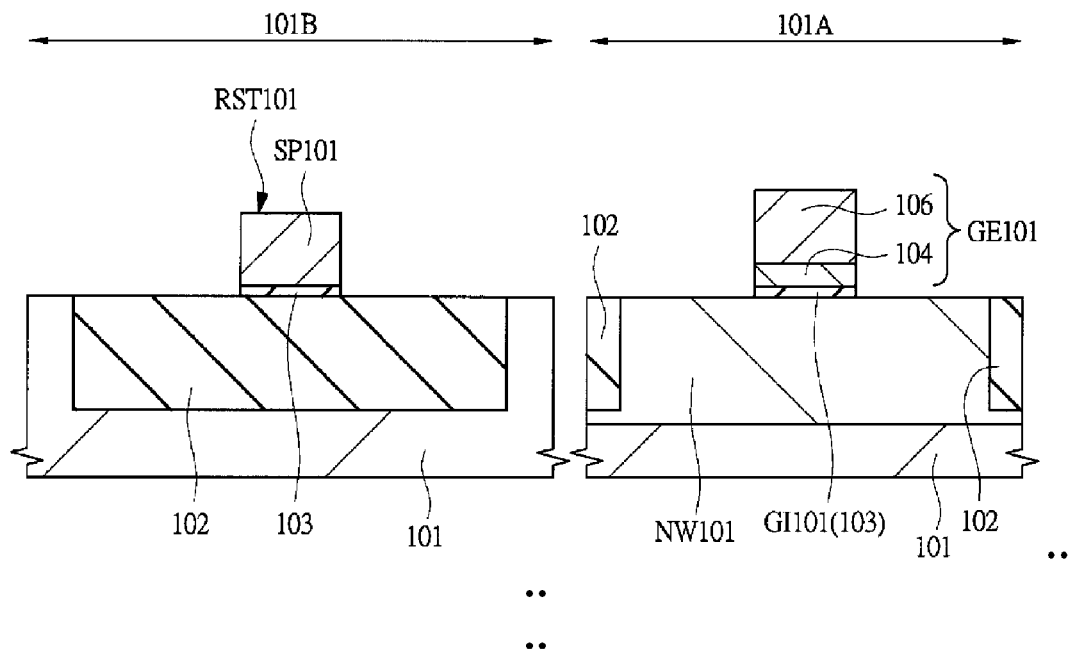
FIG. 66 is a relevant portion cross-sectional view in the manufacturing step of a semiconductor device succeeding the step of FIG. 64.
Figure 67:
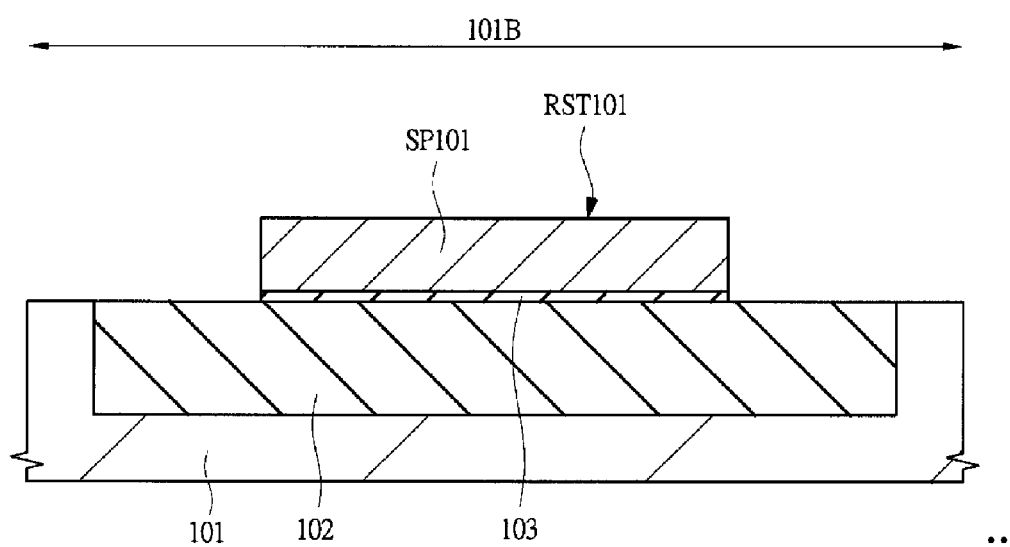
FIG. 67 is a relevant portion cross-sectional view in the same manufacturing step of a semiconductor device as the step of FIG. 66.

Then, as shown in FIG. 64 and FIG. 65, the first silicon film 106 and the first metal film 104 are etched sequentially by the use of the photo-resist pattern PR102 as an etching mask, and the first silicon film 106 and the first metal film 104 are removed in a region which is not covered by the photo-resist pattern PR102. In this etching step, in the MISFET formation region 101A, the laminated film of the first silicon film 106 and the first metal film 104 is etched and patterned by the use of the photo-resist pattern PR102a as the etching mask, and thereby the gate electrode GE101 including the first metal film 104 and the first silicon film 106 over the first metal film 104 is formed. This gate electrode GE101 corresponds to the gate electrode GE. On the other side, in the resistance element formation region 101B, the first silicon film 106 is etched and patterned in this etching step by the use of the photo-resist pattern PR102b as an etching mask, and thereby the silicon film pattern SP101 including the first patterned silicon film 106 is formed. This silicon film pattern SP101 corresponds to the silicon film pattern SP. The first metal film 104 does not exist under the silicon film pattern SP101, and this is because the silicon film pattern SP101 is formed in a region where the first metal film 104 has been removed in the etching step using the photo-resist pattern PR101. After that, as shown in FIG. 66 and FIG. 67, the photo-resist pattern PR102 is removed.

In the MISFET formation region 101A, the first insulating film 103 in a region which is not covered by the gate electrode GE101 is removed by the dry etching using the photo-resist pattern PR102 or wet etching after the dry etching, and the first insulating film 103 under the gate electrode GE101 is not removed and remains to be the gate insulating film GI101 which corresponds to the first gate insulating film GI. In the resistance element formation region 101B, the poly-silicon resistance element RST101 is formed by the silicon film pattern SP101.

The succeeding steps are basically the same as above Step S10 (p⁻-type semiconductor region EX formation step) and the following steps, and illustration and explanation thereof are omitted here.

Figure 68:
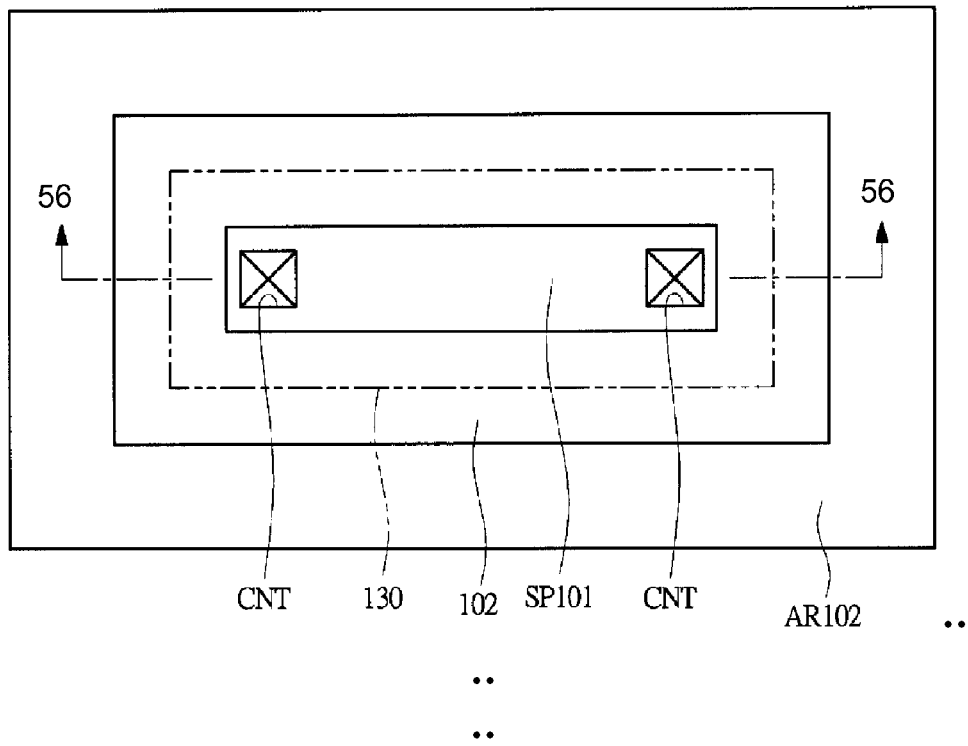
FIG. 68 is a relevant portion plan view showing a planar layout in a manufacturing step of the comparative example shown in FIG. 56 to FIG. 67.
Figure 69:
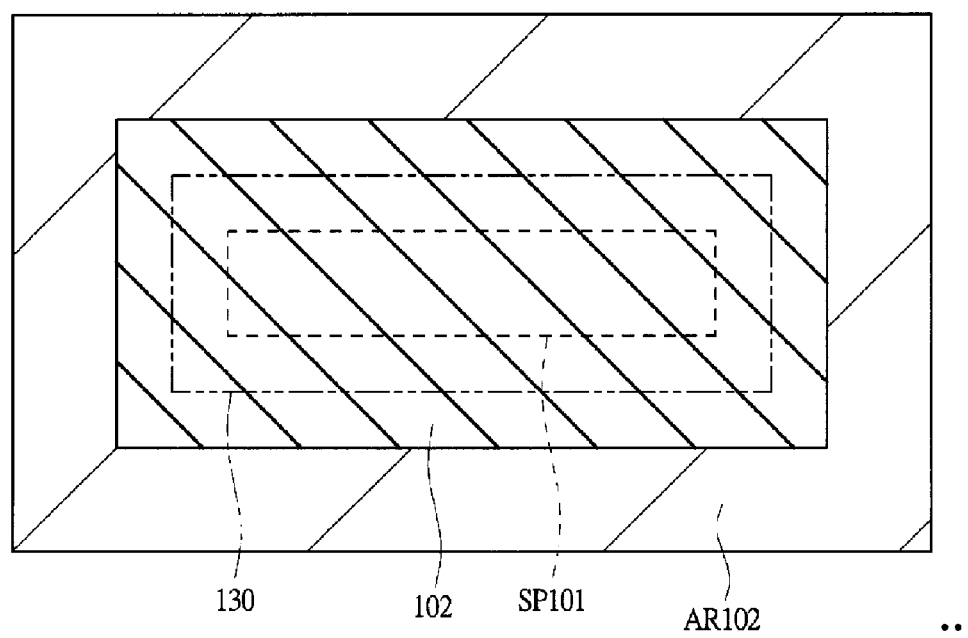
FIG. 69 is a relevant portion plan view showing a planar layout in a manufacturing step of the comparative example shown in FIG. 56 to FIG. 67.

FIG. 68 and FIG. 69 show a planar layout of the element isolation region 102, an active region AR102, the silicon film pattern SP101, and the contact hole CNT in the resistance element formation region 101B when the silicon film pattern SP101 is formed in the manufacturing steps of the comparative example shown in FIG. 56 to FIG. 67. Note that FIG. 68 corresponds to above FIG. 3, FIG. 51, and FIG. 54, and FIG. 69 corresponds to above FIG. 4, FIG. 52, and FIG. 55. While FIG. 69 is a plan view of the same region as that of FIG. 68, the element isolation region 102 and the active region AR102 are provided with hatching and the silicon film pattern SP101 is shown by a dotted line for easy understanding. Further, in FIG. 68 and FIG. 69, the region 130 where the metal film 104 is removed in the step of above FIG. 60 and FIG. 61 (hereinafter, called a metal film removal region 130) is shown by a two-dot chain line. The planar layout of the metal film removal region 130 is approximately the same as that of the opening portion of the photo-resist pattern PR101, and, out of the first metal film 104, a portion exposed by the opening portion of the photo-resist pattern PR101 is removed in the steps of above FIG. 60 and FIG. 61 and becomes the metal film removal region 130. Note that the cross sections shown in FIG. 56 to FIG. 67 correspond to the cross-section at the position of the 56-56 line of FIG. 68.

By the manufacturing steps of the comparative example shown in FIG. 56 to FIG. 67, it is possible to form the gate electrode GE101 having the laminated structure of the first metal film 104 and the first silicon film 106 over the first metal film 104 and the silicon film pattern SP101 configuring the poly-silicon resistance element RST101 over the same semiconductor substrate 101. In the case of the manufacturing steps of the comparative example shown in FIG. 56 to FIG. 67, however, the freedom (flexibility) of the semiconductor device design could be degraded and the miniaturization (realization of a smaller area) of the semiconductor device could be prevented.

That is, in the case of the manufacturing steps of the comparative example shown in FIG. 56 to FIG. 67, the silicon film pattern SP101 is disposed over the element isolation region 102. If the silicon film pattern SP101 is intended to be disposed over the active region of the semiconductor substrate 101, the semiconductor substrate 101 and the silicon film pattern SP101 need to be insulated from each other by the insulating film 103. However, this first insulating film 103 is to be used for gate insulation and the thickness is small, and, when the first insulating film 103 is over-etched in the etching of the first metal film 104 in the step of FIG. 60 and FIG. 61, the semiconductor substrate 101 is exposed and there arises a problem that the exposed portion contacts the silicon film pattern SP101 to be formed later and the silicon film pattern SP101 and the semiconductor substrate 101 are shorted to each other. For preventing this problem, the silicon film pattern SP101 is disposed over the element isolation region 102. Further, even if the semiconductor substrate 101 and the silicon film pattern SP101 can be insulated from each other by the first insulating film 103 when the silicon film pattern SP101 is disposed over the active region of the semiconductor substrate 101, parasitic capacitance is formed by a capacitive insulating film (dielectric film) including the first insulating film 103 between the silicon film pattern SP101 and the semiconductor substrate 101 (active region thereof). Since this first insulating film 103 is an insulating film in the same layer as the gate insulating film GI101 and the thickness thereof is small and also the first insulating film 103 is a high dielectric constant film, this parasitic capacitance is increased further more. Also from this viewpoint, the silicon film pattern SP101 is to be disposed over the element isolation region 102.

However, in the case of the manufacturing steps of the comparative example shown in FIG. 56 to FIG. 67, as shown in FIG. 68 and FIG. 69, the metal film removal region 130 is formed so as to be included within the element isolation region 102 in the planar view and further the silicon film pattern SP101 is formed so as to be included within this metal film removal region 130 in the planar view. Accordingly, for designing the poly-silicon resistance element RST101, it is required to secure an alignment shift margin in each of the three respective photolithography steps of forming a photo-resist pattern (not shown in the drawings) for forming the element isolation trench in the formation of the element isolation region 102, the photo-resist pattern PR101 for forming the metal film removal region 130, and the photo-resist pattern PR102 for forming the silicon film pattern SP101. Accordingly, a layout having a certain allowance is required for the three of the element isolation region 102, the metal film removal region 130, and the silicon film pattern SP101 in the resistance element formation region 101B, and this increases an area required for the disposition of the poly-silicon resistance element RST101 in the semiconductor substrate 101 and works so as to prevent the miniaturization (realization of a smaller area) of the semiconductor device.

On the other hand, in the present embodiment, the silicon film pattern SP only needs to be included within the second laminate insulating film 5a in the planar view, and the foundation of the laminated pattern LP may be either the active region or the element isolation region 2, and also may be a region across both of the active region and the element isolation region 2. Accordingly, an alignment shift (positional alignment shift) of the photo-resist pattern (not shown in the drawings) for forming the element isolation trench 2a in the formation of the element isolation region 2 does not affect the formation of the resistance element RST. Accordingly, for designing the resistance element RST, it is sufficient to secure an alignment shift (positional alignment shift) margin in each of the two respective photolithography steps for forming the photo-resist pattern PR1 for the formation of the second laminate insulating film 5a in above Step S7 and the photo-resist pattern PR2 for the formation of the silicon film pattern SP in above Step S9. Accordingly, compared to the manufacturing steps of the comparative example shown in FIG. 56 to FIG. 67, the present embodiment can reduce a layout margin for the design of the resistance element, can reduce an area required for the disposition of the resistance element RST in the semiconductor substrate 1, and can realize the miniaturization (smaller size) of the semiconductor device.

Further, while, in the case of the manufacturing steps of the comparative example shown in FIG. 56 to FIG. 67, the silicon film pattern SP101 must be disposed over the element isolation region 102 and the freedom of the semiconductor design is degraded, in the present embodiment, a portion under the silicon film pattern SP may be either the active region or the element isolation region 2, and also may be a region across both of the active region and the element isolation region 2. Even when the active region exists under the silicon film pattern SP, it is possible to prevent appropriately the short between the silicon film pattern SP and the semiconductor substrate 1 using the second laminate insulating film 5a. Accordingly, it is possible to improve the freedom of the semiconductor device design.

Further, in the present embodiment, the second laminate insulating film 5a of the laminated pattern LP intermediates between the silicon film pattern SP and the first laminate metal film 4a of the laminated pattern LP. Accordingly, there is a possibility that parasitic capacitance is formed by a capacitive insulating film (dielectric film) including the second laminate insulating film 5a of the laminated pattern LP between the silicon film pattern SP and the first laminate metal film 4a of the laminated pattern LP. From the viewpoint of suppressing or preventing this parasitic capacitance, the dielectric constant of the second laminate insulating film 5a of the laminated pattern LP is preferably lower (smaller) than the dielectric constant of the first laminate insulating film 3a of the laminated pattern LP (this first laminate insulating film 3a is the insulating film in the same layer as the first gate insulating film GI, and has the same dielectric constant as the first gate insulating film GI). When a silicon oxide film is used as the insulating film 5, the silicon oxide film has a lower dielectric constant than other insulating films and thereby it is possible to suppress more appropriately the parasitic capacitance formed by the silicon film pattern SP, the second laminate insulating film 5a and the first laminate metal film 4a.

Further, the second laminate insulating film 5a can be formed not by an insulating film in the same layer as the gate insulating film but an insulating film having an optional thickness without consideration of the characteristic of the MISFET, and thereby the second laminate insulating film 5a can be controlled to have a desired thickness. Note that, from the viewpoint of suppressing the parasitic capacitance formed by the silicon film pattern SP, the second laminate insulating film 5a, and the first laminate metal film 4a, the thickness of the second laminate insulating film 5a of the laminated pattern LP is preferably larger than the thickness of the first laminate insulating film 3a of the laminated pattern LP (this first laminate insulating film 3a is the insulating film in the same layer as the first gate insulating film GI and has the same thickness as the first gate insulating film GI). On the other side, the thickness of the first gate insulating film GI preferably has a thickness suitable for the gate insulating film of the MISFET Q1.

Further, when the second laminate insulating film 5a is made thicker, the parasitic capacitance can be suppressed, but, when the second laminate insulating film 5a is too thick, the height of the side wall spacer SW3 formed over the side wall of the laminated pattern LP becomes too high and this side wall spacer SW3 would be peeled off more probably to generate particles. From this viewpoint, preferably the thickness of the second laminate insulating film 5a is approximately 10 to 30 nm.

While, hereinabove, the invention achieved by the present inventors has been explained specifically according to the embodiment thereof, obviously the present invention is not limited to the above embodiments and can be modified variously in a range without departing from the gist thereof.

INDUSTRIAL APPLICABILITY

The present invention is effectively applied to a semiconductor device and a manufacturing technique thereof.

What is claimed is:
1. A semiconductor device comprising:
a semiconductor substrate having a plurality of film layers formed thereon;
a metal gate electrode which is used for a MISFET and formed over a major surface of the semiconductor substrate on a first gate insulating film; and
a silicon film pattern which is used for a resistance element and formed over the major surface of the semiconductor substrate on a laminated film, wherein:
the metal gate electrode includes a first gate metal film over the first gate insulating film and a first gate silicon film over the first gate metal film;
the laminated film includes a first laminate insulating film, a first laminate metal film over the first laminate insulating film, and a second laminate insulating film over the first laminate metal film;
in a planar view, the second laminate insulating film is larger than the silicon film pattern;
the first gate insulating film and the first laminate insulating film are formed from a common insulating film and are in the same film layer;
the first gate metal film and the first laminate metal film are formed from a common metal film and are in the same film layer; and
the first gate silicon film and the silicon film pattern are formed from a common silicon film and are in the same film layer.
2. The semiconductor device according to claim 1, wherein in a planar view, a footprint of the silicon film pattern is included within the second laminate insulating film.
3. The semiconductor device according to claim 2, wherein the silicon film pattern contacts the second laminate insulating film and does not contact the first laminate metal film.
4. The semiconductor device according to claim 3, wherein the laminated film is formed over an active region of the semiconductor substrate, over an element isolation region of the semiconductor substrate, or over the active region and the element isolation region of the semiconductor substrate.
5. The semiconductor device according to claim 4, wherein each of the first gate insulating film and the first laminate insulating film is a high dielectric constant film.
6. The semiconductor device according to claim 5, wherein a dielectric constant of the second laminate insulating film is lower than a dielectric constant of the first laminate insulating film.
7. The semiconductor device according to claim 6, wherein the second laminate insulating film is thicker than the first laminate insulating film.
8. The semiconductor device according to claim 7, wherein the second laminate insulating film includes a silicon oxide film, a silicon nitride film, a silicon oxynitride film, a silicon carbide film, a silicon carbonitride film, or a silicon carbide-oxide film.
9. The semiconductor device according to claim 8, wherein each of the first gate metal film and the first laminate metal film is a titanium nitride film, a tantalum nitride film, a tungsten nitride film, a titanium carbide film, a tantalum carbide film, a tungsten carbide film, or tantalum carbide-oxide film.
10. The semiconductor device according to claim 9, wherein
the second laminate insulating film includes a silicon oxide film or a silicon nitride film, and
each of the first gate metal film and the first laminate metal film includes a titanium nitride film.
11. The semiconductor device according to claim 10, wherein
the second laminate insulating film includes a silicon oxide film.
12. A semiconductor device including a transistor and a resistance element which have at least one film layer in common, comprising:
a semiconductor substrate having a transistor formation region and a resistance element formation region;
a metal gate electrode formed on a first gate insulating film in the transistor formation region, the metal gate electrode comprising a first gate metal film over the first gate insulating film and a first gate silicon film over the first gate metal film;
a silicon film pattern for a resistance element formed on a laminated film in the resistance element formation region, the laminated film comprising a first laminate insulating film, a first laminate metal film over the first laminate insulating film, and a second laminate insulating film over the first laminate metal film, wherein:
the first gate silicon film and the silicon film pattern are formed from a common silicon film; and
in a planar view, the second laminate insulating film is larger than the silicon film pattern.
13. The semiconductor device according to claim 12, wherein:
the first gate insulating film and the first laminate insulating film are formed from a common first insulating film; and
the first gate metal film and the first laminate metal film are formed from a common metal film.
14. The semiconductor device according to claim 13, wherein the laminated film is formed over an active region of the semiconductor substrate.
15. The semiconductor device according to claim 13, wherein:
in a planar view, a footprint of the silicon film pattern is included within the second laminate insulating film.
16. The semiconductor device according to claim 13, further comprising:
first side wall spacers formed on side walls of the gate electrode;
second side wall spacers formed on side walls of the silicon film pattern; and third side wall spacers formed on side walls of the laminated film.

17. The semiconductor device according to claim 12, wherein
in a planar view, a footprint of the silicon film pattern is included within the second laminate insulating film.

* * * * *